United States Patent
Lieberman et al.

(10) Patent No.: US 7,242,388 B2
(45) Date of Patent: Jul. 10, 2007

(54) DATA INPUT DEVICE

(75) Inventors: Klony Lieberman, Jerusalem (IL); Yuval Sharon, Kohav Hashahar (IL); Eyal Naimi, Jerusalem (IL); Yaniv Maor, Jerusalem (IL); Mattan Tsachi, Modi'in (IL); Amiram Levy, Mevaseret Zion (IL); Boas Arnon, Halamish (IL); Amichai Turm, Beit Shemesh (IL)

(73) Assignee: VKB Inc., Wilmington, DE (US)

( * ) Notice: Subject to any disclaimer, the term of this patent is extended or adjusted under 35 U.S.C. 154(b) by 322 days.

(21) Appl. No.: 10/250,350

(22) PCT Filed: Nov. 26, 2001

(86) PCT No.: PCT/IL01/01082

§ 371 (c)(1),
(2), (4) Date: Dec. 18, 2003

(87) PCT Pub. No.: WO02/054169

PCT Pub. Date: Jul. 11, 2002

(65) Prior Publication Data

US 2004/0108990 A1    Jun. 10, 2004

Related U.S. Application Data

(60) Provisional application No. 60/260,436, filed on Jan. 8, 2001, provisional application No. 60/263,115, filed on Jan. 19, 2001, provisional application No. 60/303,922, filed on Jul. 6, 2001, provisional application No. 60/338,365, filed on Nov. 2, 2001.

(51) Int. Cl.
*G09G 5/00* (2006.01)

(52) U.S. Cl. .................. 345/158; 345/156; 345/168; 345/169; 345/173; 345/174; 345/175

(58) Field of Classification Search ............... 345/158, 345/156, 168–169, 173, 174, 175
See application file for complete search history.

(56) References Cited

U.S. PATENT DOCUMENTS

| 4,468,694 A | 8/1984 | Edgar ........................ 358/93 |
| 5,182,659 A | 1/1993 | Clay et al. |
| 5,736,976 A | 4/1998 | Cheung ..................... 345/168 |
| 5,767,842 A | 6/1998 | Korth ........................ 345/168 |
| 5,781,252 A * | 7/1998 | Gale ............................. 349/8 |
| 5,786,810 A | 7/1998 | Knox et al. ................ 345/168 |

(Continued)

FOREIGN PATENT DOCUMENTS

EP    0982676    3/2000

(Continued)

*Primary Examiner*—Richard Hjerpe
*Assistant Examiner*—Leonid Shapiro
(74) *Attorney, Agent, or Firm*—Sheridan Ross P.C.

(57) ABSTRACT

A data input device and method including an illuminator (106) operative to illuminate at least one engagement plane (102) by directing light along the at least one engagement plane, a two-dimensional imaging sensor (112) viewing the at least one engagement plane from a location outside the at least one engagement plane for sensing light from the illuminator (106) scattered by engagement of a data entry object (110) with the at least one engagement plane and a data entry processor receiving an output from the two-dimensional imaging sensor (112) and providing a data input to utilization circuitry.

133 Claims, 47 Drawing Sheets

U.S. PATENT DOCUMENTS

| | | | |
|---|---|---|---|
| 5,789,739 A | 8/1998 | Schwarz | 250/221 |
| 5,821,922 A | 10/1998 | Sellers | 345/157 |
| 5,864,334 A | 1/1999 | Sellers | 345/168 |
| 5,909,210 A | 6/1999 | Knox et al. | 345/168 |
| 5,969,698 A | 10/1999 | Richard et al. | 345/7 |
| 6,031,519 A | 2/2000 | O'Brien | 345/156 |
| 6,037,882 A | 3/2000 | Levy | 341/20 |
| 6,043,805 A | 3/2000 | Hsieh | 345/158 |
| 6,121,960 A | 9/2000 | Carroll et al. | 345/173 |
| 6,175,679 B1 | 1/2001 | Veligdan et al. | 385/120 |
| 6,266,048 B1 | 7/2001 | Carau, Sr. | 345/168 |
| 6,297,894 B1 * | 10/2001 | Miller et al. | 359/35 |
| 6,424,338 B1 | 7/2002 | Anderson | |
| 6,607,277 B2 * | 8/2003 | Yokoyama et al. | 353/52 |
| 6,611,252 B1 * | 8/2003 | DuFaux | 345/168 |
| 2002/0075240 A1 | 6/2002 | Lieberman et al. | 345/170 |
| 2005/0169527 A1 * | 8/2005 | Longe et al. | 382/177 |

FOREIGN PATENT DOCUMENTS

| | | |
|---|---|---|
| EP | 1039365 | 9/2000 |
| JP | 2000029605 | 1/2000 |
| WO | WO 99/13395 | 3/1999 |
| WO | WO 00/21024 | 4/2000 |
| WO | WO 00/39663 | 7/2000 |
| WO | WO 01/54110 | 7/2001 |
| WO | WO 01/59975 | 8/2001 |

* cited by examiner

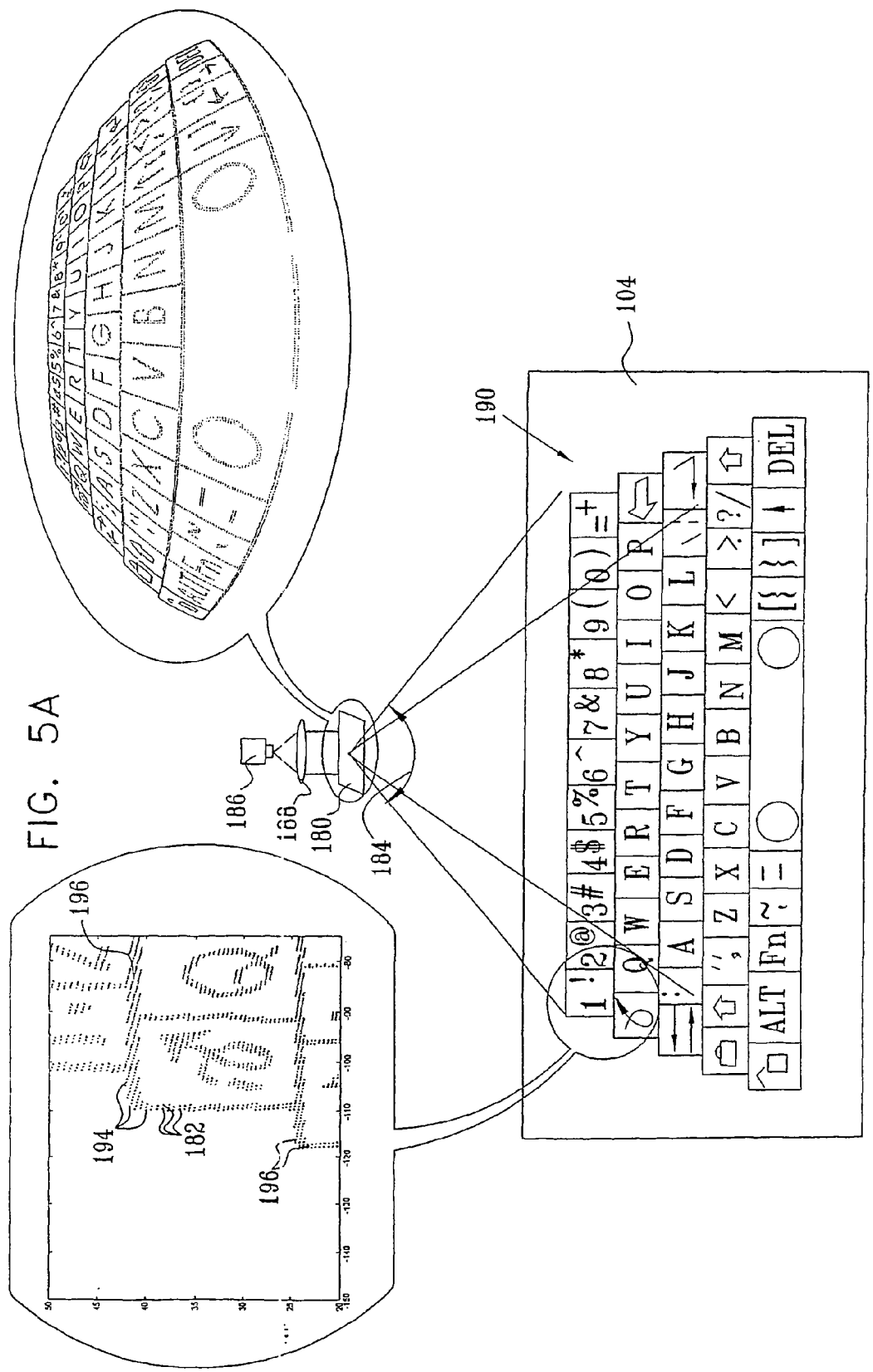

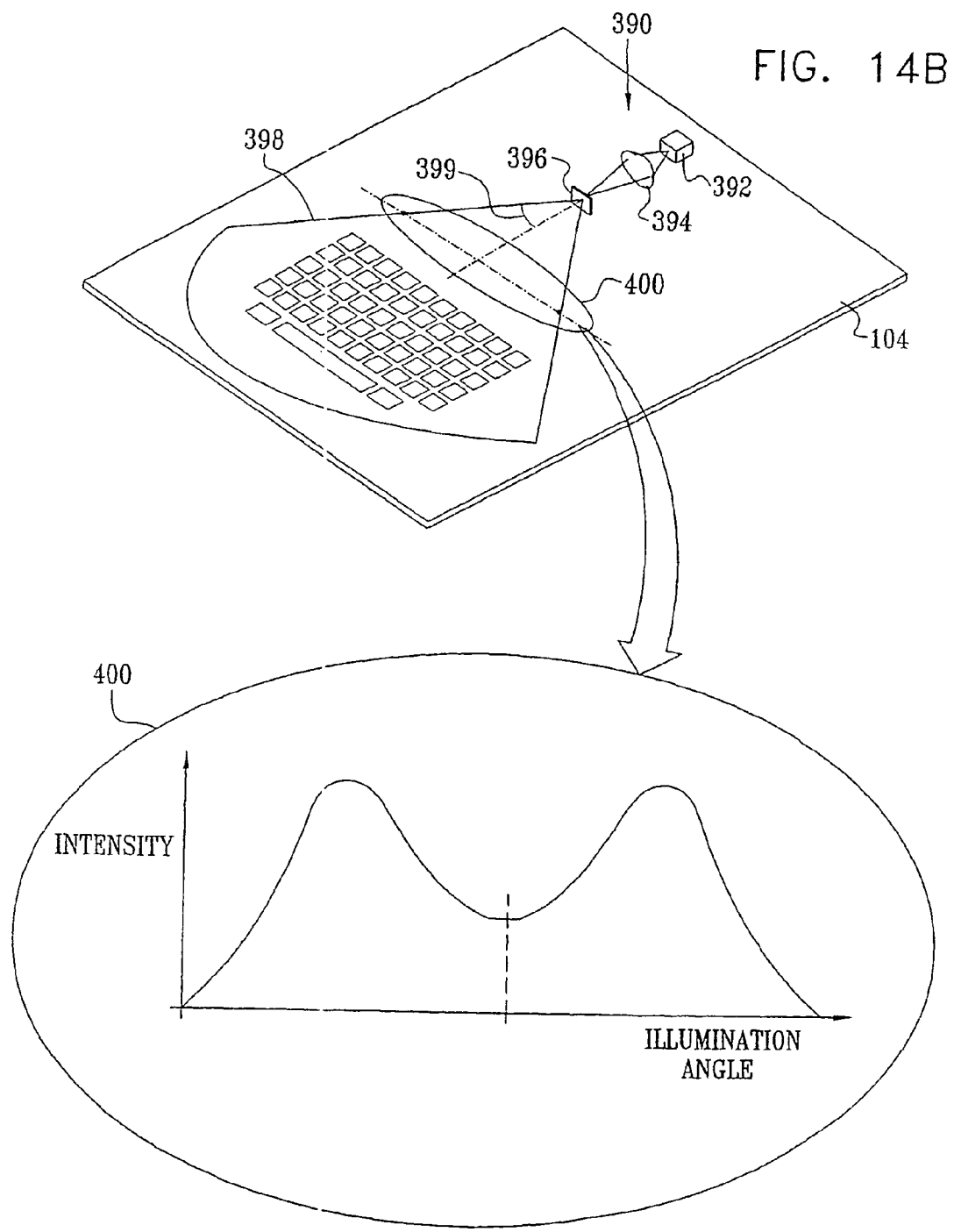

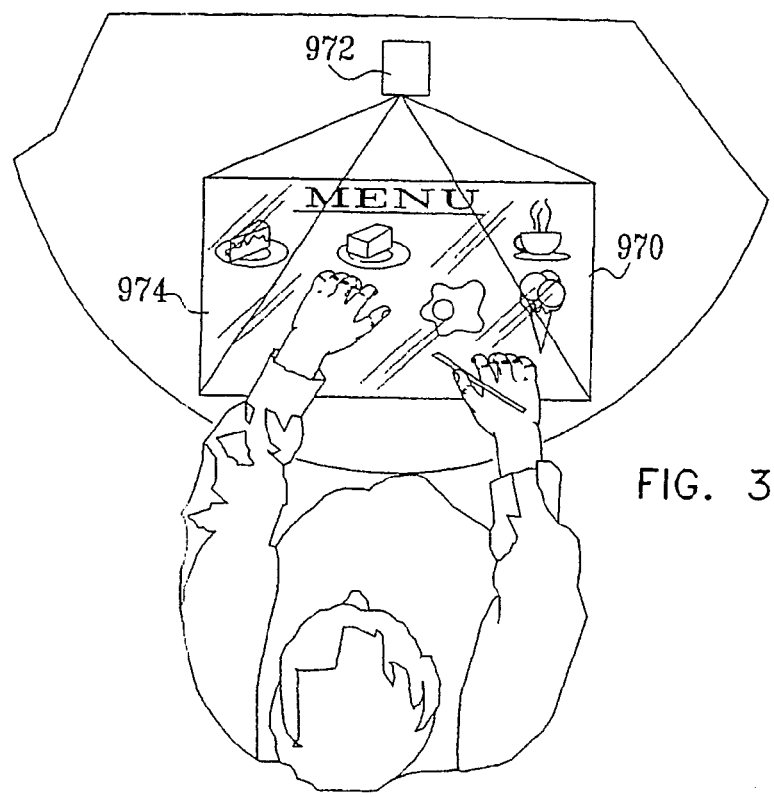
FIG. 38
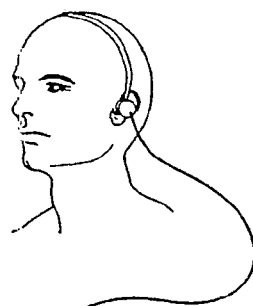
FIG. 39
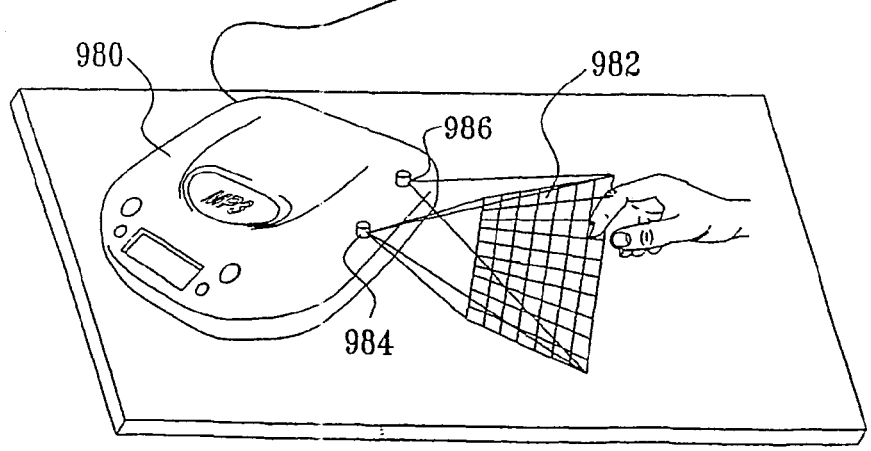

DATA INPUT DEVICE

CROSS REFERENCE TO RELATED APPLICATIONS

This application is a 35 U.S.C. § 371 national stage application of PCT Application No. PCT/IL01/01082, filed Nov. 26, 2001, which claims priority from U.S. Provisional Patent Application Ser. No. 60/260,436, filed Jan. 8, 2001, and from U.S. Provisional Patent Application Ser. No. 60/263,115, filed Jan. 19, 2001, and from U.S. Provisional Patent Application Ser. No. 60/303,922, filed Jul. 6, 2001, and from U.S. Provisional Patent Application Ser. No. 60/338,365, filed Nov. 2, 2001.

BACKGROUND OF THE INVENTION

The following patents and publications are believed to represent the current state of the art:

Published PCT Application WO 01/59975A2; U.S. Pat. No. 6,266,048; Published European application EP 0 982 676 A1; Published European application EP 1 039 365 Aw; U.S. Pat. No. 4,468,694; U.S. Pat. No. 5,969,698; Published Japan application 2000029605; Published PCT application WO 00/39663; Published PCT application WO 01/54110 A1; U.S. Pat. No. 6,175,679; Published PCT application WO 99/13395 A1; U.S. Pat. No. 5,767,842; U.S. Pat. No. 6,043,805; U.S. Pat. No. 5,909,210; U.S. Pat. No. 5,786,810; U.S. Pat. No. 5,821,92; U.S. Pat. No. 5,864,334; Published PCT application WO 00/21024; U.S. Pat. No. 6,037,882; U.S. Pat. No. 6,121,960; U.S. Pat. No. 5,789,739; U.S. Pat. No. 6,031,519; U.S. Pat. No. 5,736,976.

SUMMARY OF THE INVENTION

The present invention relates to data input methods and apparatus generally.

There is thus provided in accordance with a preferred embodiment of the present invention a data input device including an illuminator operative to illuminate at least one engagement plane by directing light along the engagement plane, a two-dimensional imaging sensor viewing the engagement plane from a location outside the engagement plane for sensing light from the illuminator scattered by engagement of a data entry object with the engagement plane and a data entry processor receiving an output from the two-dimensional imaging sensor and providing a data entry input to utilization circuitry.

There is also provided in accordance with a preferred embodiment of the present invention a data input method, which includes illuminating at least one engagement plane by directing light along the engagement plane, employing a two-dimensional imaging sensor for viewing the engagement plane from a location outside the engagement plane for sensing light from the illumination scattered by engagement of a data entry object with the engagement plane and receiving and processing an output from the two-dimensional imaging sensor and providing a data entry input to utilization circuitry.

Further in accordance with a preferred embodiment of the present invention the data input device also includes a data entry matrix projector operative to project at least one visually sensible data entry matrix onto a projection surface underlying the engagement plane.

Preferably, the visually sensible data entry matrix defines a keyboard.

Still further in accordance with a preferred embodiment of the present invention the illuminator includes an illuminator light source and a spatial light modulation element operative to receive light from the illuminator light source and to direct light along the engagement plane.

Additionally in accordance with a preferred embodiment of the present invention the projector includes a projector light source and a spatial light modulation element which operates to receive light from the projector light source and to project at least one visually sensible data entry matrix onto a surface underlying the engagement plane.

Preferably, the spatial light modulation element includes a diffractive optical element.

Further in accordance with a preferred embodiment of the present invention the spatial light modulation element includes an aspheric optical element. Additionally or alternatively, the spatial light modulation element includes a joined double side truncated rod lens optical element.

Typically the spatial light modulation element includes a transparency.

Further in accordance with a preferred embodiment of the present invention the two-dimensional imaging sensor includes a solid state imaging sensor.

Still further in accordance with a preferred embodiment of the present invention the data entry processor correlates the output from the two-dimensional imaging sensor with the visually sensible data entry matrix.

Additionally in accordance with a preferred embodiment of the present invention the data entry matrix projector includes a diffractive optical element which receives light from a diode laser via a collimating lens.

Typically the light passing through the diffractive optical element is reflected by a curved mirror having optical power via a lens onto the projection surface.

Preferably, the diffractive optical element, the mirror and the lens are all integrally formed in a prism.

Further in accordance with a preferred embodiment of the present invention the data entry matrix projector includes an integrally formed beam splitter and diffractive optical elements.

Preferably, in the data entry matrix projector, a beam of light from a diode laser passes through a collimating lens and impinges on two mutually angled surfaces of the beam splitter, which breaks the beam of light into two beams, each of which passes through a separate diffractive optical element and impinges on the projection surface.

Typically the diffractive optical elements are integrally formed with the beam splitter in a prism.

Further in accordance with a preferred embodiment of the present invention the data entry matrix projector includes a plurality of different diffractive optical elements, each of which typically corresponds to a different matrix configuration, which are selectably positionable along a projection light path.

Still further in accordance with a preferred embodiment of the present invention the data entry matrix projector includes a diffractive optical element having a multiplicity of diffraction orders selected to provide a matrix configuration which has a relatively low maximum diffraction angle.

Additionally or alternatively, the data entry matrix projector includes a diffractive optical element having a multiplicity of diffraction orders selected to provide a keyboard configuration, which has a generally trapezoidal configuration.

Further in accordance with a preferred embodiment of the present invention the data entry matrix projector includes a diffractive optical element having a multiplicity of diffraction orders selected to compensate for geometrical distortions inherent in the operation of the diffractive optical element, particularly at high diffraction angles.

Still further in accordance with a preferred embodiment of the present invention the data entry matrix projector includes a diffractive optical element having a multiplicity of diffraction orders selected to compensate for geometrical distortions occasioned by a highly oblique angle of projection.

Additionally in accordance with a preferred embodiment of the present invention in the data entry matrix projector, light from a pair of point light sources is combined by a beam combiner, such that two light beams emerge from the beam combiner and appear to originate in a single virtual light source positioned behind the beam combiner.

Preferably, the light beams pass through a shadow mask onto the projection surface.

Further in accordance with a preferred embodiment of the present invention the data entry matrix projector includes an array of light emitting elements and microlenses.

Typically, the light emitting elements are individually controllable.

Still further in accordance with a preferred embodiment of the present invention the data entry matrix projector includes a monolithic pattern of LEDs formed on a unitary substrate.

Further in accordance with a preferred embodiment of the present invention the two-dimensional imaging sensor is located on the opposite side of a transparent engagement surface from the engagement plane, whereby the presence of the data entry object at the engagement plane causes light from the illuminator to be scattered and to pass through the transparent engagement surface so as to be detected by the two-dimensional imaging sensor.

Still further in accordance with a preferred embodiment of the present invention the data input device includes a transparent engagement surface is coextensive with the engagement plane, whereby touching engagement of the data entry object with the transparent engagement surface causes light from the illuminator to be scattered and to pass through the transparent engagement surface so as to be detected by the two-dimensional imaging sensor.

Preferably, the transparent engagement surface exhibits total internal reflection of a planar beam of light emitted by an illuminator and coupled to an edge of the transparent engagement surface, whereby touching engagement of the data entry object with the transparent engagement surface causes light from the illuminator to be scattered due to frustrated total internal reflection.

Additionally in accordance with a preferred embodiment of the present invention the illuminator provides illumination generally through 360 degrees and the two-dimensional imaging sensor views generally through 360 degrees.

Preferably, the illuminator provides a non-uniform intensity distribution.

Further in accordance with a preferred embodiment of the present invention at least a portion of the non-uniform intensity distribution provides greater intensity at greater illumination angles.

Still further in accordance with a preferred embodiment of the present invention the data input device, also includes a data entry object speed sensor operative to sense the speed with which the data entry object approaches the engagement plane.

Preferably, the illuminator includes at least first and second wavelength specific illuminators operative at at least first and second different wavelengths and directing light along at least first and second mutually spaced, overlying engagement planes and the two-dimensional imaging sensor senses light at the first and second different wavelengths, differentiates therebetween and provides an output to the data entry object speed sensor.

Further in accordance with a preferred embodiment of the present invention the illuminator includes at least first and second illuminators operative at the same wavelength and directing light along at least first and second mutually spaced, overlying engagement planes and the data entry object speed sensor is responsive to changes in the intensity of light sensed by the two-dimensional imaging sensor for providing an output indication of the speed.

Preferably, the illuminator directs light, which is emitted from a point source through a large solid angle, into a flat radially directed beam extending along the engagement plane, the beam having a relatively narrow spread in a direction perpendicular to the engagement plane.

Still further in accordance with a preferred embodiment of the present invention the illuminator includes a point light source which emits light through a generally semi-hemispherical volume centered about a propagation axis, an aspheric reflector which reflects the light emitted by the point light source along a line lying in the engagement plane and extending perpendicular to the propagation axis, the aspheric reflector reflecting light from different elevations so that the reflected light passes through the line at differing locations therealong and a twisted elongate mirror, arranged along the line which reflects the light passing through the line at various elevation angles as a planar flat beam which lies in a plane, which plane extends through the line and traverses a slit in the aspheric reflector.

Preferably, the aspherical reflector includes strips of a spherical mirror whose centers are offset from each other along an axis lying in the engagement plane and extending perpendicular to the propagation axis.

Preferably, the two-dimensional imaging sensor includes an angle-compensated interference filter.

Further in accordance with a preferred embodiment of the present invention the angle-compensated interference filter includes a plurality of thin films, each being of non-uniform thickness, formed onto a dome shaped transparent substrate having an axis of symmetry.

Preferably, the plurality of thin films have a thickness which is selected to vary such that the thickness of the plurality of thin films traversed by light beams impinging onto a given point located along the axis of symmetry is generally identical irrespective of the angular relationship between the light beam and the axis of symmetry.

Additionally in accordance with a preferred embodiment of the present invention the data input device also includes an imaging lens located at the given point, which directs the light to the two-dimensional imaging sensor.

Typically, the dome shaped transparent substrate is configured such that uniform evaporation of film material thereonto from a location spaced therefrom produces the plurality of thin films each being of non-uniform thickness which is selected to vary such that the thickness of the plurality of thin films traversed by light beams impinging onto a given point located along the axis of symmetry is generally identical irrespective of the angular relationship between the light beam and the axis of symmetry.

Further in accordance with a preferred embodiment of the present invention the data entry processor is operative to map locations on the two-dimensional image sensor to data entry functions.

Preferably, the data entry processor is operative to map received light intensity at the locations on the two-dimensional image sensor to the data entry functions.

Further in accordance with a preferred embodiment of the present invention the data entry processor includes the following functionality: as each pixel value is acquired, determining, using the pixel coordinates, whether that pixel lies within a predefined keystroke region, acquiring pixel values for various pixel coordinates, adding or subtracting each pixel value to or from a pixel total maintained for each the keystroke region based on determining a pixel function of each pixel and comparing the pixel total for each the keystroke region with a current key actuation threshold. If the pixel total exceeds the key actuation threshold for a given keystroke region in a given frame and in the previous frame the pixel total did not exceed the key actuation threshold for that keystroke region, provide a key actuation output. Additionally or alternatively, if the pixel total does not exceed the key actuation threshold for a given keystroke region in a given frame and in the previous frame the pixel total did exceed the key actuation threshold for that keystroke region, provide a key deactuation output.

Preferably, the data input device determines whether that pixel lies within a predefined keystroke region is made by employing a pixel index table which indicates for each pixel, whether that pixel lies within a predetermined keystroke region and, if so, within which keystroke region it lies.

Further in accordance with a preferred embodiment of the present invention both determining steps employ the pixel index table.

Preferably, the pixel total is maintained for each keystroke region in a keystroke region accumulator table.

Preferably, the comparing step employs a keystroke region threshold table.

Still further in accordance with a preferred embodiment of the present invention the data input device also includes the following functionality: once all of the pixels in a frame have been processed, determining an updated background level for a frame and determining a key actuation threshold for the keystroke region threshold table by subtracting the updated background level from a predetermined threshold level which is established for each keystroke region.

Further in accordance with a preferred embodiment of the present invention the pixel function includes adding the pixel values of a plurality of pixels in the keystroke region.

Additionally or alternatively, the pixel function includes adding the pixel values of the plurality of pixels in the keystroke region and subtracting therefrom pixel values of a plurality of pixels in a keystroke region border outside the keystroke region.

Additionally or alternatively, the pixel function includes adding the pixel values of the plurality of pixels in the keystroke region, ignoring the pixel values of a plurality of pixels in a first keystroke region border outside the keystroke region and subtracting pixel values of a plurality of pixels in a second keystroke region border, outside the first keystroke region border.

Further in accordance with a preferred embodiment of the present invention the data entry processor is operative to determine the "center of gravity" of pixel values of pixels in the two-dimensional image sensor.

Still further in accordance with a preferred embodiment of the present invention the data entry processor includes the following functionality: as each pixel value is acquired, determining, using the pixel coordinates, whether that pixel lies within a predefined active region, acquiring pixel values for various pixel coordinates and determining the "center of gravity" of the pixel values.

Preferably, the step of determining the "center of gravity" is achieved by: multiplying the pixel values by X and Y values representing the geographic position of each pixel, summing the results along mutually perpendicular axes X and Y, summing the total of the pixel values for all relevant pixels for the active region and dividing the summed results by the total of the pixel values to determine the X and Y coordinates of the "center of gravity", which represents a desired engagement location.

Typically, the pixel values are thresholded prior to summing thereof.

Further in accordance with a preferred embodiment of the present invention the non-uniform intensity distribution varies over time.

Preferably, the two-dimensional sensor operates to view different imaging fields at different times and wherein the operation of the illuminator is correlated with the operation of the two-dimensional image sensor, whereby the intensity of light produced by the illuminator varies in synchronization with an imaging field location of the two-dimensional image sensor.

Preferably, the distance between the two-dimensional sensor and its the imaging field location increases, the intensity of light provided by the illuminator increases.

Typically, the data input device also includes variable intensity drive electronics which is coupled to the illuminator and to the two-dimensional detector and which causes the intensity of light produced by the illuminator to vary in synchronization to the imagine field location of the two-dimensional detector.

Still further in accordance with a preferred embodiment of the present invention the data input device also includes a digital signature generator receiving an input from the data entry processor including intensity, position and timing outputs and employs the outputs to provide a digital signature.

There is also provided in accordance with a preferred embodiment of the present invention a data input device, which includes an illuminator operative to illuminate at least one engagement surface, a two-dimensional imaging sensor viewing the engagement surface from a location outside the engagement surface for sensing engagement of a data entry object with the engagement surface and a data entry processor receiving an output from the two-dimensional imaging sensor and providing a data entry input to utilization circuitry, the data entry processor employing shadow analysis.

There is further provided in accordance with a preferred embodiment of the present invention a data input method, which includes illuminating at least one engagement surface, viewing the engagement surface with a two-dimensional image sensor from a location outside the engagement surface for sensing engagement of a data entry object with the engagement surface and processing an output from the two-dimensional imaging sensor and providing a data entry input to utilization circuitry, the data entry processor employing shadow analysis.

Further in accordance with a preferred embodiment of the present invention the illuminator includes a non-point light source and the data entry processor employs a shadow density analyzer to determine the sharpness of edges of a shadow defined by the non-point light source and the data entry object on the engagement surface, which indicates the propinquity of the data entry object to the projection surface.

Additionally or alternatively, the illuminator includes a plurality of light sources and the data entry processor employs a shadow coalescence analyzer to determine the extent of coalescence of shadows defined by the plurality of light sources and data entry object on the engagement surface, which indicates the propinquity of the data entry object to the projection surface.

Preferably, the data entry processor includes the following functionality: as each pixel value is acquired, determining, using the pixel coordinates, whether that pixel lies within a predefined keystroke region and within predefined left and right keystroke subregions therewithin, acquiring pixel values for various pixel coordinates, obtaining the derivative of each pixel value along an X axis, summing the derivatives for each the subregion, subtracting the summed derivatives for the two subregions in each keystroke region, one from the other to provide a difference and comparing the difference with a current key actuation threshold. If the difference exceeds the key actuation threshold for a given keystroke region in a given frame and in the previous frame the pixel total did not exceed the key actuation threshold for that keystroke region, provide a key actuation output. Additionally or alternatively, if the difference does not exceed the key actuation threshold for a given keystroke region in a given frame and in the previous frame the pixel total did exceed the key actuation threshold for that keystroke region, provide a key deactuation output.

Preferably, the step of determining employs a pixel index table, which indicates for each pixel, whether that pixel lies within a predetermined keystroke region and, if so, within which keystroke region as well as within which keystroke subregion it lies.

Typically, the pixel total is maintained for each keystroke subregion in a keystroke subregion accumulator table.

Still further in accordance with a preferred embodiment of the present invention the step of comparing employs a keystroke region threshold table.

Additionally in accordance with a preferred embodiment of the present invention the engagement plane is associated with a pull-down tray in a vehicle wherein the pull-down tray defines an engagement surface which is configured by projection.

Further in accordance with a preferred embodiment of the present invention the two-dimensional detector and illuminator are associated with a camera.

Still further in accordance with a preferred embodiment of the present invention the two-dimensional detector and illuminator are associated with a home entertainment system.

Additionally in accordance with a preferred embodiment of the present invention the engagement plane overlies a television screen forming part of the home entertainment system.

Further in accordance with a preferred embodiment of the present invention the engagement plane is associated with a table.

Still further in accordance with a preferred embodiment of the present invention the engagement plane is associated with a remote control device.

Additionally in accordance with a preferred embodiment of the present invention the engagement plane is located within a restricted particulate matter environment.

Further in accordance with a preferred embodiment of the present invention the engagement plane is located within an industrial environment unsuitable for a conventional keyboard.

Preferably, the two-dimensional detector and illuminator are associated with a video projector.

Still further in accordance with a preferred embodiment of the present invention the two-dimensional detector and illuminator are associated with a restaurant patron interface system.

Additionally in accordance with a preferred embodiment of the present invention the two-dimensional detector and illuminator are associated with a mobile audio player.

Further in accordance with a preferred embodiment of the present invention the two-dimensional detector and illuminator provide touch screen functionality.

Preferably, the touch screen functionality employs a video display screen.

Still further in accordance with a preferred embodiment of the present invention the two-dimensional detector and illuminator provide access control functionality.

Preferably, the engagement plane is associated with a game board and wherein the game board defines an engagement surface, which is configured by projection.

Additionally in accordance with a preferred embodiment of the present invention the engagement plan is associated with a musical instrument and wherein the musical instrument defines an engagement surface, which is configured by projection.

Further in accordance with a preferred embodiment of the present invention the two-dimensional detector and illuminator provide vehicle telemetric functionality. Preferably, the vehicle defines an engagement surface, which is configured by projection.

Still further in accordance with a preferred embodiment of the present invention the two-dimensional detector and illuminator provide automatic vending user interface functionality.

There is further provided in accordance with another preferred embodiment of the present invention an angle-compensated interference filter which includes a plurality of thin films, each being of non-uniform thickness, formed onto a dome shaped transparent substrate having an axis of symmetry. The plurality of thin film have a thickness, which is selected to vary, such that the thickness of the plurality of thin films traversed by light beams impinging onto a given point located along the axis of symmetry is generally identical irrespective of the angular relationship between the light beam and the axis of symmetry.

There is also provided in accordance with a further preferred embodiment of the present invention a method for filtering light employing an angle-compensated interference filter, which includes a plurality of thin films, each being of non-uniform thickness, formed onto a dome shaped transparent substrate having an axis of symmetry. The plurality of thin films have a thickness which is selected to vary such that the thickness of the plurality of thin films traversed by light beams impinging onto a given point located along the axis of symmetry is generally identical irrespective of the angular relationship between the light beam and the axis of symmetry.

Further in accordance with a preferred embodiment of the present invention the dome shaped transparent substrate is configured such that evaporation of film material thereonto from a location spaced therefrom produces the plurality of thin films each being of non-uniform thickness. The non-uniform thickness is selected to vary such that the thickness of the plurality of thin films traversed by light beams impinging onto a given point located along the axis of symmetry is generally identical irrespective of the angular relationship between the light beam and the axis of symmetry.

Preferably, the step of evaporation is performed in a uniform manner.

BRIEF DESCRIPTION OF THE DRAWINGS

The present invention will be understood and appreciated more fully from the following detailed description, taken in conjunction with the drawings in which:

FIGS. 5A and 5B are respective simplified pictorial and side view illustrations of a keyboard projection subsystem employing a diffractive optical element having diffraction orders selected to provide a keyboard configuration which has a relatively low maximum diffraction angle, constructed and operative in accordance with a preferred embodiment of the present invention;

FIG. 14B is a simplified illustration of an illumination subsystem including an illuminator which provides desired non-uniform illumination intensity and employing a diffractive element, constructed and operative in accordance with a preferred embodiment of the present invention;

FIG. 38 is a simplified illustration of a restaurant patron interface system and methodology, constructed and operative in accordance with a preferred embodiment of the present invention;

FIG. 39 is a simplified illustration of a keyboard system and methodology, constructed and operative in accordance with a preferred embodiment of the present invention;

DETAILED DESCRIPTION OF PREFERRED EMBODIMENTS

Figure 1:
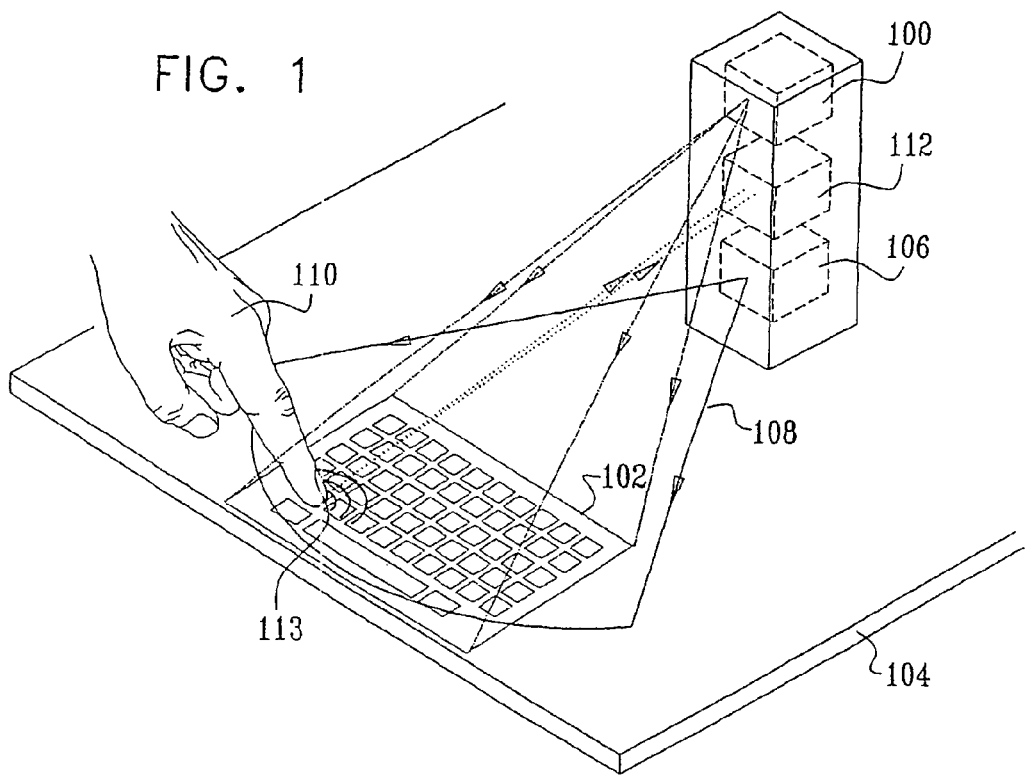
FIG. 1 is a simplified and generalized illustration of a projection keyboard system and methodology, constructed and operative in accordance with a preferred embodiment of the present invention.

Reference is now made to FIG. 1, which is a simplified and generalized illustration of a projection keyboard system and methodology, constructed and operative in accordance with a preferred embodiment of the present invention. A projection subsystem 100, preferably including a solid state light source (not shown) which illuminates a spatial light modulation element (not shown), defines an image 102 of a keyboard on a projection surface 104, preferably an inert surface, such as a desktop.

An illumination subsystem 106, preferably including a solid state light source (not shown), directs light in a radially directed illumination pattern 108, which preferably extends in a plane generally parallel to the projection surface 104. It is appreciated that the radially directed illumination pattern 108 has a very narrow spread in the direction generally perpendicular to the projection surface 104. It is further appreciated that the radially directed illumination pattern 108 is preferably located very close to the projection surface 104.

Impingement of light in the radially directed illumination pattern 108 on a data entry object 110, such as a user's finger, a stylus or other use implement, causes light to be scattered or reflected therefrom. It is appreciated that the light is only scattered or reflected when the data entry object 110 is in close contact with the keyboard 102 defined on projection surface 104.

A detection subsystem 112, preferably employing a solid state imaging sensor (not shown), receives light reflected or scattered from data entry object 110. The received light is mapped onto the imaging sensor with respect to a representation of the keyboard for associating the location of the data entry object 110 sensed by detection subsystem 112 with a key location 113 on the keyboard 102. Thus the sensed location of data entry object 110 indicates which key of the keyboard 102 is being engaged.

Figure 2:
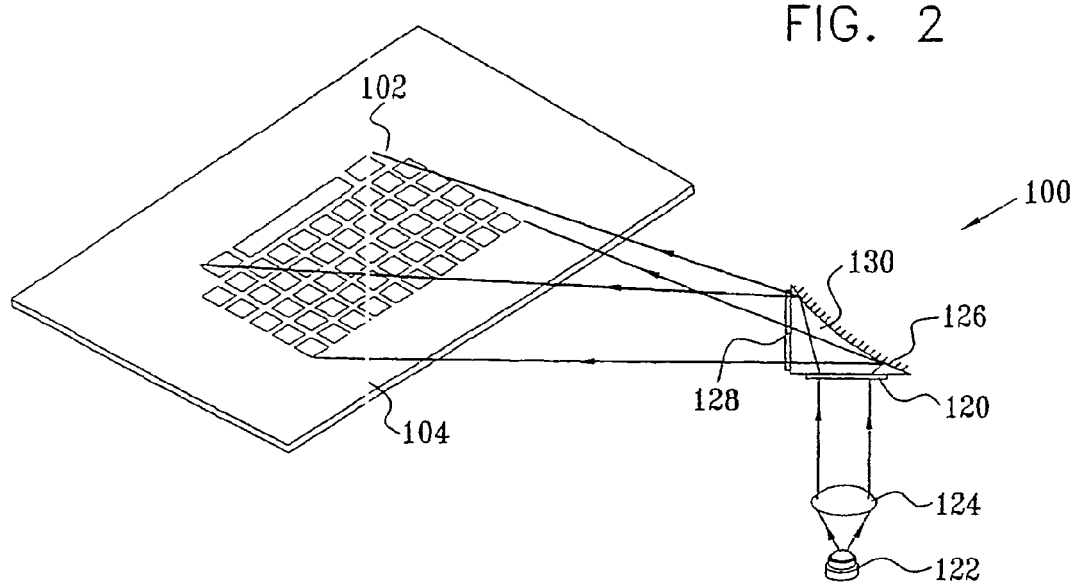
FIG. 2 is a simplified illustration of a keyboard projection subsystem employing a diffractive optical element and having optical power, constructed and operative in accordance with a preferred embodiment of the present invention.

Reference is now made to FIG. 2, which is a simplified illustration of a preferred embodiment of a keyboard projection subsystem 100 (FIG. 1) employing a diffractive optical element 120 which receives light from a light source 122, such as a diode laser, via a collimating lens 124. Light passing through the diffractive optical element 120 preferably is reflected by a curved mirror 126 having optical power, optionally via a lens 128 onto projection surface 104 (FIG. 1), preferably defining a keyboard 102 (FIG. 1).

In accordance with a preferred embodiment of the present invention, the diffractive optical element 120, the mirror 126 and optionally the lens 128 are all integrally formed in a suitably configured prism 130, as by embossing.

The configuration of FIG. 2 is preferred in order to enable a diffractive optical element having a relatively small maximum diffraction angle to be used. The mirror 126, having optical power spreads the light passing through the diffractive optical element 120 to a sufficient degree to enable projection of a full sized keyboard 102 on projection surface 104, even when projection surface 104 is relatively close to the diffractive optical element 120. Alternatively, the prism 103 and the mirror 126 may be replaced by one or more lenses.

Figure 3A:
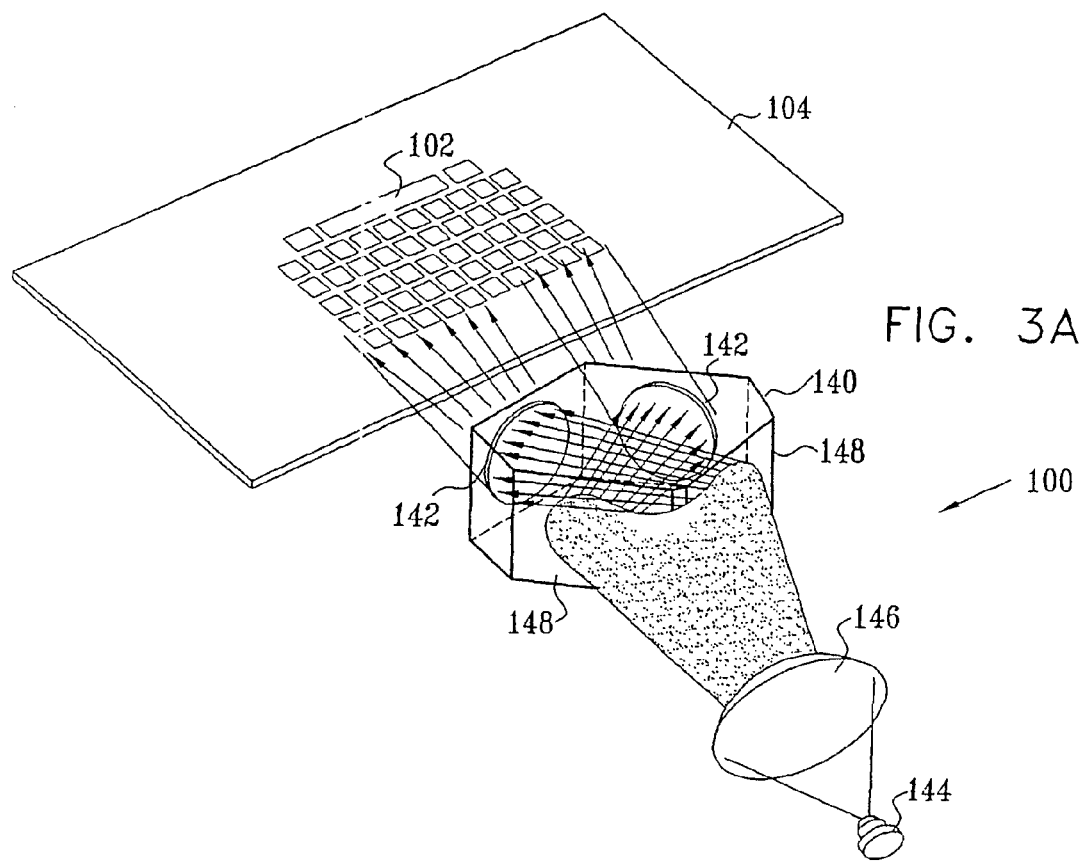
FIGS. 3A and 3B are respective simplified pictorial and top view illustrations of a keyboard projection subsystem employing an integrally formed beam splitter and diffractive optical elements, constructed and operative in accordance with a preferred embodiment of the present invention.
Figure 3B:
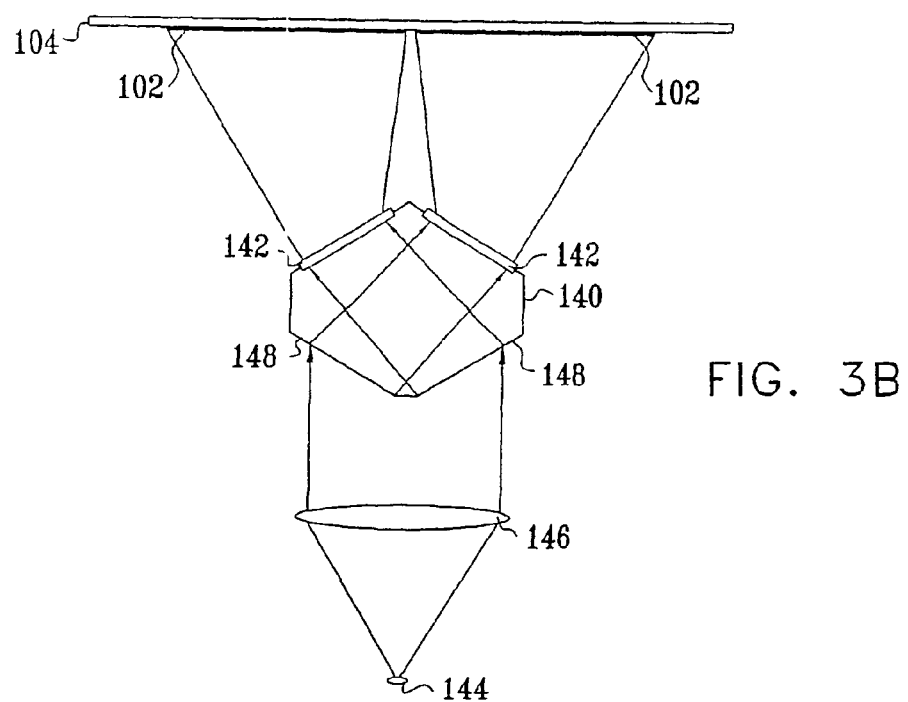

Reference is now made to FIGS. 3A and 3B, which are respective simplified pictorial and top view illustrations of the keyboard projection subsystem 100 (FIG. 1) employing an integrally formed beam splitter and diffractive optical elements, constructed and operative in accordance with a preferred embodiment. This embodiment employs a beam splitter 140 preferably integrally formed with plural diffractive optical elements 142. A beam of light from a light source 144, such as a diode laser, preferably passed through a collimating lens 146 and impinges on two mutually angled surfaces 148 of beam splitter 140. The beam splitter 140 breaks the beam of light into two beams, each of which passes through a separate diffractive optical element 142. Light passing through both diffractive optical elements 142 impinges on projection surface 104 (FIG. 1), preferably defining a keyboard 102 (FIG. 1).

In accordance with a preferred embodiment of the present invention, the diffractive optical elements 142 are integrally formed with the beam splitter 140 in a suitably configured prism, as by embossing.

The configuration of FIGS. 3A and 3B is preferred in order to enable a pair of diffractive optical elements, each having a relatively small maximum diffraction angle, to be used in combination together to define a full sized keyboard 102 on projection surface 104, even when projection surface 104 is relatively close to the diffractive optical element 120. An added advantage of using plural diffractive optical elements is an increase in resolution, inasmuch as each diffractive optical element defines only part of the image projected onto projection surface 104. Preferably, the beam splitter 140 is configured such that the two beams each impinge perpendicularly onto a corresponding diffractive optical element 142.

Figure 4:
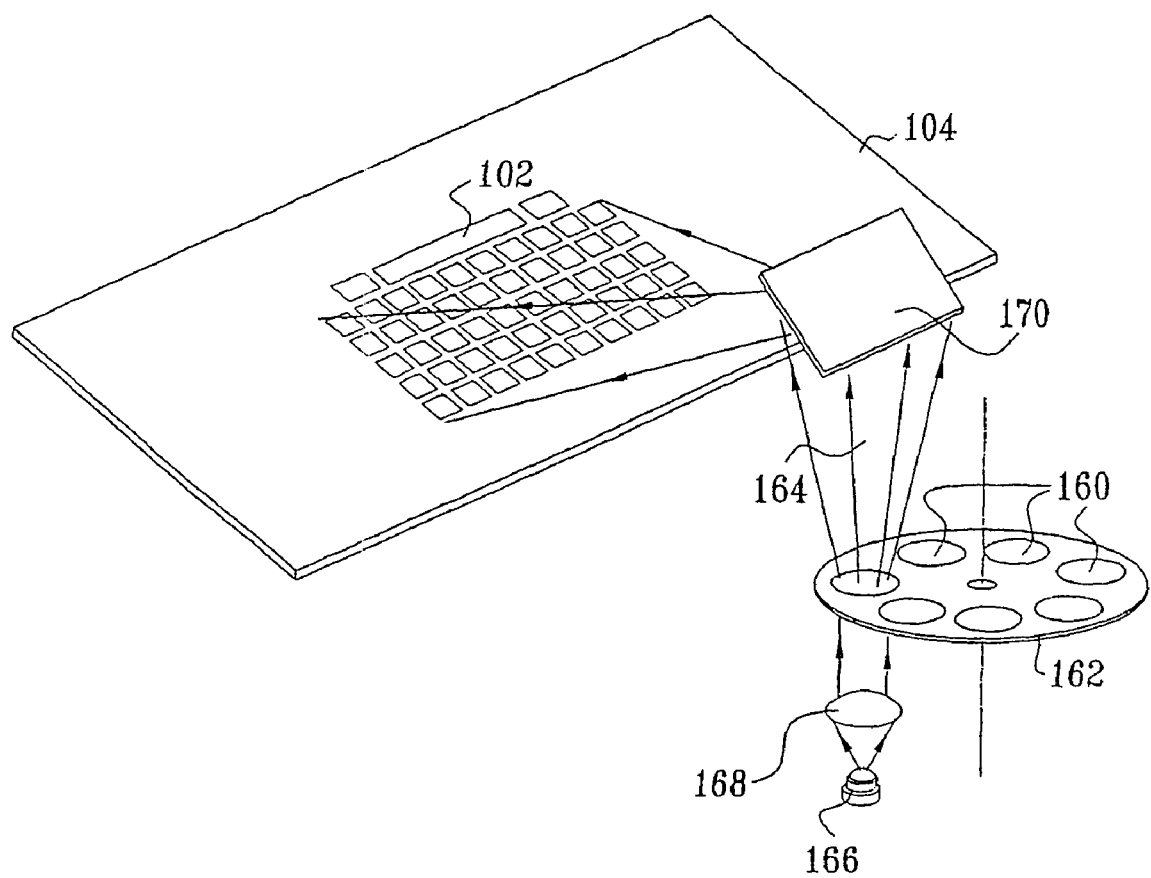
FIG. 4 is a simplified illustration of a multiple format keyboard projection subsystem employing a plurality of different diffractive optical elements which are selectably positionable along a keyboard projection light path, constructed and operative in accordance with a preferred embodiment of the present invention.

Reference is now made to FIG. 4, which is a simplified illustration of a preferred multiple format embodiment of keyboard projection subsystem 100 (FIG. 1). This embodiment employs a plurality of different diffractive optical elements 160, each of which typically corresponds to a different keyboard configuration. The optical elements 160 are preferably mounted onto a rotatable support 162 in order to be selectably positionable along a keyboard projection light path 164 extending from a light source 166, such as a diode laser, preferably through a collimating lens 168 and preferably impinging on a mirror 170, which directs light passing therealong onto projection surface 104 (FIG. 1), preferably defining a keyboard 102 (FIG. 1).

Figure 5B:
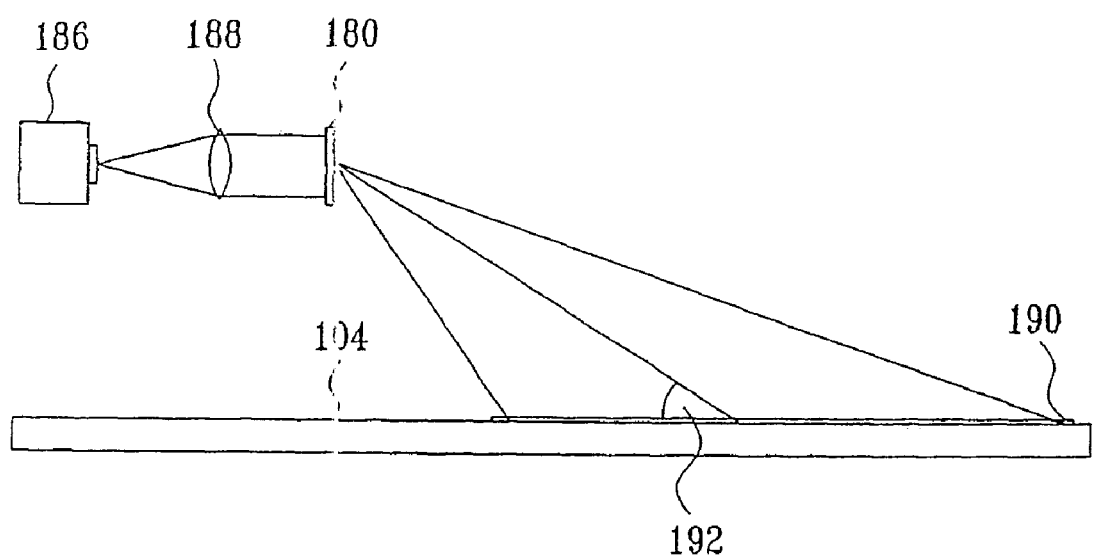

Reference is now made to FIGS. 5A and 5B, which are simplified illustrations of a keyboard projection subsystem employing a diffractive optical element 180 having a multiplicity of diffraction orders 182 selected to provide a keyboard configuration which has a relatively low maximum diffraction angle 184. Angle 184 is preferably in excess of 90 degrees and is typically between 60 degrees and 120 degrees.

As seen in FIG. 5A, light from a light source 186 passing through a collimating lens 188 and thence through the diffractive optical element 180 preferably falls onto a projection surface 104 (FIG. 1), preferably defining a generally trapezoidal shaped keyboard 190, which is configured in accordance with a preferred embodiment of the present invention.

The diffraction orders 182 of the diffractive optical element 180 are calculated and selected to compensate for geometrical distortions inherent in the operation of a diffractive optical element, such as element 180, particularly at high diffraction angles, such as angle 184. To this end, the individual diffraction orders 182 are preferably arranged in rows 194 which extend obliquely with respect to lines 196 defined thereby.

Additionally, the diffraction orders 182 are calculated and selected in order to compensate for geometric distortions occasioned by a highly oblique angle of projection, such as angle 192, seen in FIG. 5B. To this end the diffraction orders are arranged as shown in FIG. 5A, to have a barrel-like distortion and to have a non-uniform outwardly increasing spacing between lines which are sought to appear parallel on keyboard 190. Angle 192 is preferably less than less than 30 degrees and is typically between 20 degrees and 90 degrees.

Figure 6A:
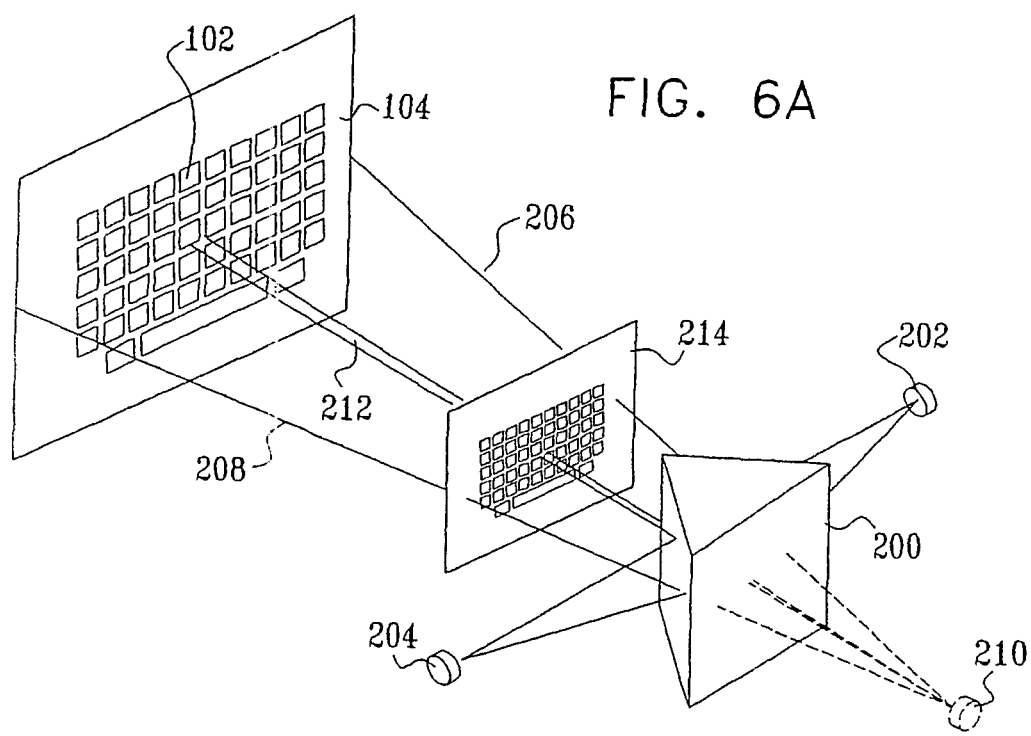
FIGS. 6A and 6B are respective simplified pictorial and top view illustrations of a keyboard projection subsystem employing a beam combiner, constructed and operative in accordance with a preferred embodiment of the present invention.
Figure 6B:
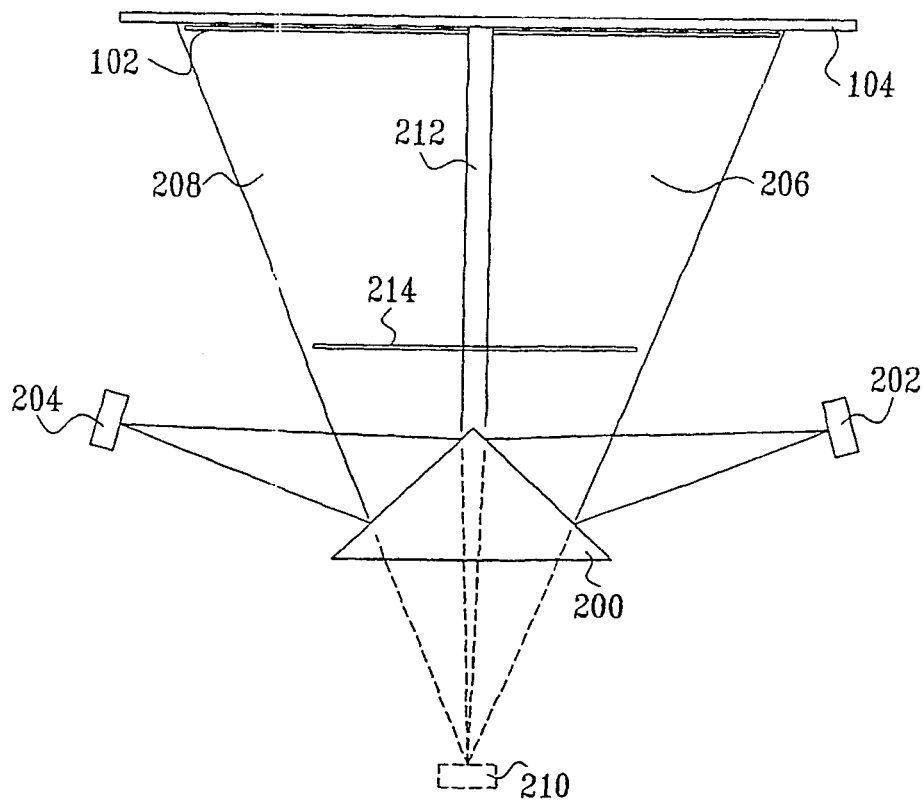

Reference is now made to FIGS. 6A and 6B, which are simplified illustrations of a keyboard projection subsystem employing a beam combiner 200. As seen in FIGS. 6A and 6B, light from a pair of point light sources 202 and 204 is combined by beam combiner 200, such that two light beams 206 and 208 emerge from the beam combiner 200 and appear to originate in a single virtual light source 210 positioned behind beam combiner 200. In actuality the two light beams 206 and 208 nearly overlap, but may define a no-light beam region 212 therebetween.

The light beams 206 and 208 pass through a shadow mask 214 onto projection surface 104 (FIG. 1), preferably defining a keyboard 102 (FIG. 1).

The embodiment of FIGS. 6A and 6B has an advantage in that it may employ multiple relatively low power and low cost laser diodes to provide the same power as would be provided by a single much more expensive laser diode.

Figure 7:
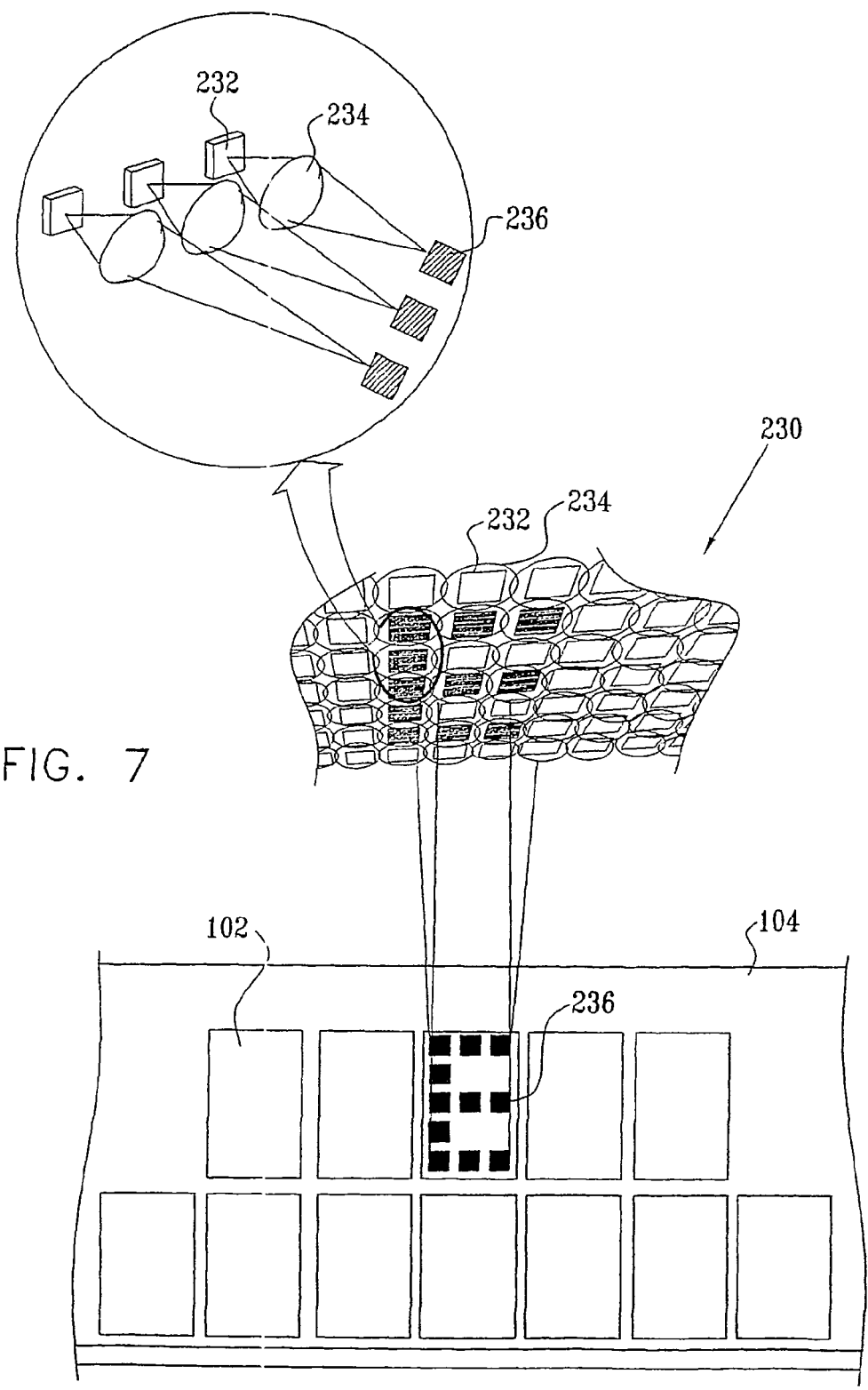
FIG. 7 is a simplified illustration of a keyboard projection subsystem employing an array of light emitting elements and microlenses, constructed and operative in accordance with a preferred embodiment of the present invention.

Reference is now made to FIG. 7, which is a simplified illustration of a keyboard projection subsystem employing an array 230 of light emitting elements 232 and microlenses 234. As seen in FIG. 7, light from multiple point light emitting elements 232, such as LEDs, is imaged by corresponding multiple microlenses 234 onto projection surface 104 (FIG. 1), preferably defining a portion of keyboard 102 (FIG. 1), such as the letter "E". It is appreciated that each of light emitting elements 232 is individually controllable in order to provide a correspondingly individual light spot 236 on projection surface 104. The collection of light spots 236 makes up the keyboard 102 (FIG. 1). The embodiment of FIG. 7 provides a selectable and changeable keyboard.

Figure 8:
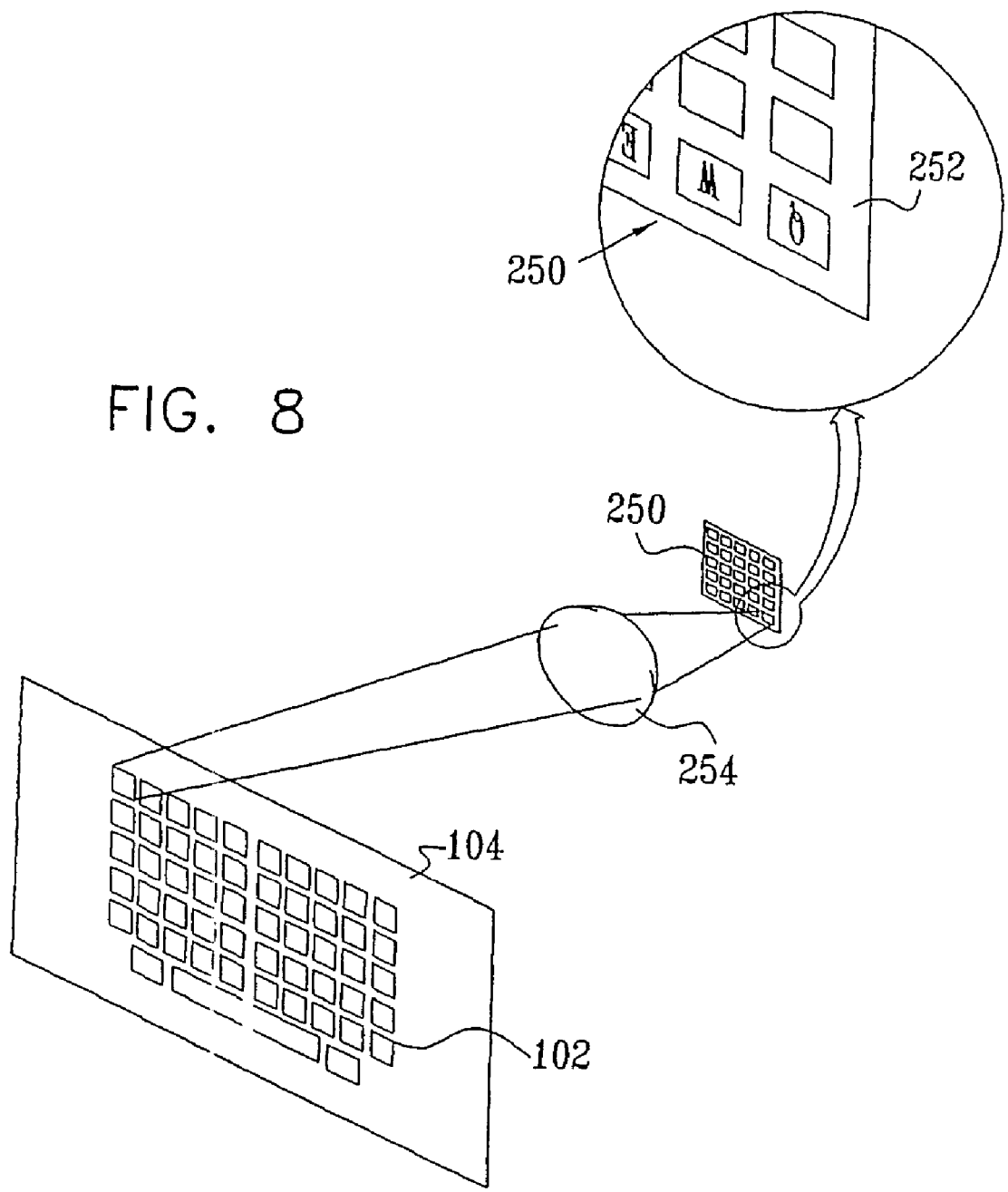
FIG. 8 is a simplified illustration of a keyboard projection subsystem employing specially configured light emitting elements, constructed and operative in accordance with a preferred embodiment of the present invention.

Reference is now made to FIG. 8, which is a simplified illustration of a keyboard projection subsystem employing specially configured light emitting elements, preferably a monolithic pattern 250 of LEDs formed on a unitary substrate 252.

As seen in FIG. 8, light from the pattern 250 is imaged by a lens 254 onto projection surface 104 (FIG. 1), preferably defining keyboard 102 (FIG. 1). This arrangement has the advantage of electrical efficiency and low unit cost but does not provide a variable keyboard configuration.

Figure 9A:
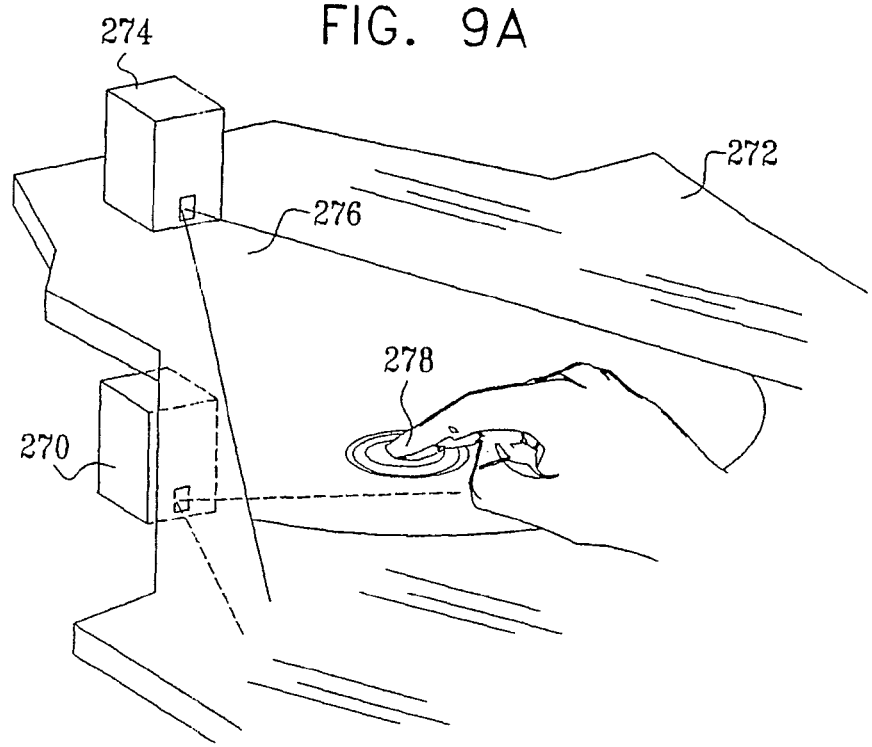
FIGS. 9A and 9B are respective pictorial and side view illustrations of a data entry object engagement location sensing subsystem employing a camera located on the opposite side of a transparent data entry object engagement surface from a data entry object engagement location sensing illuminator, constructed and operative in accordance with a preferred embodiment of the present invention.
Figure 9B:
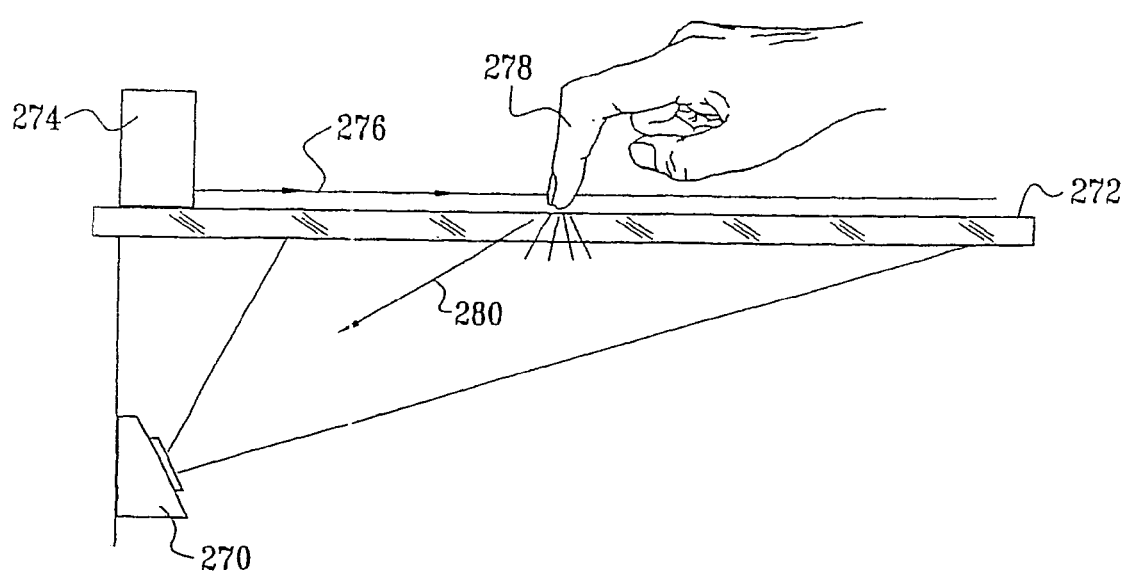

Reference is now made to FIGS. 9A and 9B, which are respective pictorial and side view illustrations of a data entry object engagement location sensing subsystem employing a camera 270 located on the opposite side of a transparent data entry object engagement surface 272 from a data entry object engagement location sensing illuminator 274. A generally flat planar beam of light, designated by reference numeral 276, is preferably emitted by illuminator 274 generally parallel to and spaced from data entry object engagement surface 272. As seen particularly in FIG. 9B, the presence of an object, such as a data entry object 278 in beam 276, causes light from beam 276 to be scattered into a scattered beam 280 and inter alia to pass through transparent data entry object engagement surface 272 so as to be detected by camera 270, which preferably forms part of detection subsystem 112 (FIG. 1).

Figure 10A:
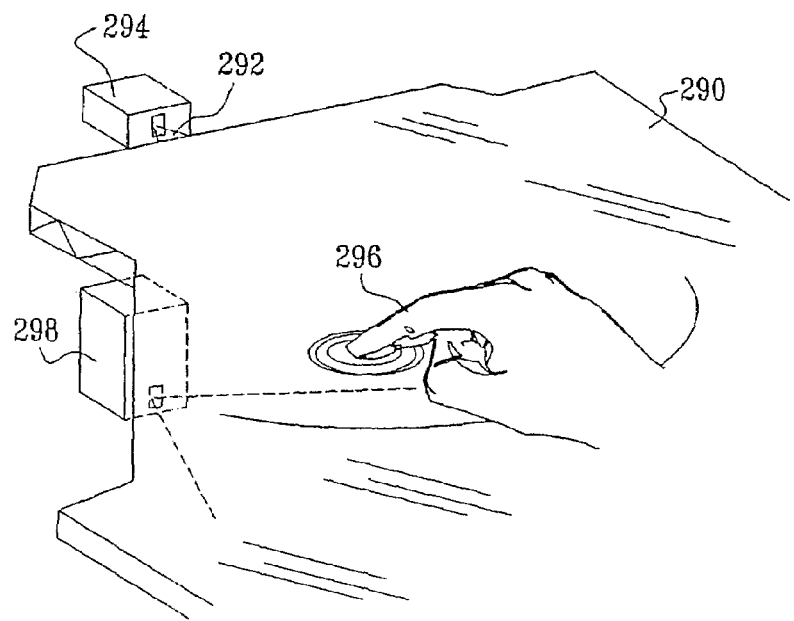
FIGS. 10A and 10B are respective pictorial and side view simplified illustrations of a data entry object engagement location sensing subsystem employing a transparent data entry object engagement surface exhibiting total internal reflection, constructed and operative in accordance with a preferred embodiment of the present invention.
Figure 10B:
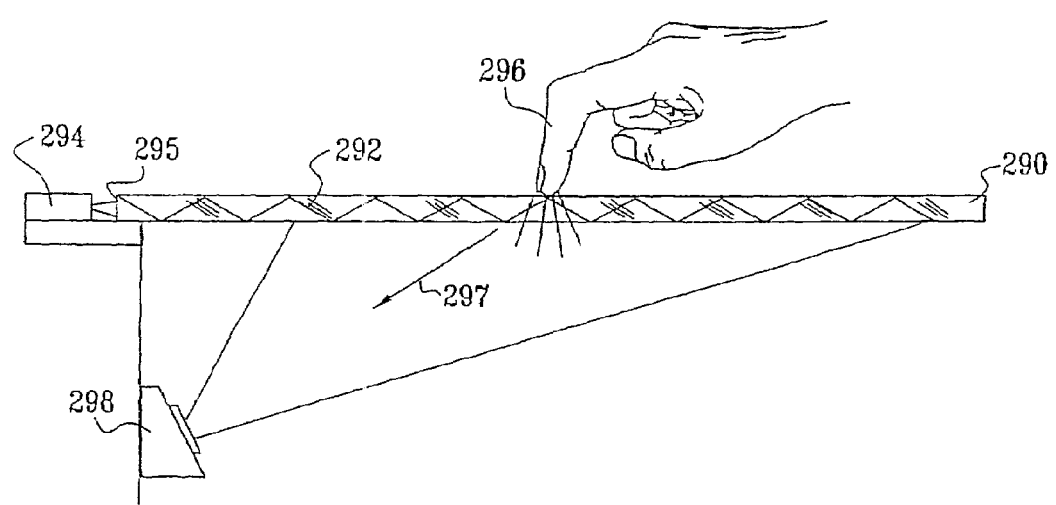

Reference is now made to FIGS. 10A and 10B, which are respective pictorial and side view simplified illustrations of a data entry object engagement location sensing subsystem employing a transparent data entry-object engagement surface 290, exhibiting total internal reflection. A planar beam of light, designated by reference numeral 292, is emitted by an illuminator 294 and coupled to an edge 295 of surface 290 through which beam 292 passes by total internal reflection. As seen particularly in FIG. 10B, the presence of an object, such as a data entry object 296 in contact with surface 290, causes light from beam 292 to be scattered into a scattered beam 297 due to frustrated total internal reflection and inter alia to pass through transparent data entry object engagement surface 290 so as to be detected by a camera 298, which preferably forms part of detection subsystem 112 (FIG. 1).

Figure 11A:
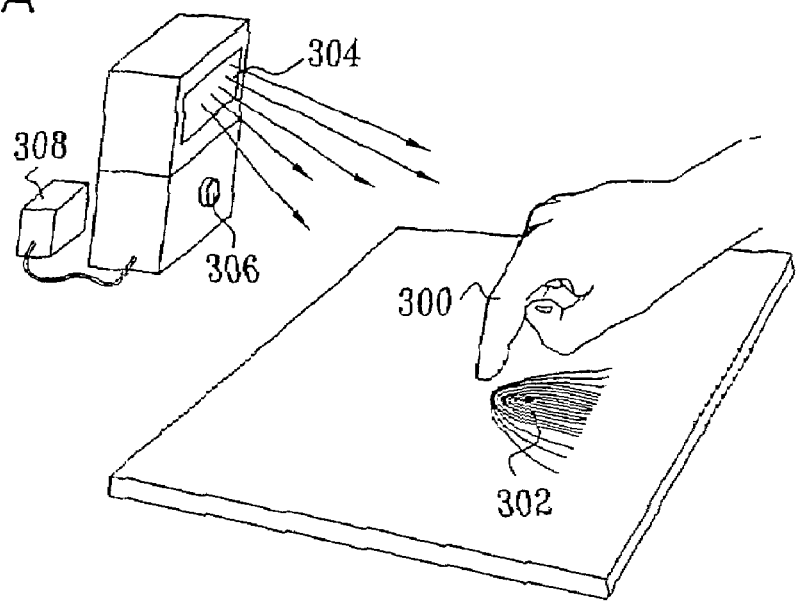
FIGS. 11A and 11B are simplified illustrations of a data entry object engagement location sensing subsystem employing shadow sharpness analysis, constructed and operative in accordance with a preferred embodiment of the present invention.
Figure 11B:
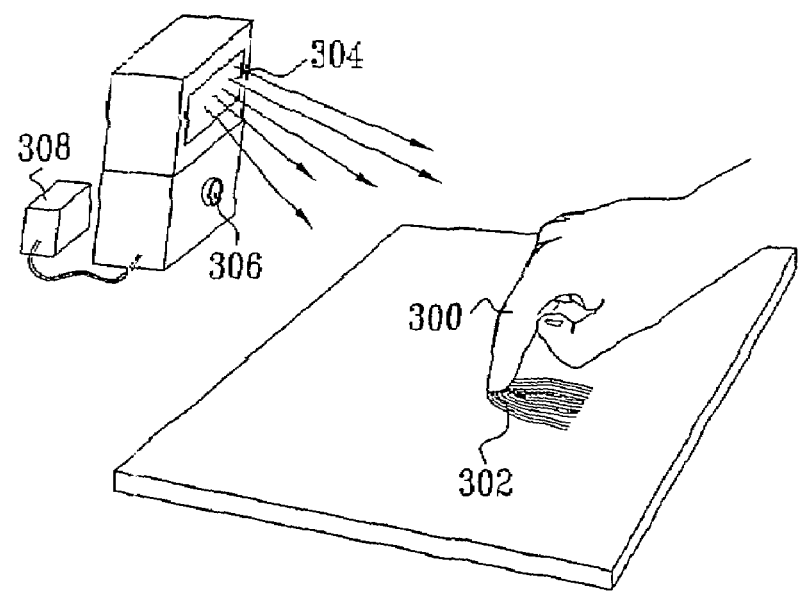

Reference is now made to FIGS. 11A and 11B, which are a simplified illustration of a data entry object engagement location sensing subsystem, forming part of detection subsystem 112 (FIG. 1) and employing shadow sharpness analysis, constructed and operative in accordance with a preferred embodiment of the present invention. An object, such as a data entry object 300, casts a shadow 302 on a projection surface 104 (FIG. 1) when illuminated by a light source 304. A camera 306 senses the shadow and a shadow density analyzer 308, determines the optical density of the shadow, which indicates the propinquity of the data entry object 300 to projection surface 104.

Figure 12A:
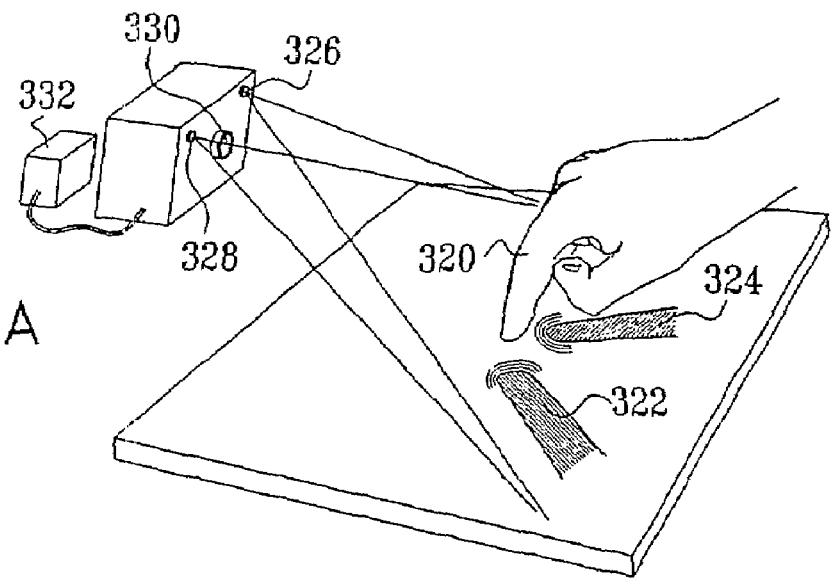
FIGS. 12A and 12B are simplified illustrations of a data entry object engagement location sensing subsystem employing shadow coalescence sensing, constructed and operative in accordance with a preferred embodiment of the present invention.
Figure 12B:
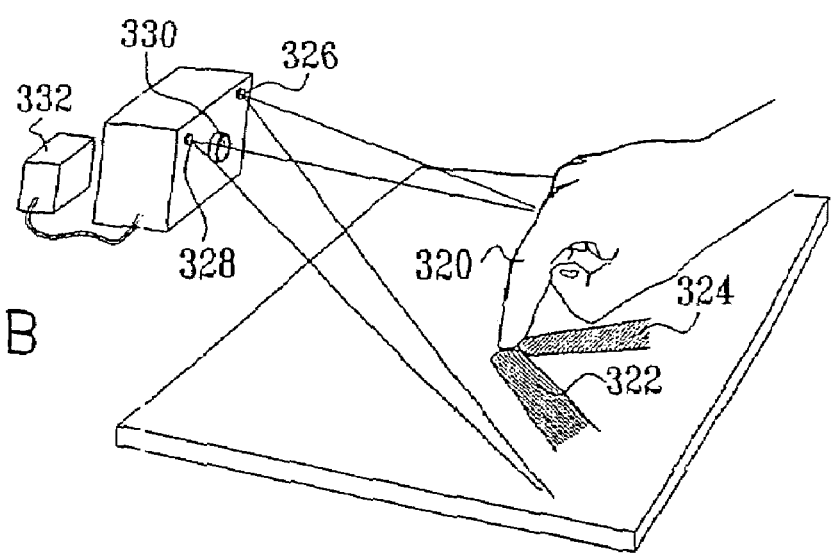

Reference is now made to FIGS. 12A and 12B, which are simplified illustrations of a data entry object engagement location sensing subsystem forming part of detection subsystem 112 (FIG. 1) and employing shadow coalescence sensing. An object, such as a data entry object 320, casts shadows 322 and 324 on a projection surface 104 (FIG. 1) when illuminated by a pair of infrared point light sources 326 and 328, such as LEDs. A camera 330 senses the shadows 322 and 324 and a shadow coalescence sensor 332 determines the extent of overlap or the separation between the shadows 322 and 324, which indicates the propinquity of the data entry object 320 to projection surface 104.

Figure 13A:
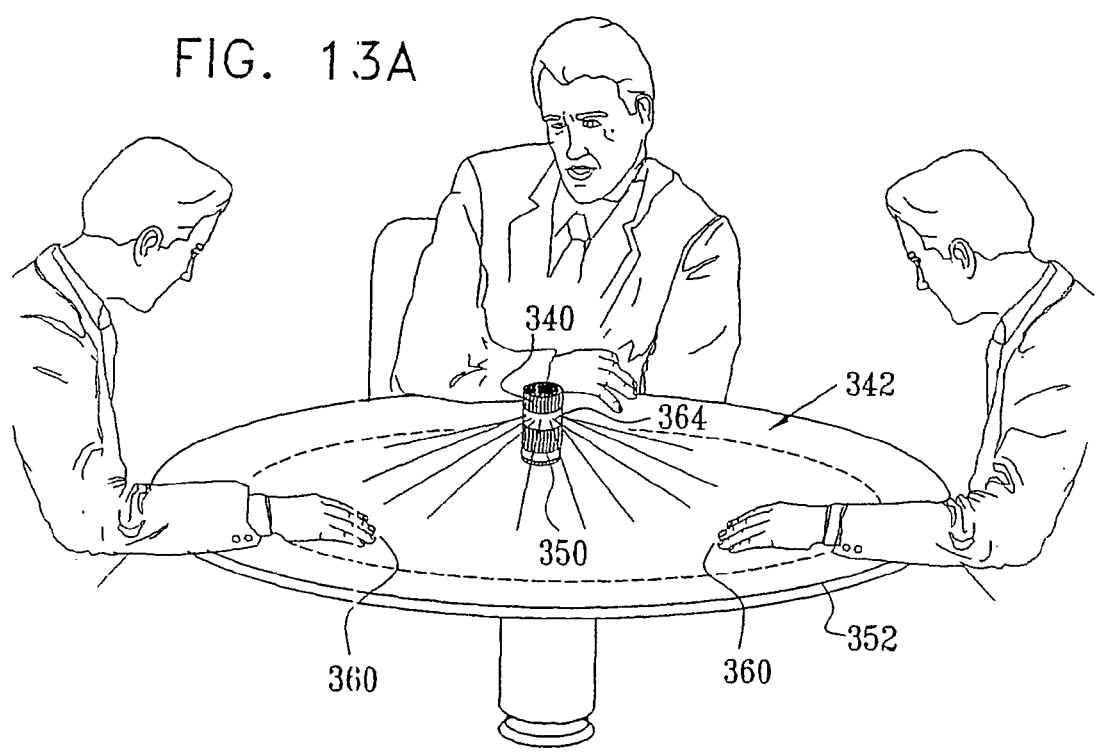
FIGS. 13A and 13B are simplified illustrations of a data entry object engagement location sensing subsystem having a 360 degree detection range, constructed and operative in accordance with a preferred embodiment of the present invention.
Figure 13B:
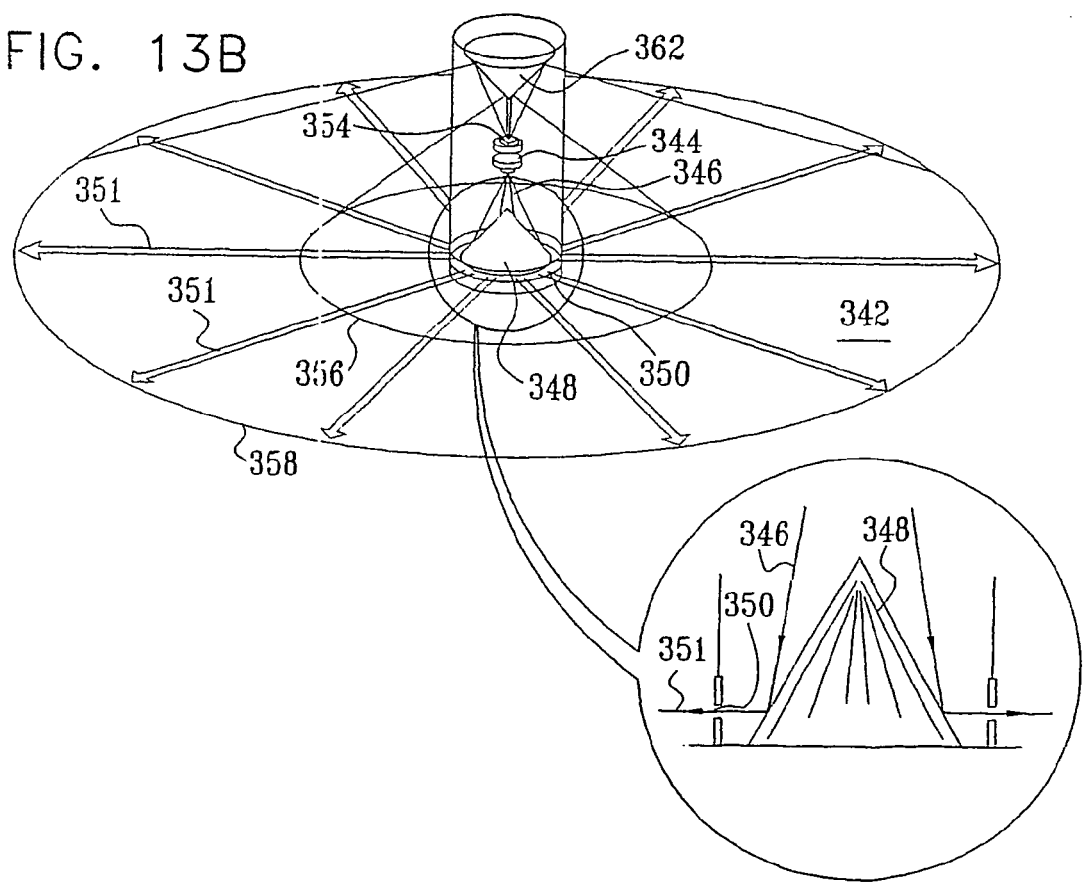

Reference is now made to FIGS. 13A and 13B, which are simplified illustrations of a data entry object engagement location sensing subsystem 340 having a 360 degree annular detection range 342. The data entry object engagement location sensing subsystem 340 of FIG. 13 preferably includes an illuminator 344, such as a diode laser, providing an generally conical output beam 346 which impinges on a generally conical mirror 348, which provides via an annular window 350, a generally planar, radially directed illumination beam 351, generally parallel to the projection surface 104 (FIG. 1), such as a table top 352. A camera 354 views a generally annular range 342 defined between virtual circles 356 and 358 on table top 352 and senses light scattered by objects, such as data entry object tips 360. Preferably, the scattered light is received by camera 354 via a conical mirror 362 and via an annular window 364.

Figure 14A:
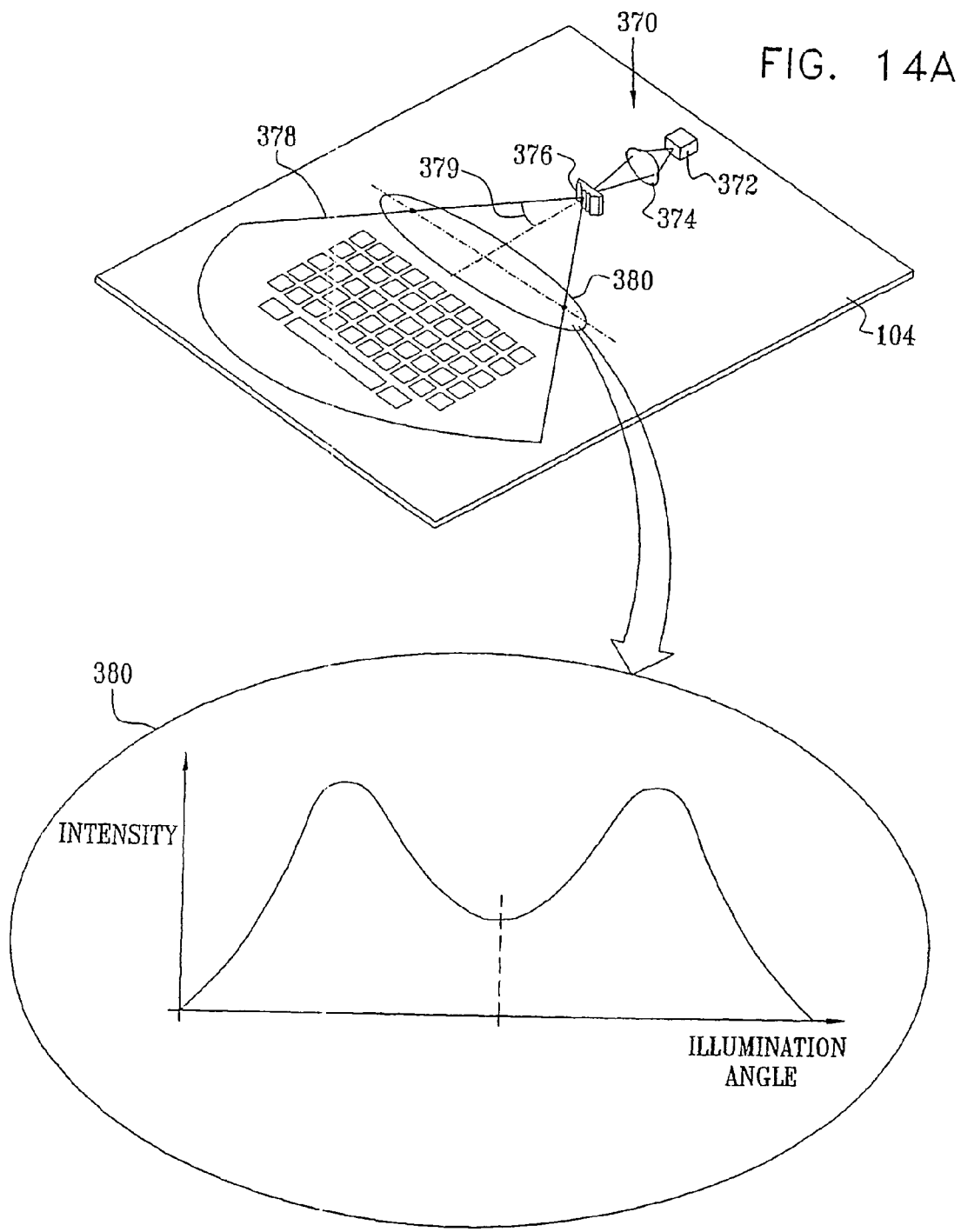
FIG. 14A is a simplified illustration of an illumination subsystem including an illuminator which provides desired non-uniform illumination intensity and employing an aspheric element, constructed and operative in accordance with a preferred embodiment of the present invention.

Reference is now made to FIG. 14A, which is a simplified illustration of an illumination subsystem 106 (FIG. 1) including an illuminator 370, preferably including a diode laser light source 372, a collimating lens 374 and an aspheric element 376, such as an aspheric cylindrical lens, receiving light from the light source 372 via the collimating lens 374. The aspheric element 376 preferably directs light in a radially directed illumination pattern 378, which preferably extends in a plane generally parallel to the projection surface 104 (FIG. 1). It is appreciated that the radially directed illumination pattern 378 has a very narrow spread in the direction generally perpendicular to the projection surface 104. It is further appreciated that the radially directed illumination pattern 378 is preferably located very close to the projection surface 104.

The illumination subsystem of FIG. 14A provides the desired spatially non-uniform illumination intensity pattern 378, wherein the intensity varies as a function of the illumination angle 379, as seen for example, at graph 380. It is noted that greater illumination intensity is provided at large illumination angles in order to compensate for the non-uniform detection effects at the large viewing angles. These non-uniform detection effects include the reduction of the effective angular cross-section of the data entry object 110 (FIG. 1) and the reduced light collection efficiency of the lens on the camera in the detection subsystem 112 (FIG. 1).

Reference is now made to FIG. 14B, which is a simplified illustration of the illumination subsystem 106 (FIG. 1) including an illuminator 390, preferably including a diode laser light source 392, a collimating lens 394 and an diffractive optical element 396, receiving light from the light source 392 via the collimating lens 394. The diffractive optical element 396 preferably directs light in a radially directed illumination pattern 398, which preferably extends in a plane generally parallel to the projection surface 104 (FIG. 1). It is appreciated that the radially directed illumination pattern 398 has a very narrow spread in the direction generally perpendicular to the projection surface 104. It is further appreciated that the radially directed illumination pattern 398 is preferably located very close to the projection surface 104.

The illumination subsystem of FIG. 14B, provides the desired spatially non-uniform illumination intensity pattern 398, wherein the intensity varies as a function of the illumination angle 399, as seen for example, at graph 400. It is noted that greater illumination intensity is provided at large illumination angles in order to compensate for the non-uniform detection effects at the large viewing angles. These non-uniform detection effects include the reduction of the effective angular cross-section of the data entry object 110 (FIG. 1) and the reduced light collection efficiency of the lens on the camera in the detection subsystem 112 (FIG. 1).

Figure 14C:
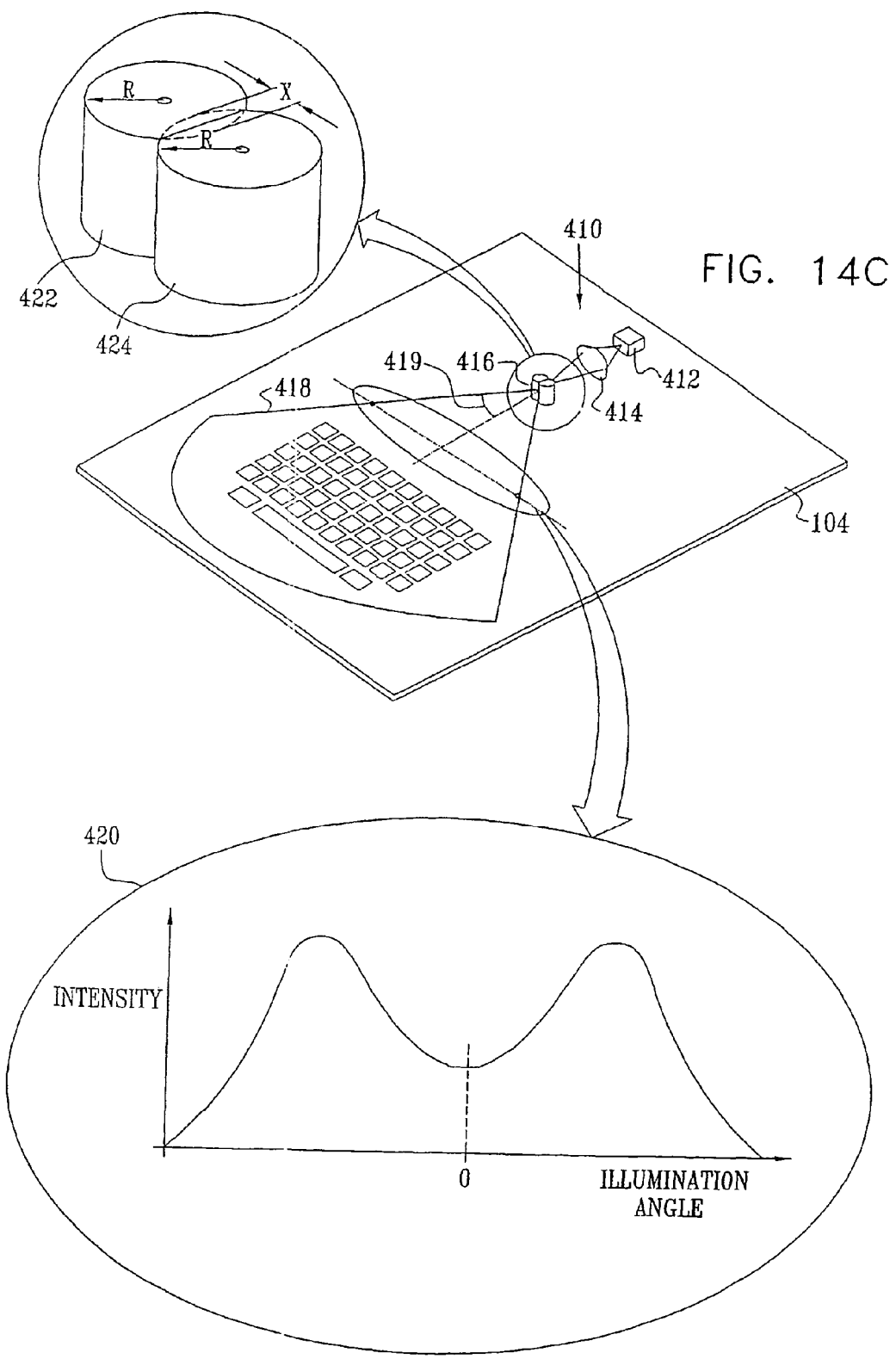
FIG. 14C is a simplified illustration of an illumination subsystem including an illuminator which provides desired non-uniform illumination intensity and employing a combination of cylindrical lenses, constructed and operative in accordance with a preferred embodiment of the present invention.

Reference is now made to FIG. 14C, which is a simplified illustration of the illumination subsystem 106 (FIG. 1) including an illuminator 410, preferably including a diode laser light source 412, a collimating lens 414 and a joined double side-truncated rod lens optical element 416, receiving light from the light source 412 via the collimating lens 414. The optical element 416 preferably directs light in a radially directed illumination pattern 418, which preferably extends in a plane generally parallel to the projection surface 104 (FIG. 1). It is appreciated that the radially directed illumination pattern 418 has a very narrow spread in the direction generally perpendicular to the projection surface 104. It is further appreciated that the radially directed illumination pattern 418 is preferably located very close to the projection surface 104.

The illumination subsystem of FIG. 14C provides the desired spatially non-uniform illumination intensity pattern 418, wherein the intensity varies as a function of the illumination angle 419, as seen for example, at graph 420. It is noted that greater illumination intensity is provided at large illumination angles in order to compensate for the non-uniform detection effects at the large viewing angles. These non-uniform detection effects include the reduction of the effective angular cross-section of the data entry object 110 (FIG. 1) and the reduced light collection efficiency of the lens on the camera in the detection subsystem 112 (FIG. 1).

The precise illumination distribution may be selected by suitable variation of the radii R of the side-truncated rod lenses 422 and 424 and the extent X of their mutual side truncation.

Figure 15A:
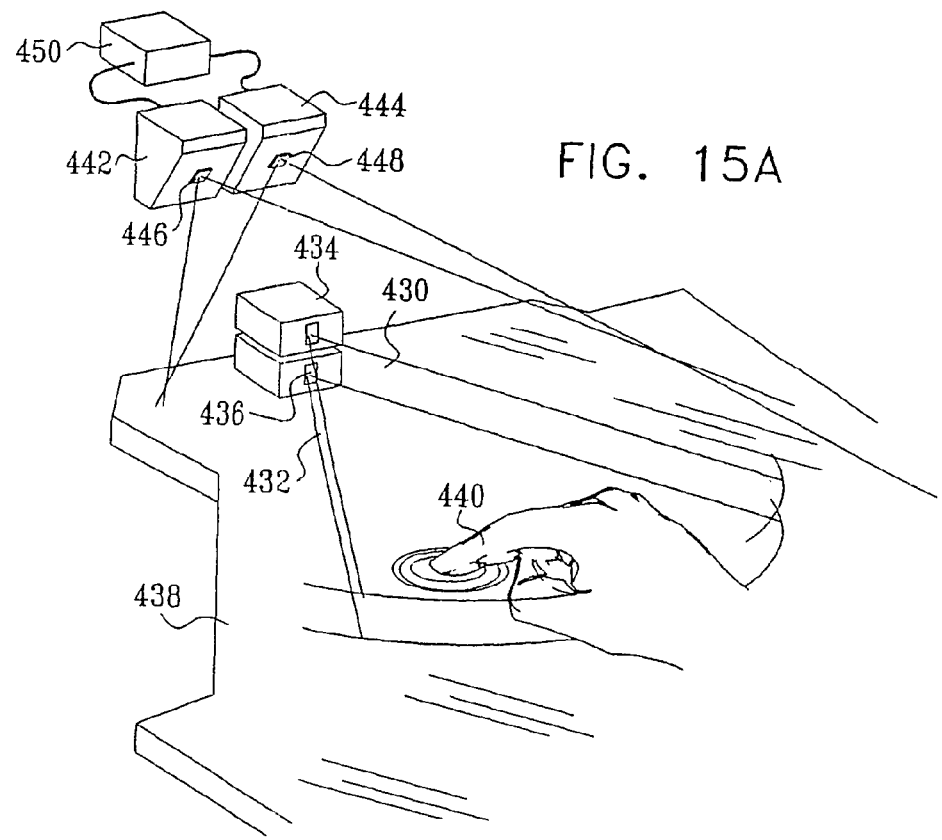
FIGS. 15A and 15B are respective simplified pictorial and side view illustrations of a data entry object engagement location sensing subsystem including a data entry object engagement speed sensor having plural illumination and detection planes and employing plural illuminators and sensors, constructed and operative in accordance with a preferred embodiment of the present invention.
Figure 15B:
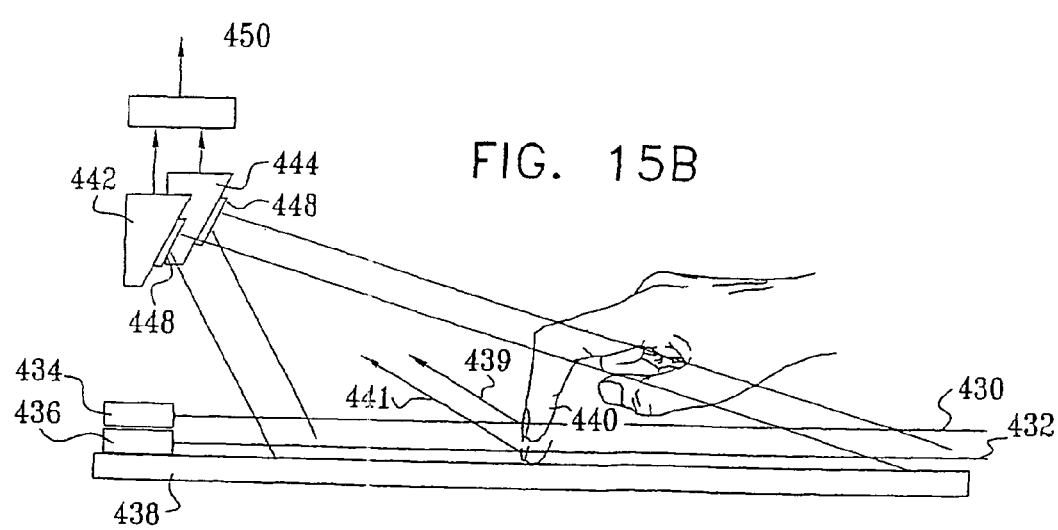

Reference is now made to FIGS. 15A and 15B, which are respective simplified pictorial and sectional illustrations of a data entry object engagement location sensing subsystem including a data entry object engagement speed sensor having plural illumination and detection planes and employing plural illuminators and sensors, constructed and operative in accordance with a preferred embodiment of the present invention.

As seen in FIGS. 15A and 15B, first and second generally flat mutually spaced and overlying planar beams of light of differing wavelengths, designated respectively by reference numeral 430 and 432, are preferably emitted by respective illuminators 434 and 436 generally parallel to and spaced from a data entry object engagement surface 438. As seen particularly in FIG. 15B, the presence of an object, such as a data entry object 440 in beams 430 and 432, causes light from the respective beams to be scattered into scattered beams 439 and 441 and to be detected by respective cameras 442 and 444, which have detection wavelengths corresponding to those of beams 430 and 432 respectively. The cameras may be equipped with suitable filters 446 and 448 for this purpose. Illuminators 434 and 436 form part of illumination subsystem 106 (FIG. 1) while cameras 442 and 444 form part of detection subsystem 112 (FIG. 1).

The data entry object engagement location sensing subsystem of FIGS. 15A and 15B also includes a timing analyzer 450, which receives outputs from cameras 442 and 444 and determines from the timing thereof, the speed of engagement of the data entry object with data entry object engagement surface 438. The speed of engagement of the data entry object with data entry object engagement surface 438 may be employed in various applications, such as musical instruments and games.

Figure 16A:
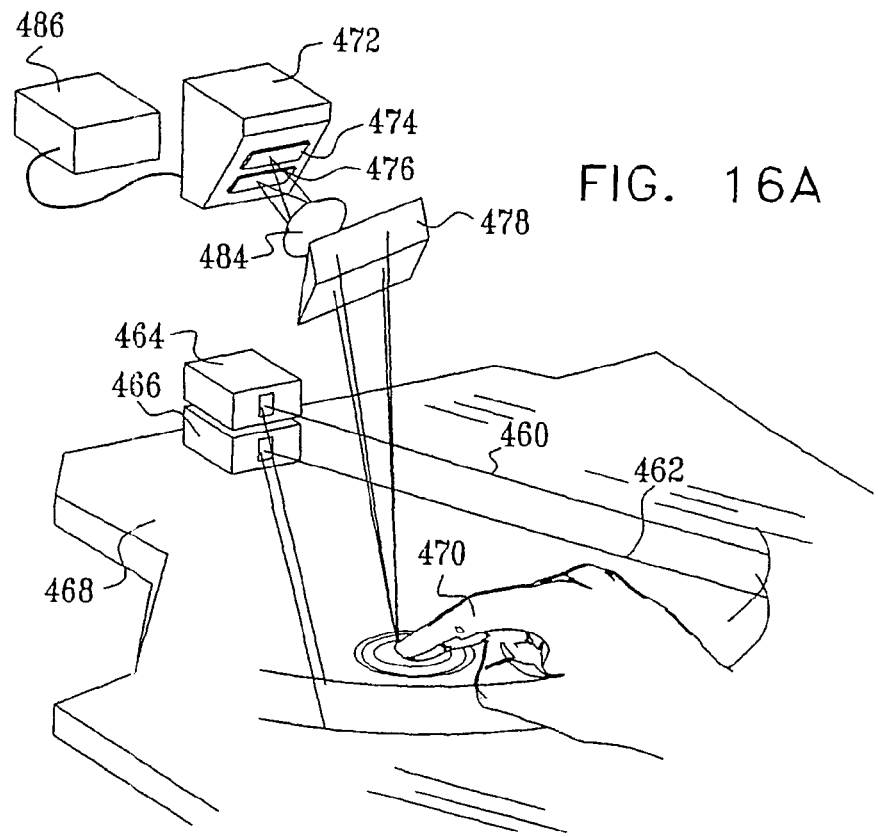
FIGS. 16A and 16B are respective simplified pictorial and sectional illustrations of a data entry object engagement location sensing subsystem including a data entry object engagement speed sensor having plural illumination and detection planes and employing plural illuminators and a single sensor, constructed and operative in accordance with a preferred embodiment of the present invention.
Figure 16B:
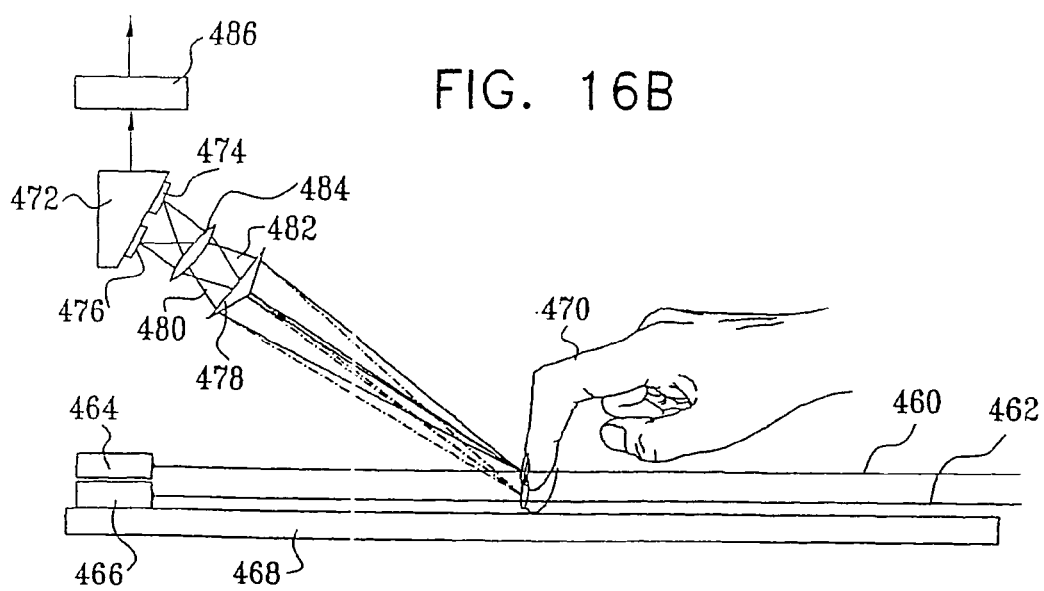

Reference is now made to FIGS. 16A and 16B, which are respective simplified pictorial and sectional illustrations of a data entry object engagement location sensing subsystem including a data entry object engagement speed sensor having plural illumination and detection planes and employing plural illuminators and a single sensor, constructed and operative in accordance with a preferred embodiment of the present invention.

As seen in FIGS. 16A and 16B, first and second generally flat planar mutually spaced and overlying beams of light of differing wavelengths, designated respectively by reference numeral 460 and 462, are preferably emitted by respective illuminators 464 and 466 generally parallel to and spaced from a data entry object engagement surface 468. As seen particularly in FIG. 16B, the presence of an object, such as a data entry object 470 in beams 460 and 462, causes light from the respective beams to be scattered and to be detected by a camera 472, having first and second detection regions 474 and 476, which have detection wavelengths corresponding to those of beams 460 and 462 respectively. The detection regions of camera 472 are preferably defined by suitable filters to provide desired wavelength differentiation. Illuminators 464 and 466 form part of illumination subsystem 106 (FIG. 1) while, camera 472 forms part of detection subsystem 112 (FIG. 1).

Light scattered by data entry object 470 from beams 460 and 462 is preferably refracted by a prism 478 and is split into two beams 480 and 482 which are imaged by a lens 484 onto the two detection regions 474 and 476.

The data entry object engagement location sensing subsystem of FIGS. 16A and 16B also includes a timing analyzer 486, which receives outputs from camera 472 and determines from the timing thereof, the speed of engagement of the data entry object 470 with data entry object engagement surface 468. The speed of engagement of the data entry object with data entry object engagement surface 468 may be employed in various applications, such as musical instruments and games.

Figure 17A:
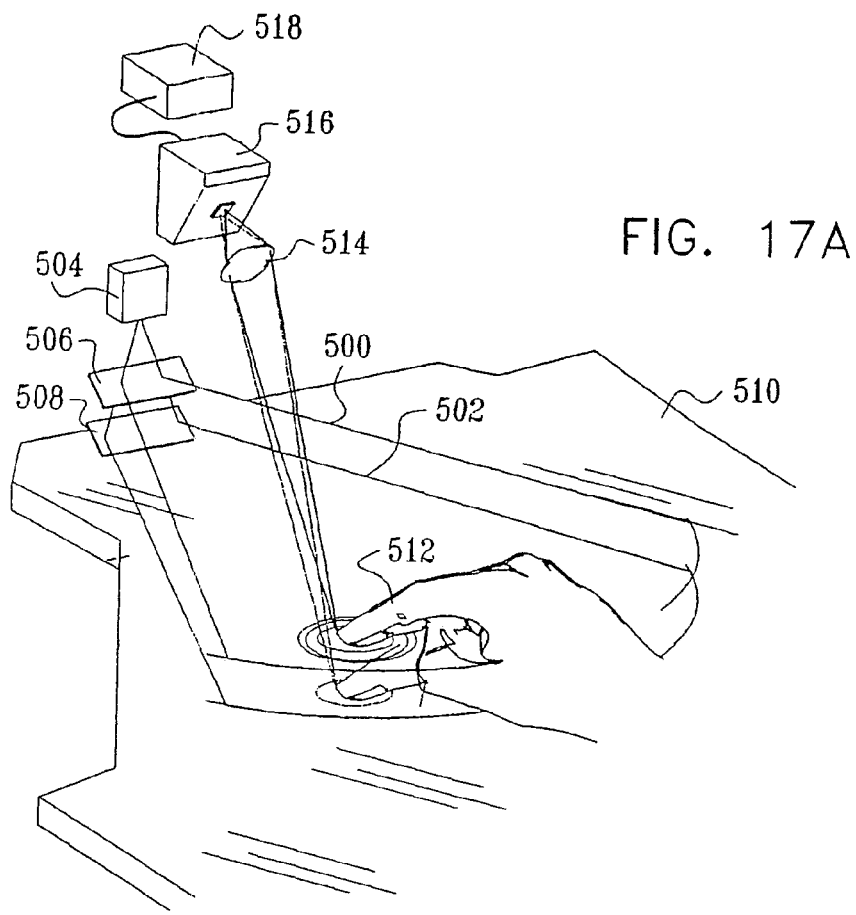
FIGS. 17A and 17B are respective simplified pictorial and sectional illustrations of a data entry object engagement location sensing subsystem including a data entry object engagement speed sensor having plural illumination and detection planes and employing a single illuminator and a single sensor, constructed and operative in accordance with a preferred embodiment of the present invention.
Figure 17B:
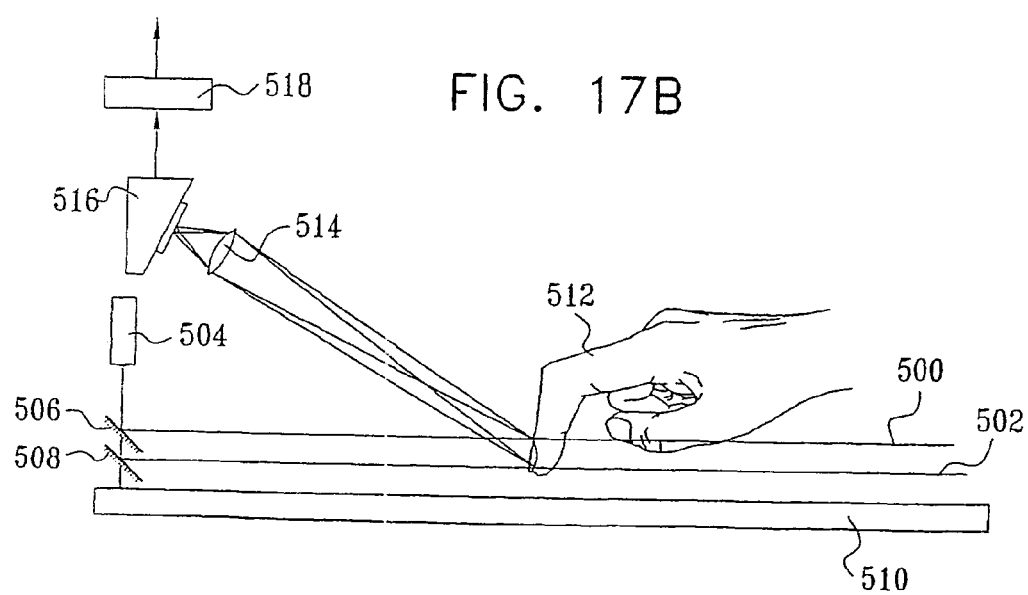

Reference is now made to FIGS. 17A and 17B, which are respective simplified pictorial and sectional illustrations of a data entry object engagement location sensing subsystem including a data entry object engagement speed sensor having plural illumination and detection planes and employing a single illuminator and a single sensor, constructed and operative in accordance with a preferred embodiment of the present invention.

As seen in FIGS. 17A and 17B, first and second generally flat mutually spaced and overlying planar beams of light, designated respectively by reference numeral 500 and 502, are preferably emitted by an illuminator 504 which outputs via a beam splitter 506 and a mirror 508. Beams 500 and 502 are generally parallel to and spaced from a data entry object engagement surface 510. As seen particularly in FIG. 17B, the presence of an object, such as a data entry object 512 in beams 500 and 502, causes light from the respective beams to be scattered and to be imaged by a lens 514 into a camera 516. Illuminator 504 forms part of illumination subsystem 106 (FIG. 1) while camera 516 forms part of detection subsystem 112 (FIG. 1).

The data entry object engagement location sensing subsystem of FIGS. 17A and 17B also includes an intensity timing analyzer 518, which receives an output from cameras 516 and determines from the timing of a stepwise increase in detected light intensity thereat, the speed of engagement of the data entry object with data entry object engagement surface 510. The speed of engagement of the data entry object with data entry object engagement surface 510 may be employed in various applications, such as musical instruments and games.

Figure 18:
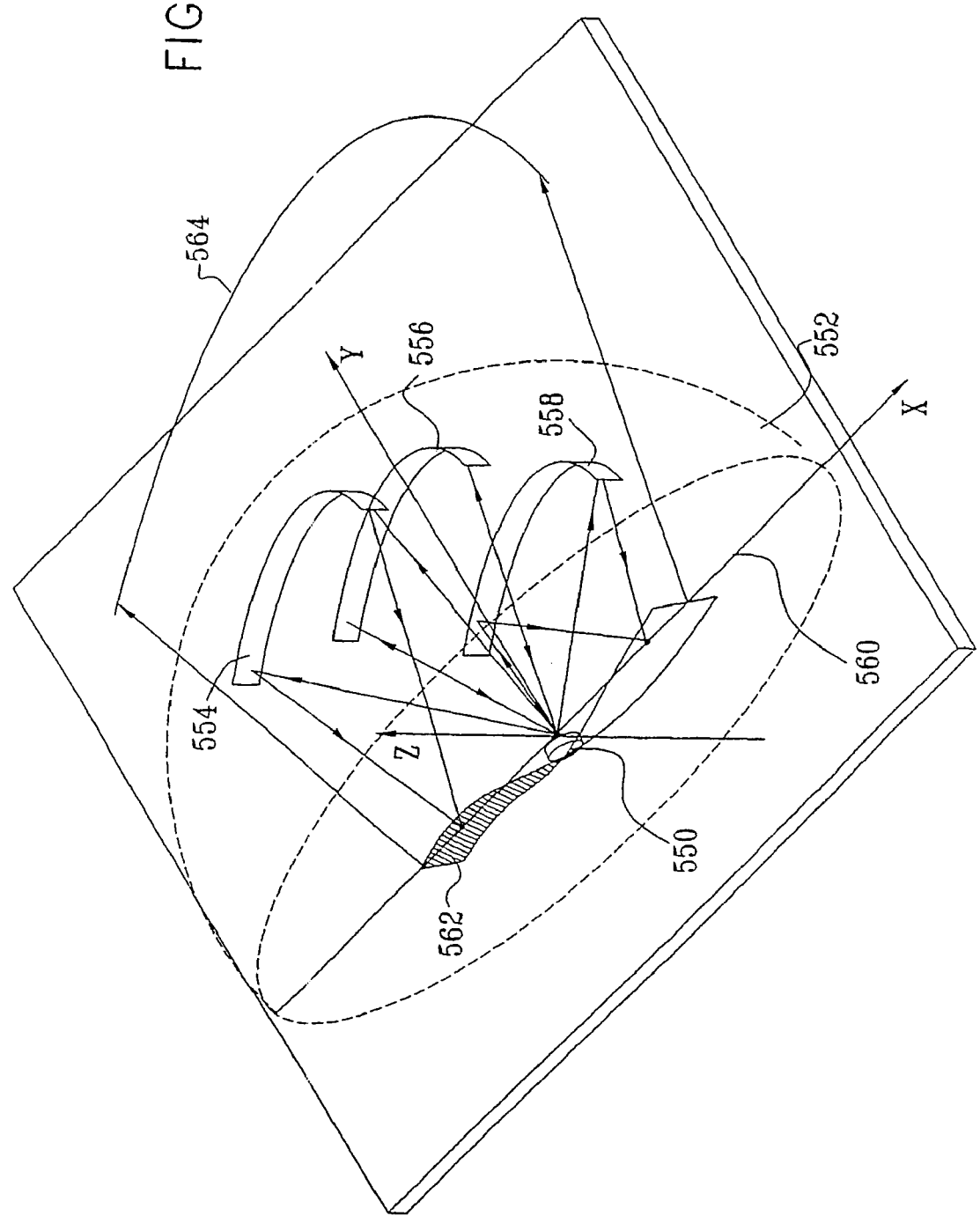
FIG. 18 is a simplified illustration of an illuminator useful in a data entry object engagement location sensing subsystem and employing aspheric reflectors, constructed and operative in accordance with a preferred embodiment of the present invention.

Reference is now made to FIG. 18, which is a simplified illustration of an illuminator useful in a data entry object engagement location sensing subsystem and employing aspheric reflectors, constructed and operative in accordance with a preferred embodiment of the present invention. It is appreciated that the illuminator of FIG. 18 of the present invention directs light, which is emitted from a point source through a large solid angle, into a flat radially directed beam extending along an engagement plane. The beam has a very narrow spread in a direction perpendicular to the projection surface 104 (FIG. 1).

As seen in FIG. 18, a point light source 550, such as an LED, emits light through a generally semi-hemispherical volume denoted by reference numeral 552. An aspheric reflector, strips of which are designated by reference numerals 554, 556 and 558, reflects the light emitted by the point light source 550 along a line 560, which typically passes through the light source 550. In a preferred embodiment of the present invention, the aspherical reflector may be constructed from strips of a spherical minor whose centers have been offset from each other along the line 560. The aspheric reflector thus reflects light from different elevations so that the reflected light passes through line 560 at differing locations therealong.

A twisted elongate mirror 562, preferably arranged along line 560, reflects the light passing through line 560 at various elevation angles as a planar flat beam, denoted by reference numeral 564. Beam 564 typically lies in a plane, which extends through line 560 and traverses a slit, not shown, appropriately positioned in the aspheric reflector.

Figure 19:
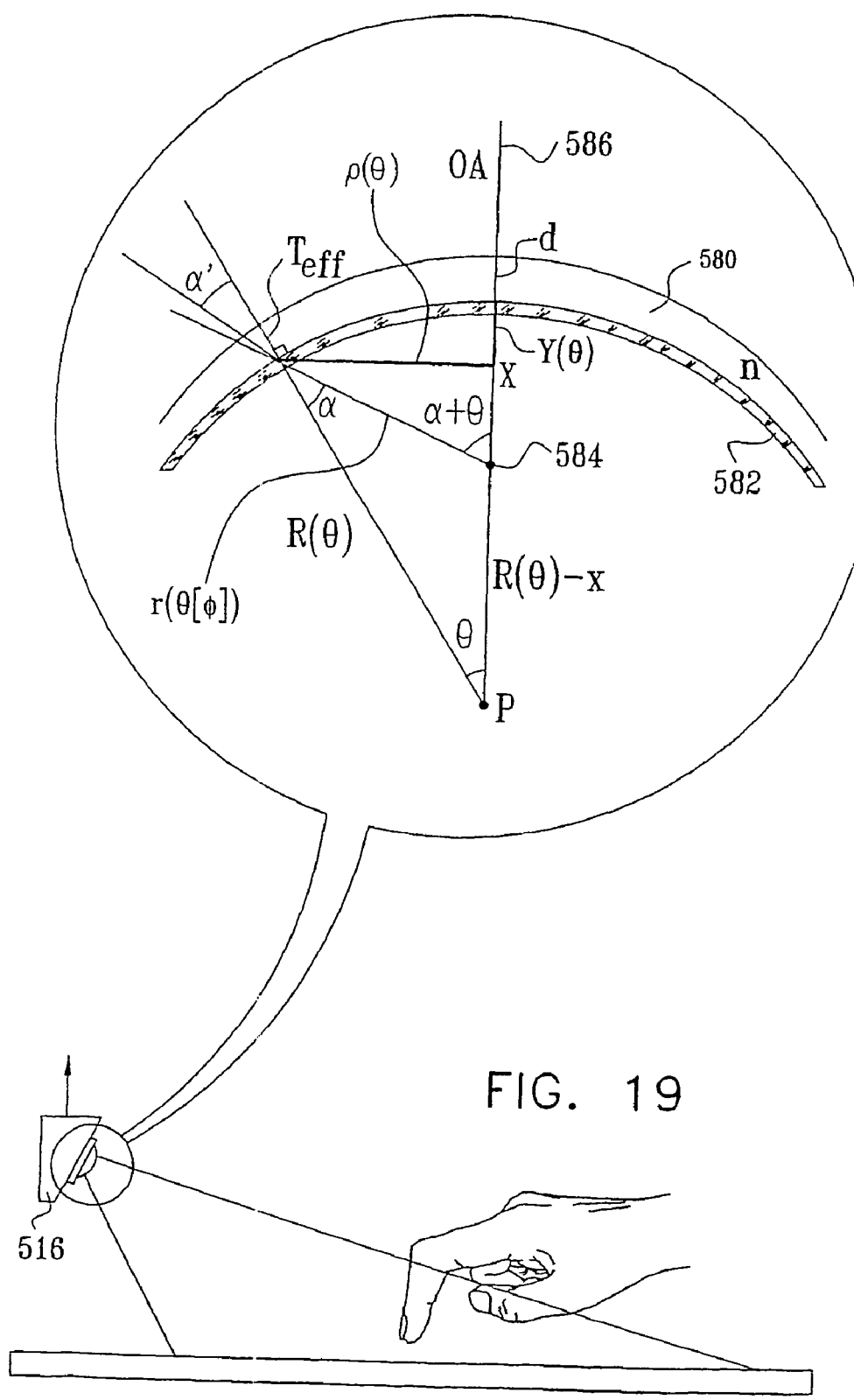
FIG. 19 is a simplified illustration of a angle-compensated interference filter employed in a data entry object engagement location sensing subsystem, constructed and operative in accordance with a preferred embodiment of the present invention.

Reference is now made to FIG. 19, which is a simplified illustration of an angle-compensated interference filter employed in a data entry object engagement location sensing subsystem, constructed and operative in accordance with a preferred embodiment of the present invention. The filter of FIG. 19 is useful in the present invention, for example as filter 446 and 448 in FIGS. 15A and 15B and filters 474 and 476 in FIGS. 16A and 16B.

As seen in FIG. 19, in an exaggerated form which is not drawn to scale for the purposes of clarity, a plurality of thin films, collectively designated by reference numeral 580, each being of non-uniform thickness are formed onto a dome shaped curved transparent substrate 582, which need not be spherical, to define an interference filter. The thickness of the thin films 580 is selected to vary over the substrate 582 such that the thickness of the thin films 580 traversed by every light beam impinging onto a given point 584 located along an axis of symmetry 586 of substrate 582 is identical irrespective of the angular relationship between the light beam and the axis of symmetry 586 (OA in FIG. 19). The imaging lens of a camera, such as camera 516 (FIG. 17A), is located at point 584.

Therefore, the intensity of the light beam reaching the camera 516 is independent of the location of the keystroke, which is being engaged by data entry object 512.

A preferred technique for the construction of the interference filter of FIG. 19, by using methods, such as film evaporation, is set forth hereinbelow with reference to FIG. 19.

According to Snell's Law:

$$\text{Sin}(\alpha) = n \cdot \text{Sin}(\alpha') \tag{1}$$

where α is the local incidence angle at the filter's surface of a ray that will eventually reach point o; α' is the local effective refraction angle at the filter's surface and n is the effective refractive index of the filter coating Typically, in a first approximation, the optical axis of the dome shaped substrate 582 is in the direction of the evaporated material, which is preferably used for manufacturing the interference filter. Additionally, in a first approximation, the flow of evaporated material on to the dome is in a direction, which is typically perpendicular to the small region of the dome to which the material is being applied.

Thus, from mass conservation of the coating process, the thickness of the filter material in a direction θ, is given by:

$$t(\theta) = t \cdot \text{Cos}(\theta) \tag{2}$$

Thus, the length of a refracted ray, through the filter 582, is given by:

$$d(\theta) = t(\theta)/\text{Cos}(\alpha'),$$

where θ is the deflection angle between the normal to the filter at the point of incidence and the axis of symmetry 586 and t(θ) is the local thickness of the filter.

If the thickness of the filter is equal in all directions (eqi-filtering), then $$d(\theta) = t$$

and $$\text{Cos}(\theta) = \text{Cos}(\alpha') \text{ or } \theta = \alpha' \tag{3}$$

where d(θ) is the local path distance in the filter along the refracted ray.

Therefore, equation (1) becomes:

$$\text{Sin}(\alpha) = n \cdot \text{Sin}(\theta) \tag{4}$$

Using known trigonometrical relationships, equation (1) may be written as:

$$\text{Cos}(\alpha) = \sqrt{1 - n^2 \cdot \text{Sin}^2(\theta)} \tag{5}$$

As is known in the art, there are typically an infinite number of solutions, to equation (5), for the geometry of the dome 582. Preferably, one solution may be for the case for a typical light ray hitting the dome at angle α and defining a certain point P. The distance along the optical axis from point P to the dome is given by R(θ).

According to the Sine Rule:

$$\frac{R(\theta) - X}{R(\theta)} = \frac{\text{Sin}(\alpha)}{\text{Sin}(\alpha + \theta)} \tag{6}$$

and $$\frac{r(\theta)}{\text{Sin}(\theta)} = \frac{R(\theta)}{\text{Sin}(\alpha + \theta)} \tag{7}$$

where R(θ) is the distance along the local normal to the filter between the filter and point P;

φ(θ) is the local deflection angle, such that φ=α+θ;

X is a distance between the point 584 and the filter 582 in the direction of OA;

r(θ) is the distance between point 584 and the local incidence point on the filter 582;

After substituting: equations (4) and (5) into equations (6) and (7), the following relationship may be obtained:

$$\frac{R(\theta) - X}{R(\theta)} = \frac{1}{\text{Cos}(\theta) + \left(\frac{1 - n^2 \cdot \text{Sin}^2(\theta)}{n^2}\right)^{1/2}} = f(\theta) \tag{8}$$

and $$r(\theta) = \frac{f(\theta)}{1-f(\theta)} \cdot \frac{X}{n} \quad (9)$$

For small values of θ, $f(\theta) \cong n/(n+1)$.
Thus, the length X may be selected so that $$X \approx R_{eq}/(n+1)$$

Where $R_{eq}$ is some equivalent radius that is approximately equal to the radius of the dome.

For a specific deflection angle φ, the following equation may be solved:

$$\phi = \theta + \alpha = \theta + \sin^{-1}(n \sin(\theta))$$

and θ=θ[φ] may be determined.
Therefore, the aspheric dome can be described by:

$$\rho(\phi) = \sin(\phi) \cdot r(\theta[\phi]) \text{ and} \quad (10)$$

$$Y(\phi) = X - \cos(\phi) \cdot r(\theta[\phi]) \quad (11)$$

where ρ(φ) is the distance from the optical axis OA to a point on the dome 582 (as shown in FIG. 19) and Y(φ) is the distance along the optical axis OA ordinate from the vertex of the dome to a point on the dome 582, as shown in FIG. 19.

Thus, a dome 582 may be constructed with a spherical surface of a single radius that closely corresponds to the ideal structure derived above at every point on the surface of the dome 582. It is appreciated that the incidence angle of a ray of light would then deviate slightly from the central wavelength of the interference filter but would remain significantly less than the variation resulting from a conventional interference filter. It also appreciated that if the dome has a low optical power, then the coating could be placed either side of the dome, without significantly changing the optical paths of the light passing through the coatings, which comprise the optical filter.

Figure 20:
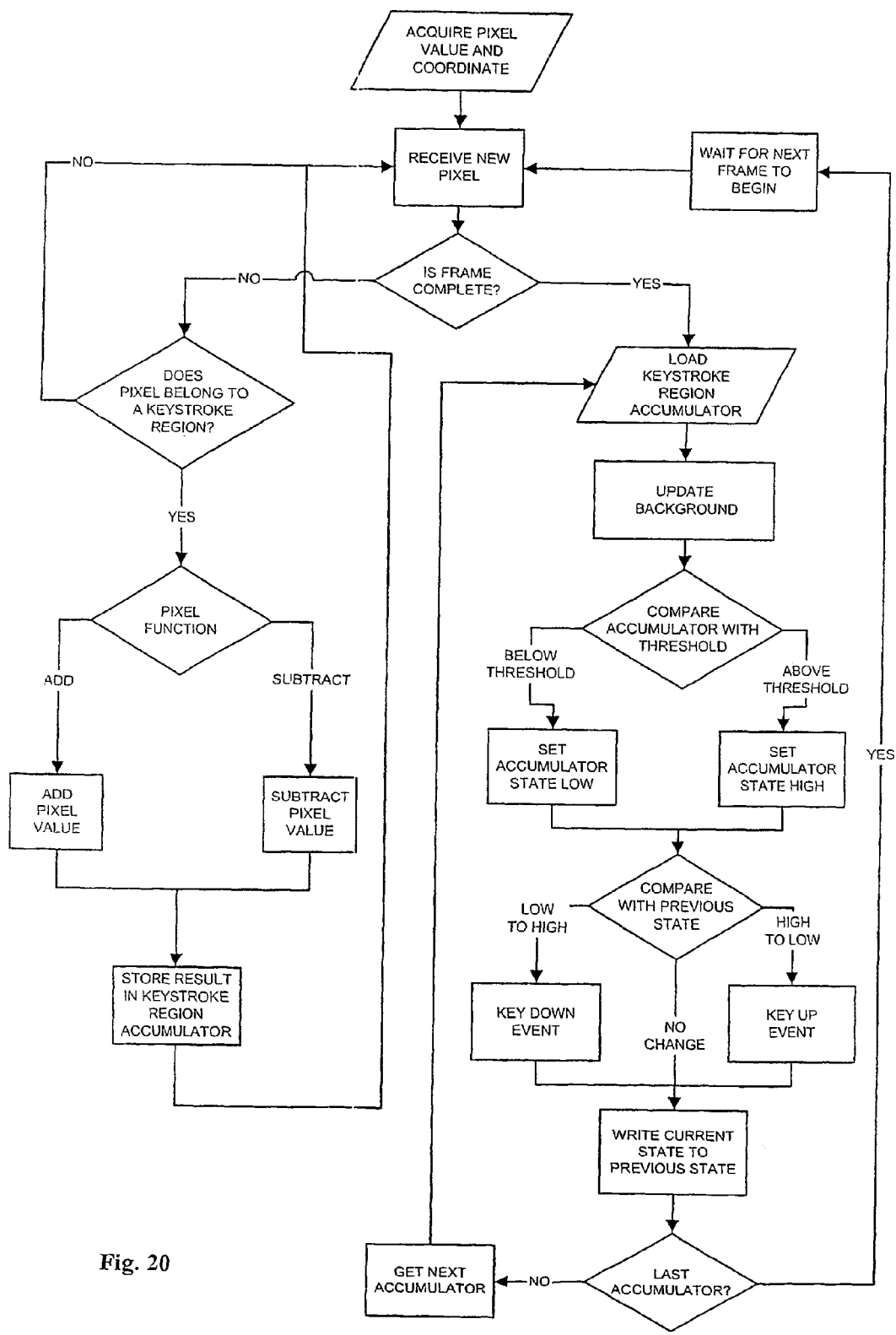
FIG. 20 is a simplified flow chart illustrating operation of a data entry object engagement location sensing subsystem employed in the projection keyboard system and methodology of FIG. 1 in accordance with a preferred embodiment of the present invention.
Figure 21:
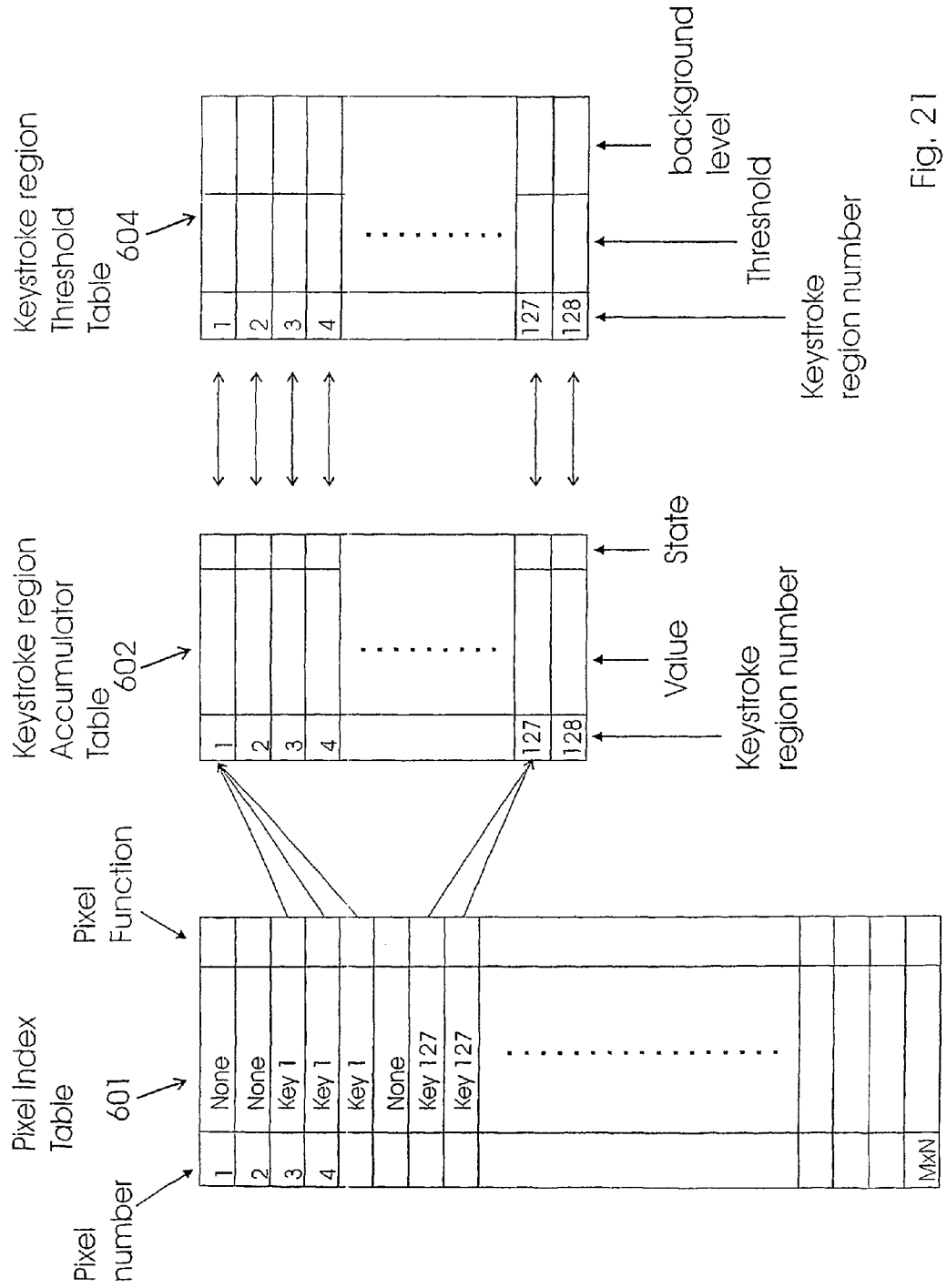
FIG. 21 is a simplified illustration of a preferred data structure employed in the operation of the data entry object engagement location sensing subsystem shown in FIG. 20.

Reference is now made to FIG. 20, a simplified flow chart illustrating operation of a data entry object engagement location sensing subsystem employed in the projection keyboard system and methodology of FIG. 1 in accordance with a preferred embodiment of the present invention and to FIG. 21, which is a simplified illustration of a preferred data structure employed in the operation of the data entry object engagement location sensing subsystem shown in FIG. 20.

FIG. 20 shows a simplified illustration of a preferred data structure employed in the operation of the data entry object engagement location sensing method described hereinbelow with respect to FIG. 21. It is appreciated that the imaging sensor of a camera, such as camera 516 (FIG. 17A), is typically comprised of a set of M×N pixels, wherein a particular group of pixels views a defined region of the engagement plane which preferably overlies the projection surface 104 (FIG. 1). Thus, it is possible that a particular pixel group, located in the image plane of the camera 516 may receive scattered light from a data entry object 512 engaging the key location 113.

Thus, as the camera 516 views the projection surface 104, each of the M×N pixels in the image plane of the camera 516 may receive light from a corresponding region in the engagement plane in respect of a data entry object engagement therewith.

Figure 22:
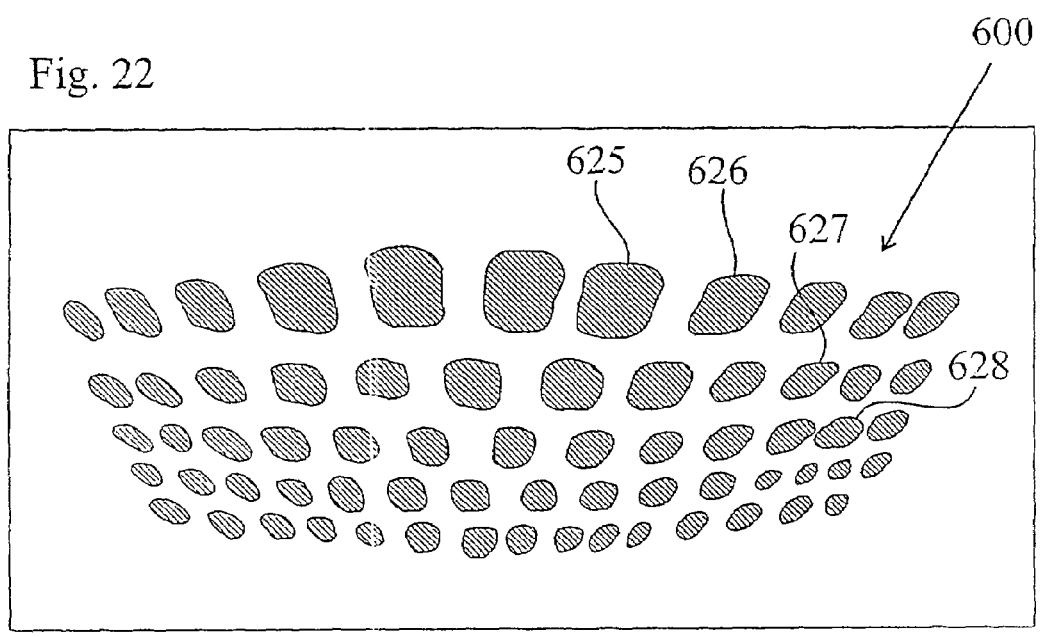
FIG. 22 is amplified pictorial illustration of outlines of typical keystroke regions as sensed by a two-dimensional image sensor viewing a keyboard, such as the keyboard seen in FIG. 5A.

Thus, as each pixel value is acquired, a determination is made, using the pixel coordinates, as to whether that pixel lies within a predefined keystroke region, such as keystroke regions 600 shown in FIG. 22. This determination is preferably made by employing a pixel index table 601 which indicates for each pixel, whether that pixel lies within a predetermined keystroke region, such as keystroke regions 625, 626, 627 and 628 (FIG. 22), and, if so, within which keystroke region it lies.

As seen in FIGS. 20 and 21, pixel values, such as gray level values, are acquired for various pixel coordinates. As each pixel value is acquired, a determination is made, using the pixel coordinates, as to whether that pixel lies within a predefined keystroke region (FIG. 22). This determination is preferably made by employing a pixel index table 601 which indicates for each pixel, whether that pixel lies within a predetermined keystroke region and, if so, within which keystroke region it lies.

The function of the pixel within the keystroke region in which it lies is then determined, preferably by employing table 601. This function is typically additive or subtractive, but may alternatively have another function. Typically, depending on the function, the pixel value is added to or subtracted from a pixel total maintained for each keystroke region in a keystroke region accumulator table 602.

Once all of the pixels in a frame have been processed as aforesaid, an updated background level is determined for the frame and a key actuation threshold is determined typically by subtracting the updated background level from a predetermined threshold level which is established for each keystroke region. This is preferably carried out by employing a keystroke region threshold table 604.

The contents of the keystroke region accumulator table 602 for each keystroke region preferably are then compared with the current key actuation threshold. If the contents of the accumulator table 602 exceed the key actuation threshold for a given key actuation region in a given frame and in the previous frame the contents of the accumulator table 602 did not exceed the key actuation threshold, a key actuation output is provided.

Similarly, if the contents of the accumulator table 602 does not exceed the key actuation threshold for a given key actuation region in a given frame and in the previous frame the contents of the accumulator table 602 did exceed the key actuation threshold, a key deactuation output is provided. In all other cases, no output need be generated.

Reference is now made to FIG. 22, which is a simplified pictorial illustration of outlines of typical keystroke regions 625, 626, 627 and 628 as sensed by a two-dimensional image sensor (FIG. 1) viewing a keyboard, such as the keyboard 190, seen in FIG. 5A.

Figure 23:
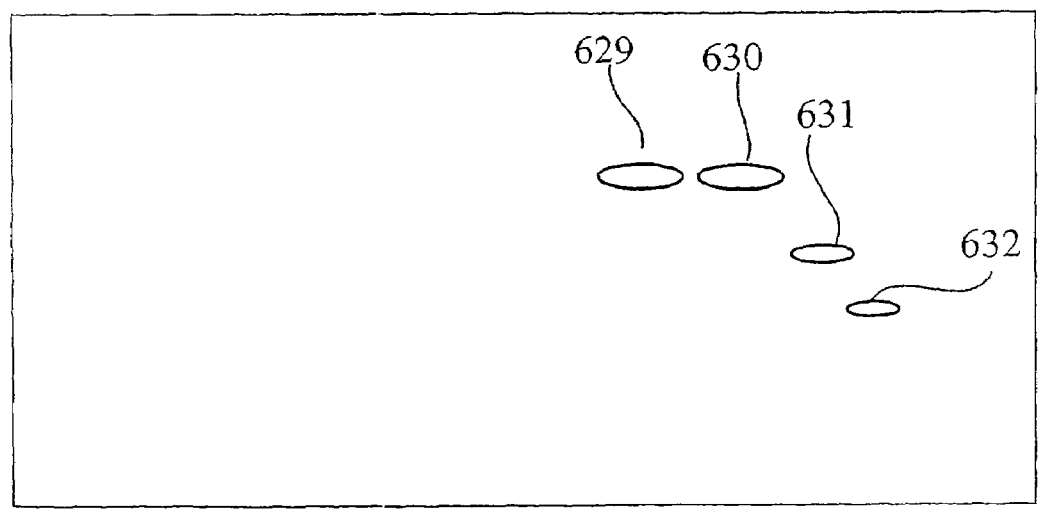
FIG. 23 is amplified pictorial illustration of outlines of typical footprints of a typical light pattern occasioned by data entry object engagement with several keystroke regions, such as those shown in FIG. 22.

Reference is now made to FIG. 23, which is a simplified pictorial illustration of outlines of typical footprints 629, 630, 631 and 632 of a typical light pattern occasioned by data entry object engagement corresponding to the keystroke regions 625, 626, 627 and 628 (FIG. 22).

Figure 24A:
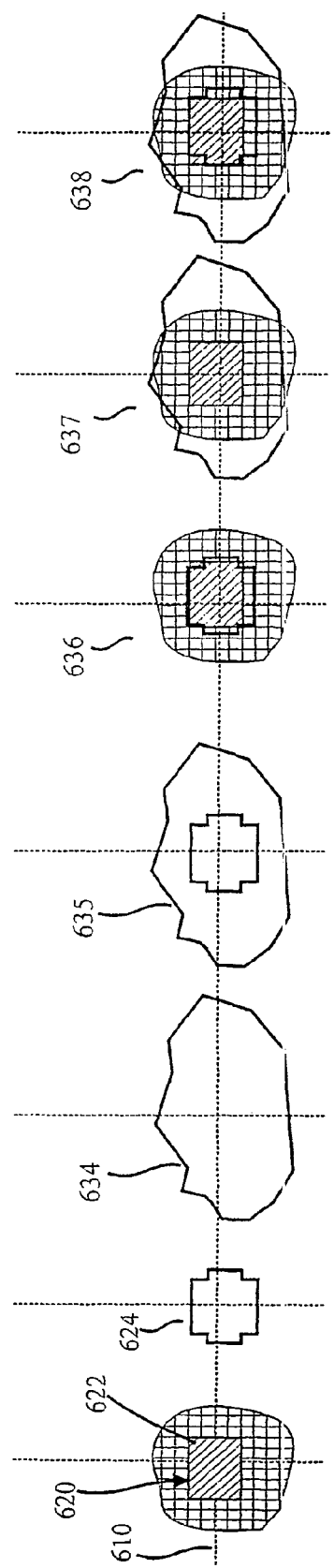
FIGS. 24A, 24B and 24C are simplified illustrations of three alternative methodologies for determining the function of the pixel within the keystroke region in which it lies as shown in FIG. 21.
Figure 24B:
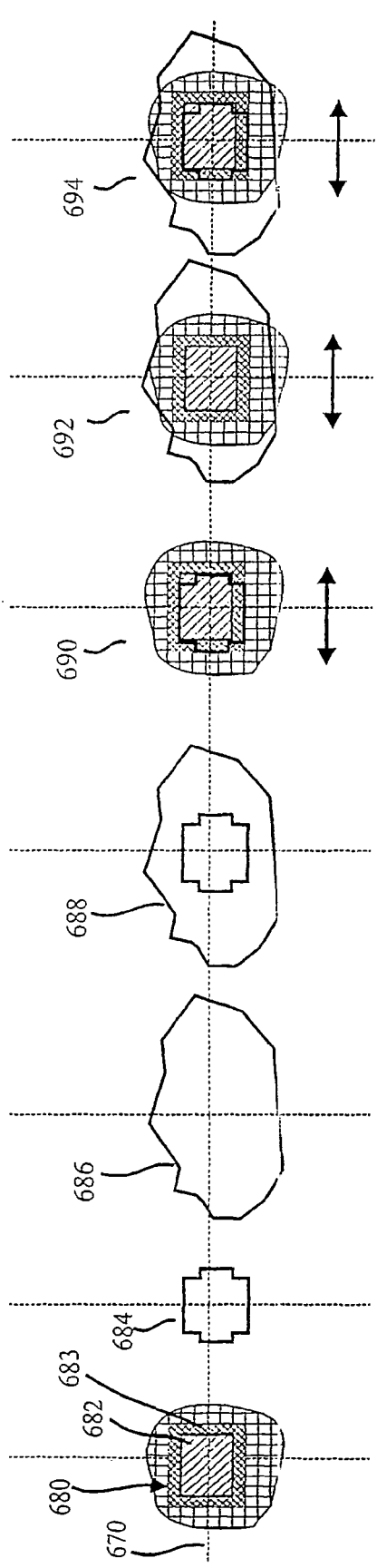
Figure 24C:
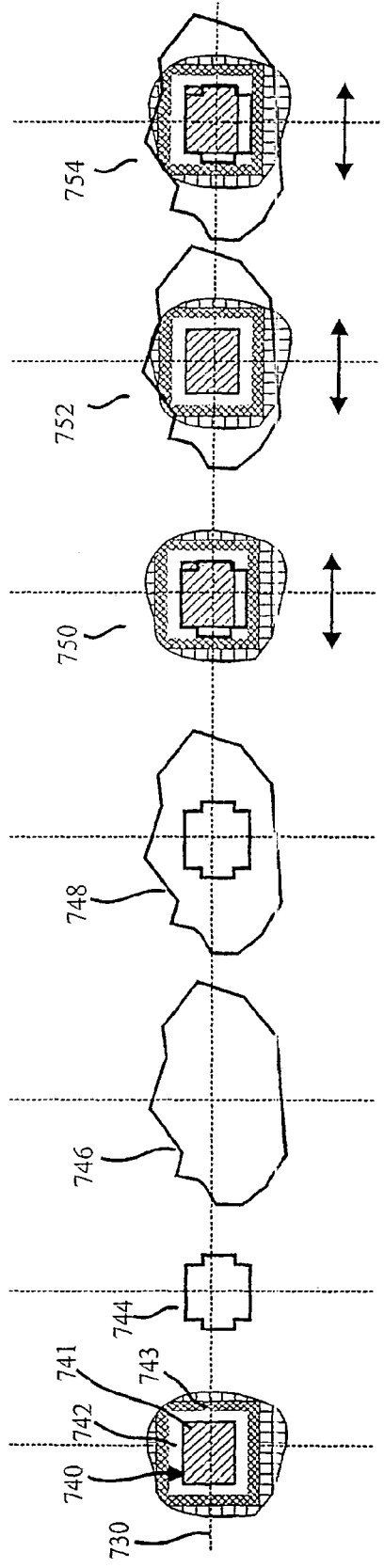

Reference is now made to FIGS. 24A, 24B and 24C, which are simplified illustrations of three alternative methodologies for determining the function of the pixel within the keystroke region in which it lies as shown in FIG. 21 and to FIGS. 23A, 23B and 23C, which are simplified illustrations of traces which are useful in understanding FIGS. 22A, 22B and 22C.

Turning now to FIG. 24A, there is shown arranged along a common arbitrary axis 610 a simplified keystroke region 620 corresponding to a given key and containing a plurality of pixels 622. A typical simplified footprint of a typical light pattern occasioned by data entry object engagement with the given key is indicated by reference numeral 624. FIG. 23 shows outlines of typical footprints 625, 626, 627 and 628, corresponding to keystroke regions designated 629, 630, 631 and 632 in FIG. 22.

A typical background signal pattern is indicated by reference numeral 634. Superimposition of the footprint 624 over the background signal pattern 626 is indicated at reference numeral 635. A one dimensionally selectable overlap of footprint 624 over keystroke region 620 is indicated at reference numeral 636. A one dimensionally selectable overlap of background signal pattern 634 over keystroke region 620 is indicated at reference numeral 637. A one dimensionally selectable overlap of superimposition 638 over keystroke region 620 is indicated at reference numeral 638.

Figure 25A:
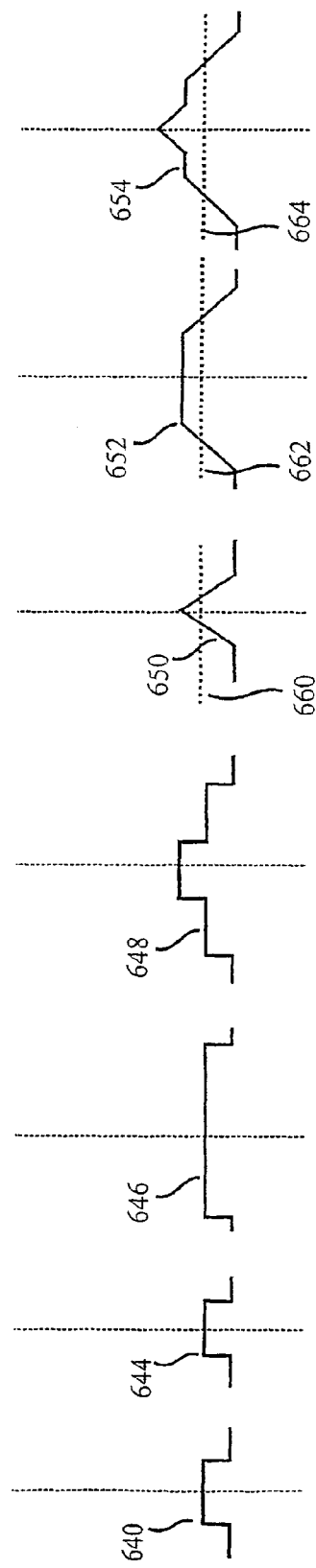
FIGS. 25A, 25B and 25C are simplified illustrations of traces which are useful in understanding FIGS. 24A, 24B and 24C.

FIG. 25A illustrates a bias function 640 corresponding to a cross section of the keystroke region 620 taken along axis 610, which bias function defines keystroke region 620 along axis 610. There is also seen a signal function 644 corresponding to a cross section of the footprint 624 along axis 610; a background signal function 646 corresponding to a cross section of the background signal pattern 634 along axis 610 and a combination signal 649 corresponding to a cross section of the superimposition 635.

There is also shown in FIG. 25A a one dimensional convolution 650 corresponding to one dimensionally selectable overlap 636; a one dimensional convolution 652 corresponding to one dimensionally selectable overlap 637 and a one dimensional convolution 654 corresponding to one dimensionally selectable overlap 638. Convolution 650 is shown with a threshold 660; convolution 652 is shown with a threshold 662 and convolution 654 is shown with a threshold 664.

Figure 25B:
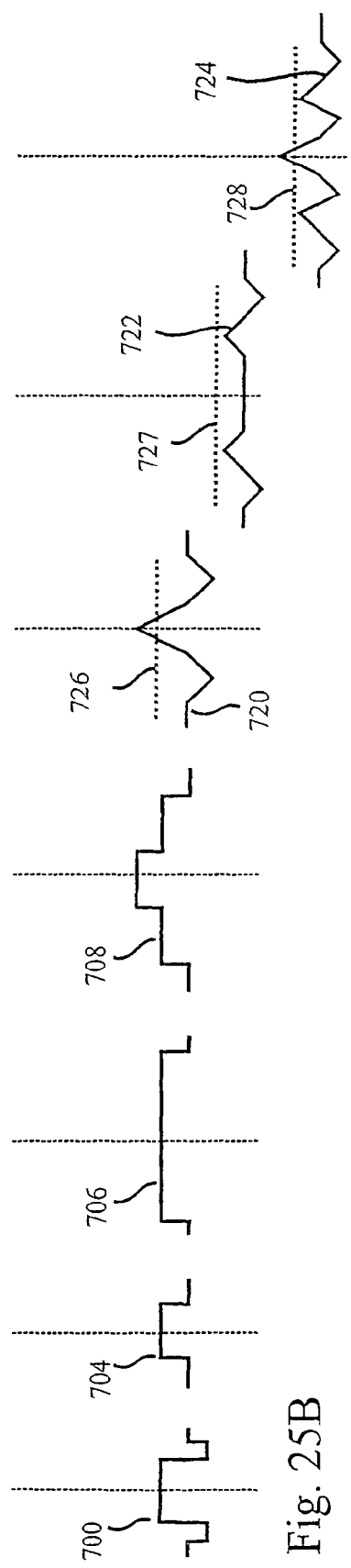

Turning now to FIG. 24B, there is shown arranged along a common arbitrary axis 670 a simplified keystroke region 680 corresponding to a given key and containing a plurality of pixels 682. The simplified keystroke region 680 is here shown surrounded by a simplified keystroke region border 683. A typical simplified footprint of a typical light pattern occasioned by data entry object engagement with the given key is indicated by reference numeral 684. A typical background signal pattern is indicated by reference numeral 686. Superimposition of the footprint 684 over the background signal pattern 686 is indicated at reference numeral 688. A one dimensionally selectable overlap of footprint 684 over keystroke region 680 and border 683 is indicated at reference numeral 690. A one dimensionally selectable overlap of background signal pattern 686 over keystroke region 680 and border 683 is indicated at reference numeral 692. A one dimensionally selectable overlap of superimposition 688 over keystroke region 680 and border 683 is indicated at reference numeral FIG. 25B illustrates a bias function 700 corresponding to a cross section of the keystroke region 680 and of the border 683 taken along axis 670, which bias function defines keystroke region 680 along axis 670. It is seen that border 683 is assigned a negative value relative to the value of the keystroke region 680. This value assignment is appreciated to enhance the value of data entry object engagements to the extent that they lie within the keystroke region 680 and to decrease the value of such data entry object engagements to the extent that they extend over the border 683. There is also seen a signal function 704 corresponding to a cross section of the footprint 684 along axis 670; a background signal function 706 corresponding to a cross section of the background signal pattern 686 along axis 670 and a combination signal 708 corresponding to a cross section of the superimposition 688.

There is also shown in FIG. 25B a one dimensional convolution 720, corresponding to one dimensionally selectable overlap 690; a one dimensional convolution 722, corresponding to one dimensionally selectable overlap 692 and a one dimensional convolution 724 corresponding to one dimensionally selectable overlap 694. Convolution 720 is shown with a threshold 726; convolution 722 is shown with a threshold 727 and convolution 724 is shown with a threshold 728.

Turning now to FIG. 24C, there is shown arranged along a common arbitrary axis 730 a simplified keystroke region 740 corresponding to a given key and containing a plurality of pixels 741. The simplified keystroke region 740 is here shown surrounded by a simplified keystroke region inner border 742 and by a simplified keystroke region outer border 743. A typical simplified footprint of a typical light pattern occasioned by data entry object engagement with the given key is indicated by reference numeral 744. A typical background signal pattern is indicated by reference numeral 746. Superimposition of the footprint 744 over the background signal pattern 746 is indicated at reference numeral 748. A one dimensionally selectable overlap of footprint 744 over keystroke region 740 and borders 742 and 743 is indicated at reference numeral 750. A one dimensionally selectable overlap of background signal pattern 746 over keystroke region 740 and borders 742 and 743 is indicated at reference numeral 752. A one dimensionally selectable overlap of superimposition 748 over keystroke region 740 and borders 742 and 743 is indicated at reference numeral 754.

Figure 25C:
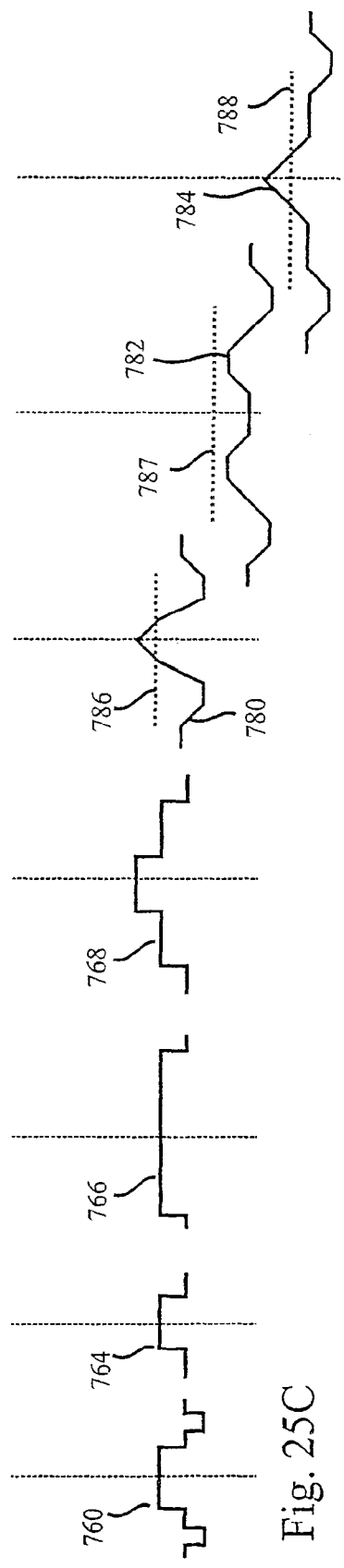

FIG. 25C illustrates a bias function 760 corresponding to a cross section of the keystroke region 740 and of the borders 742 and 743 taken along axis 730, which bias function defines keystroke region 740 along axis 730. It is seen that border 742 is assigned a zero value and border 743 is assigned a negative value relative to the value of the keystroke region 740. It is appreciated that these value assignments enhance the value of data entry object engagements that to the extent that they lie within the keystroke region 740 and to decrease the value of such data entry object engagements to the extent that they extend across the border 742 and at least into border 743. There is also seen a signal function 764 corresponding to a cross section of the footprint 744 along axis 730; a background signal function 766 corresponding to a cross section of the background signal pattern 746 along axis 730 and a combination signal 768 corresponding to a cross section of the superimposition 748.

There is also shown in FIG. 25C a one dimensional convolution 780, corresponding to one dimensionally selectable overlap 750; a one dimensional convolution 782, corresponding to one dimensionally selectable overlap 752 and a one dimensional convolution 784 corresponding to one dimensionally selectable overlap 754. Convolution 780 is shown with a threshold 786; convolution 782 is shown with a threshold 787 and convolution 784 is shown with a threshold 788.

It may be appreciated from a consideration of convolutions 638, 694 and 754 that the dual border arrangement of FIGS. 24C and 25C provides the best detection of data entry object keystroke engagement, while minimizing background effects.

Figure 26:
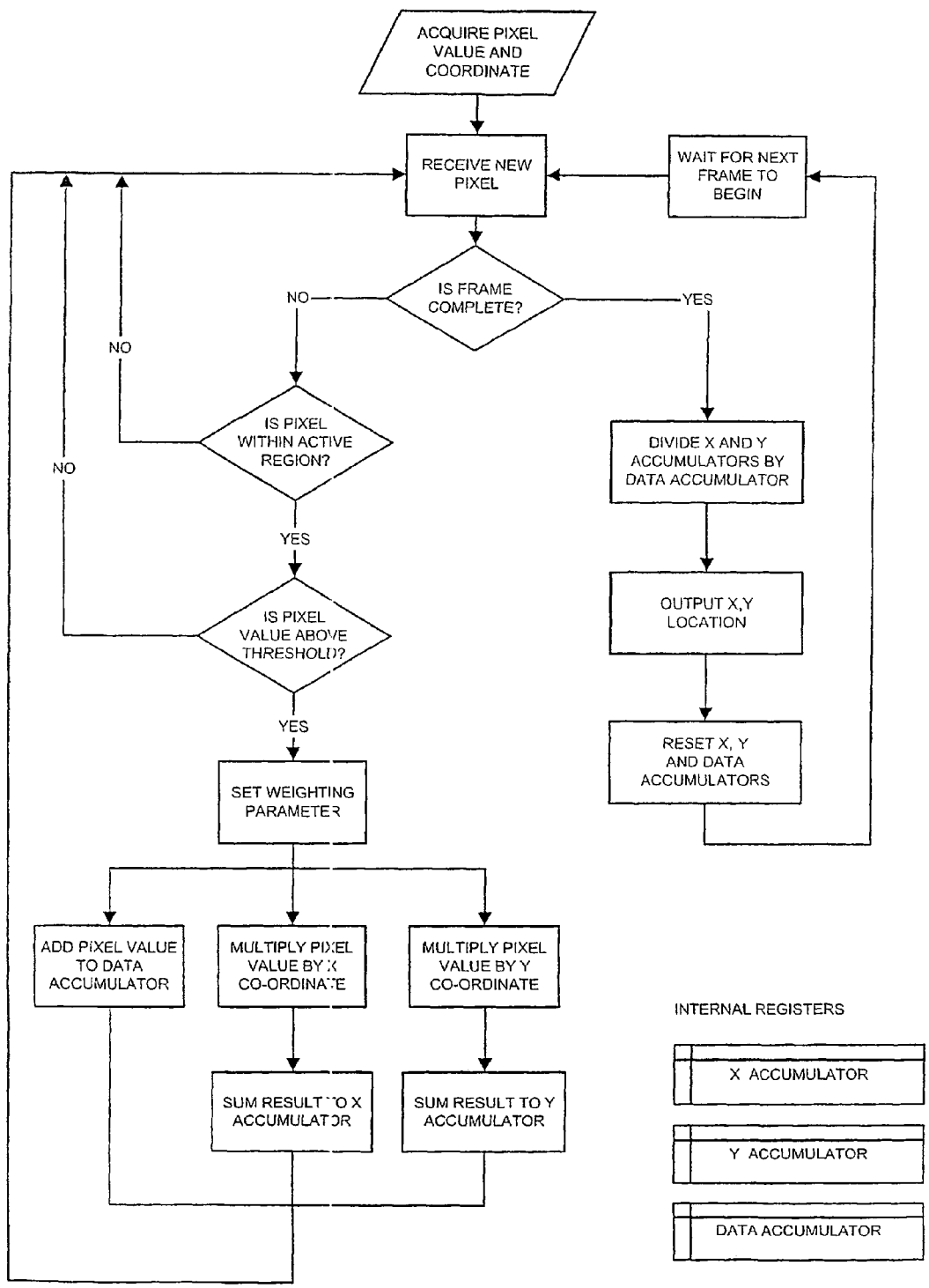
FIG. 26 is a simplified flow chart illustrating operation of a data entry object engagement location sensing subsystem employed in a tracking system and methodology constructed and operative in accordance with a preferred embodiment of the present invention.

Reference is now made to FIG. 26, which is a simplified flow chart illustrating operation of a data entry object engagement location sensing subsystem employed in a tracking system and methodology constructed and operative in accordance with a preferred embodiment of the present invention.

As seen in FIG. 26, pixel values, such as gray level values, are acquired for various pixel coordinates. As each pixel value is acquired, a determination may be made, using the pixel coordinates, as to whether that pixel lies within a predefined active region. Typically, if the pixel does not lie within a predetermined active region, its value is ignored.

The pixel value for each pixel is preferably thresholded and typically all pixel values falling below a given threshold are ignored. The remaining pixel values may be weighted by a selected weighting parameter. In order to determine the "center of gravity" of the thresholded and weighted pixel values, the thresholded and weighted pixel values are multiplied respectively by X and Y values representing the coordinate position of each pixel and the results are summed along mutually perpendicular axes X and Y and stored in X and Y accumulators. The total of the thresholded and weighted pixel values for all relevant pixels are also summed and stored in a data accumulator, for the entire active region.

Once all of the pixels in a frame have been processed as aforesaid, the summed thresholded and weighted pixel values along the X and Y axes respectively are divided by the total of the thresholded and weighted pixel values for the entire active region to determine the X and Y coordinates of the "center of gravity", which represents a desired engagement location.

Figure 27:
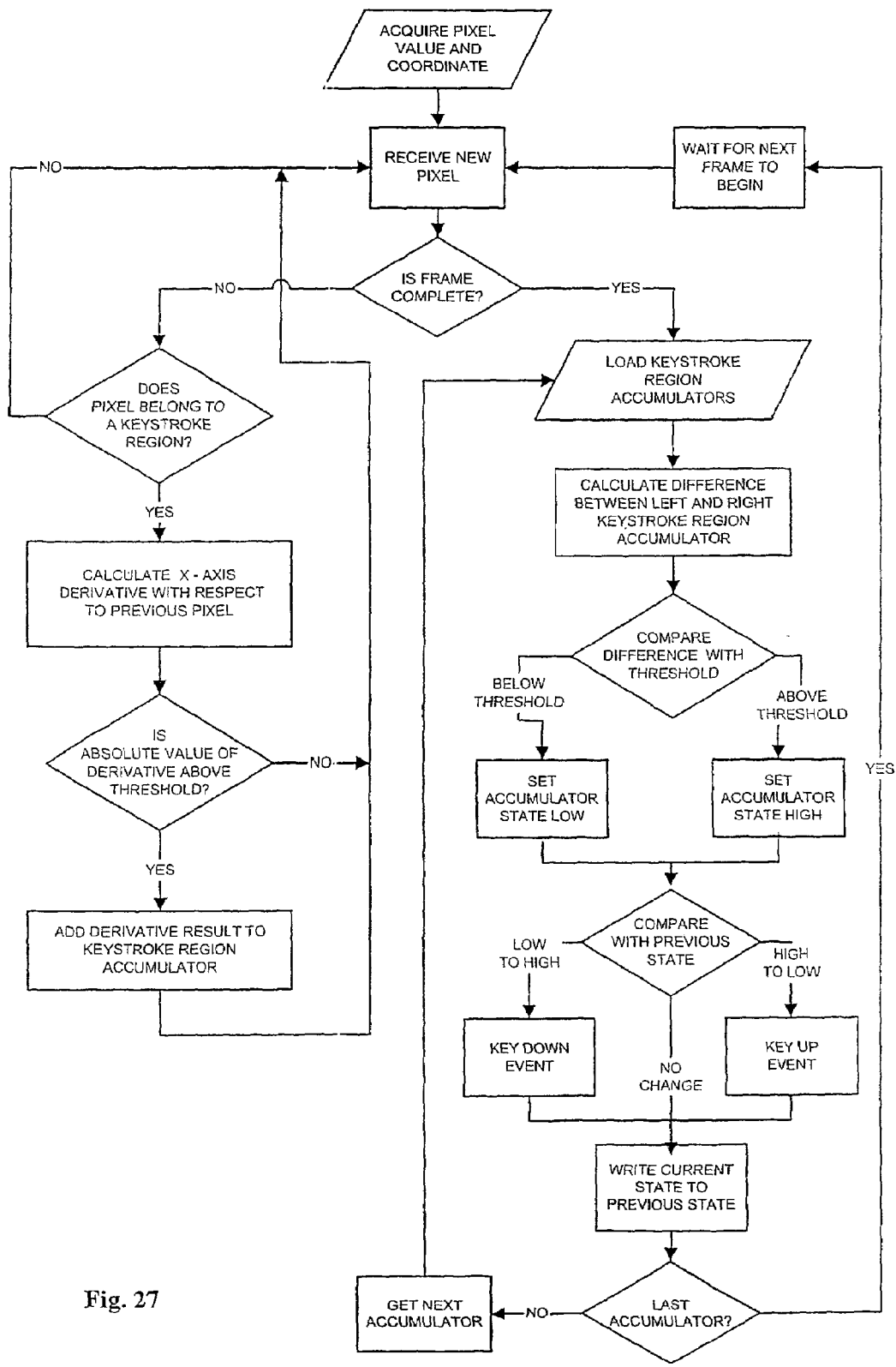
FIG. 27 is a simplified flowchart illustrating operation of functionality providing shadow sharpness analysis in accordance with a preferred embodiment of the present invention.
Figure 28:
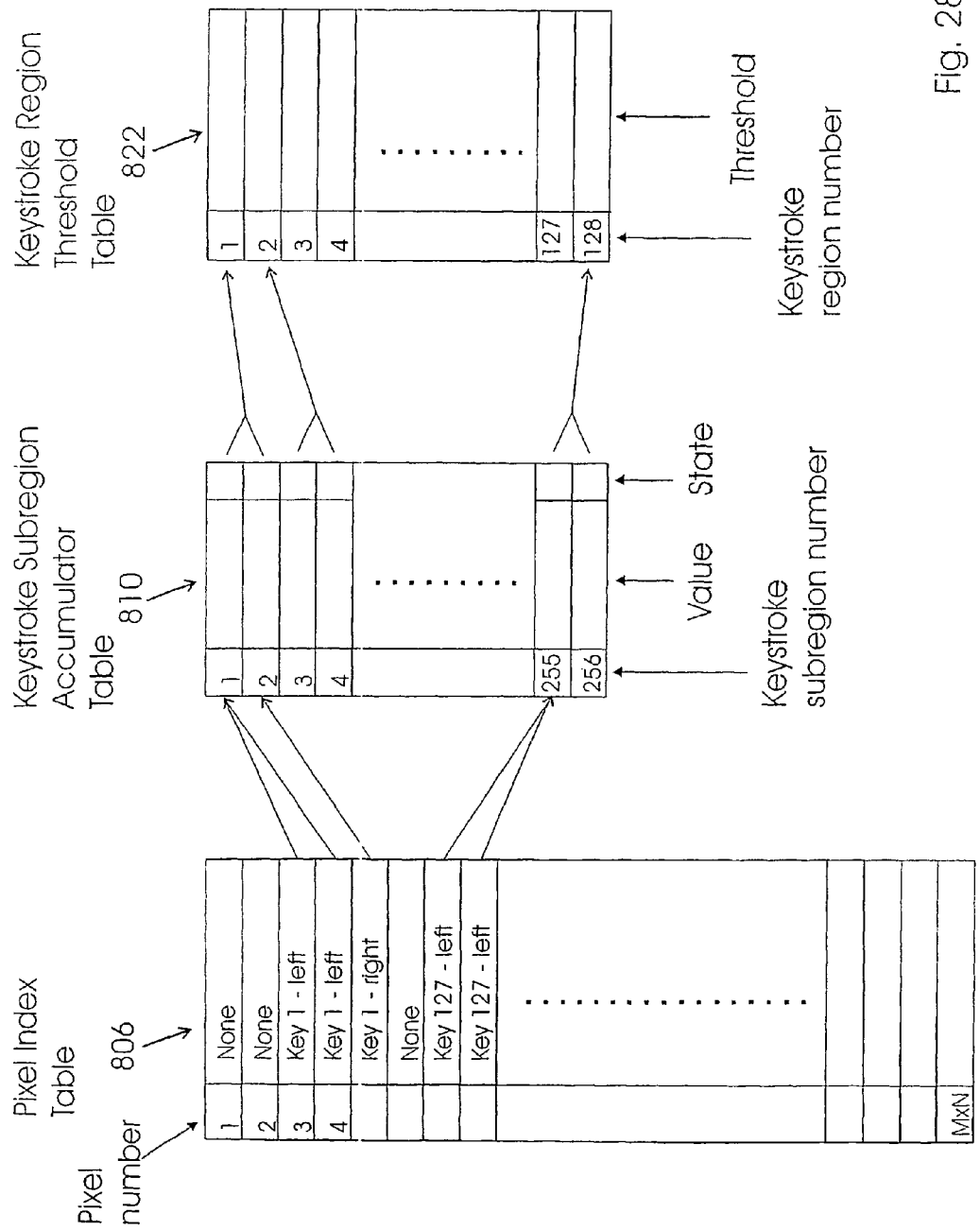
FIG. 28 is a simplified illustration of a preferred data structure employed in the operation of the data entry object engagement location sensing subsystem shown in FIG. 27.
Figure 29:
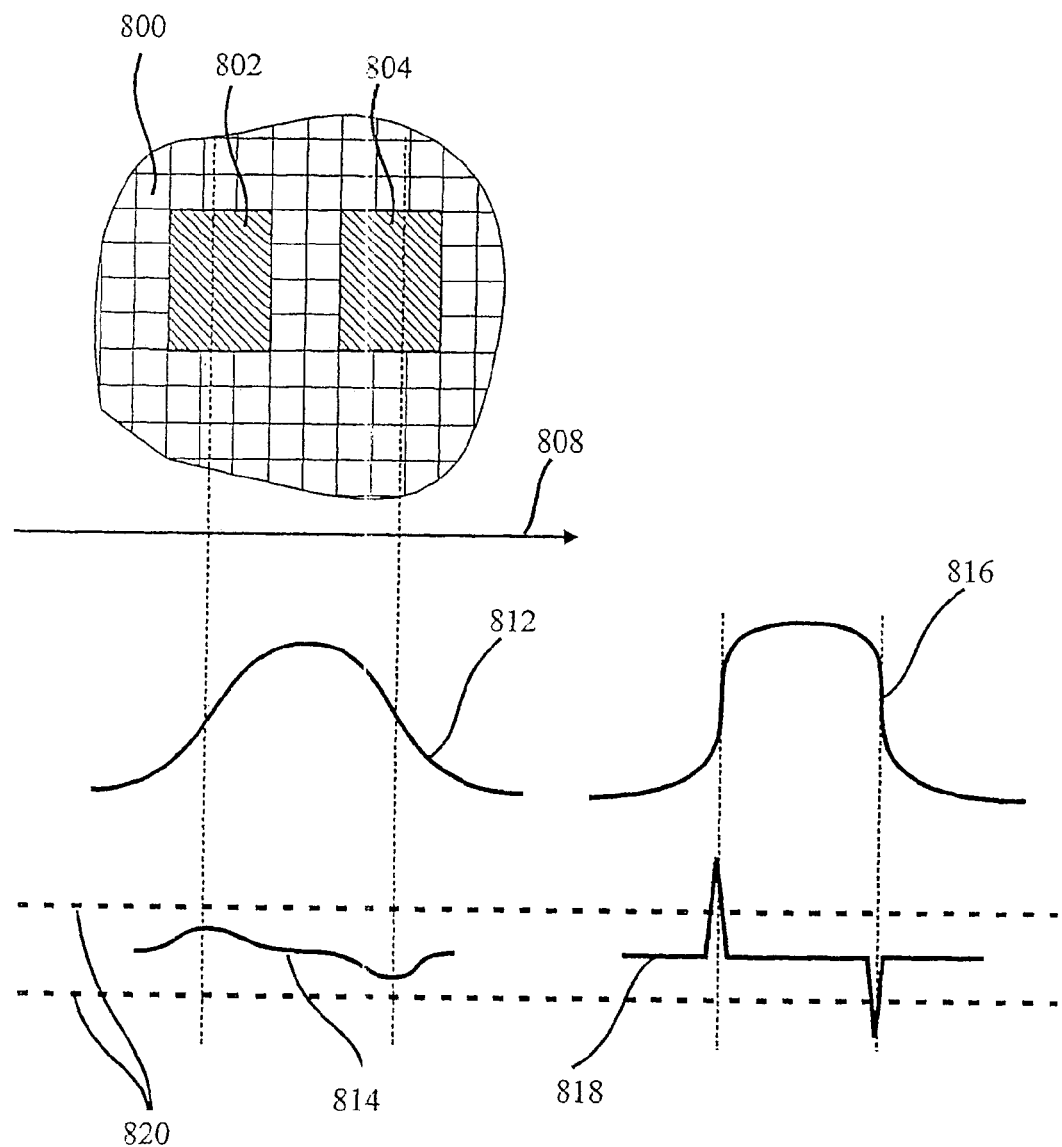
FIG. 29 is an illustration which is useful in understanding the flowchart of FIG. 27.

Reference is now made to FIG. 27, which is a simplified flowchart illustrating operation of functionality providing shadow sharpness analysis in accordance with a preferred embodiment of the present invention, to FIG. 28, which is a simplified illustration of a preferred data structure employed in the operation of the data entry object engagement location sensing subsystem shown in FIG. 27 and to FIG. 29, which is an illustration which is useful in understanding the flowchart of FIG. 27.

As seen in FIGS. 27–29, pixel values, such as gray level values, are acquired for various pixel coordinates. As each pixel value is acquired, a determination is made, using the pixel coordinates, as to whether that pixel lies within a predefined keystroke region 800 (FIG. 29) and whether it lies within left or right subregions 802 and 804 respectively. This determination is preferably made by employing a pixel index table 806 which indicates for each pixel, whether that pixel lies within a predetermined keystroke region and, if so, within which keystroke region as well as within which keystroke subregion it lies.

The derivative of the pixel values along the X axis 808 (FIG. 29) is calculated and thresholded. X axis derivative values, the absolute values of which exceed a predetermined threshold, are summed for each subregion of each keystroke region and stored in a keystroke region accumulator table 810. The variation of pixel values along the X axis 808 for a situation, such as that illustrated in FIG. 11A, is shown at reference numeral 812. The X-axis derivative thereof is shown at reference numeral 814. The variation of pixel values along the X axis 808 for a situation, such as that illustrated in FIG. 11B, is shown at reference numeral 816. The X-axis derivative thereof is shown at reference numeral 818. The threshold applied to derivatives 814 and 818 is indicated by reference numeral 820.

It is clearly seen that the closer that the data entry object is to the engagement surface 104 (FIGS. 11A & 11B), the sharper is the detected edge and the greater is the derivative.

Once all of the pixels in a frame have been processed as aforesaid a key actuation threshold is determined typically from a predetermined threshold level which is established for each keystroke region. This is preferably carried out by employing a keystroke region threshold table 822.

The contents of the keystroke region accumulator table 810 for the two subregions in each keystroke region preferably are then subtracted one from the other. The difference is compared with the current key actuation threshold. If the difference exceeds a key actuation threshold for a given key actuation region in a given frame and in the previous frame the difference did not exceed the key actuation threshold, a key actuation output is provided.

Similarly, if the difference does not exceed the key actuation threshold for a given key actuation region in a given frame and in the previous frame the difference did exceed the key actuation threshold, a key deactuation output is provided. In all other cases, no output need be generated.

Figure 30:
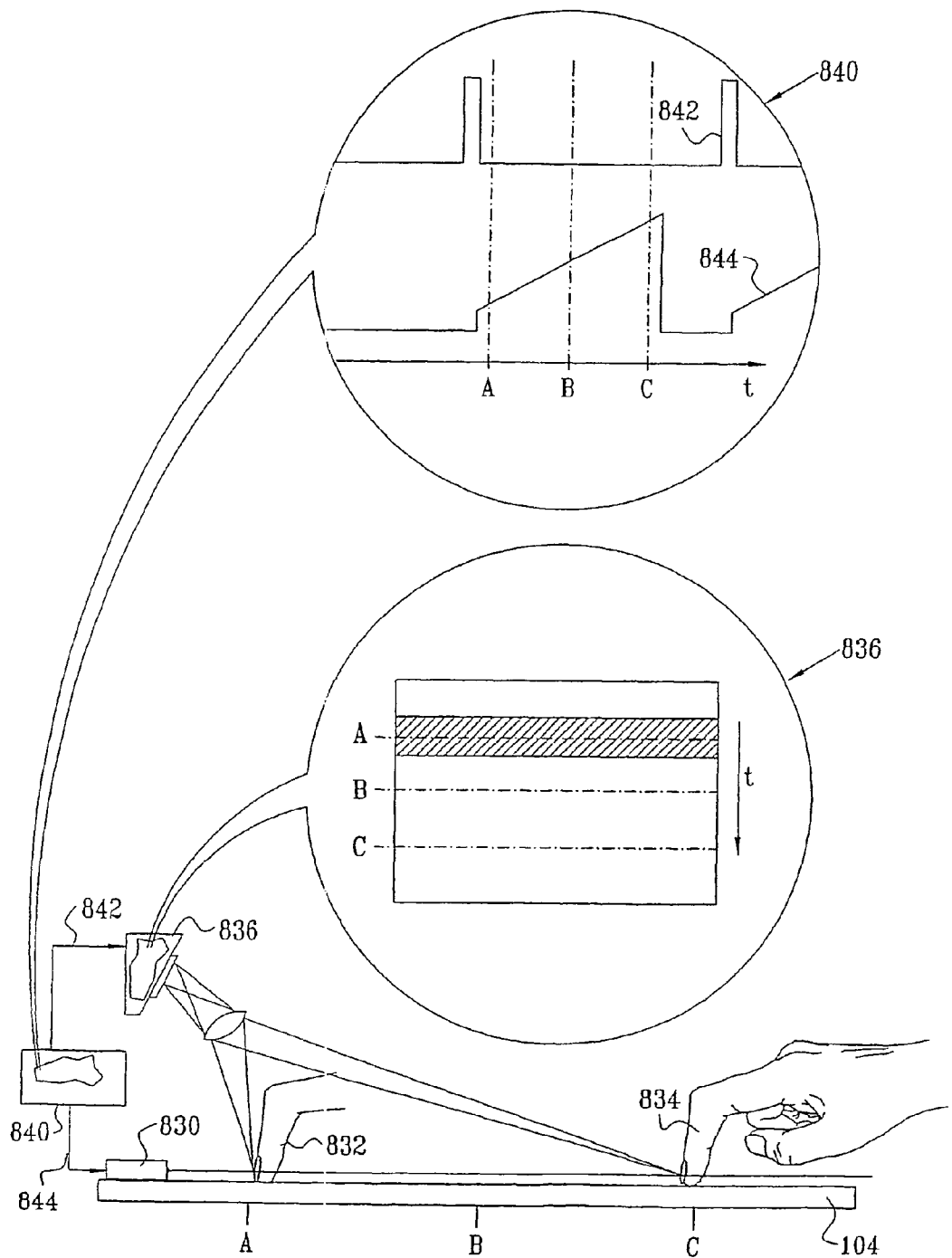
FIG. 30 is a simplified illustration showing synchronized illumination power variation functionality useful in accordance with a preferred embodiment of the present invention.

Reference is now made to FIG. 30, which is a simplified illustration showing synchronized illumination power variation functionality useful in accordance with a preferred embodiment of the present invention. The functionality illustrated in FIG. 30 is directed to modulating the amount of illumination provided for data entry object engagement detection. This modulation is desirable because the intensity of light impinging on a data entry object and is thus scattered thereby, decreases with the distance between an illuminator 830 and a data entry object. Thus it may be appreciated that the amount of light impinging on a data entry object 832 is substantially greater than the amount of light impinging on a data entry object 834. Furthermore the amount of scattered light impinging on a detector 836 decreases with the distance between the data entry object and the detector. These two distance dependencies make detection of data entry object engagement difficult.

In order to overcome this difficulty, there is provided in accordance with a preferred embodiment of the present invention variable intensity drive electronics 840 which is coupled to both illuminator 830 and detector 836 and which causes the intensity of light produced by the illuminator 830 to vary, typically in a ramp fashion, in synchronization to the imaging field location of detector 836.

Thus, it may be seen that when a near portion (A) of the engagement surface 104 (FIG. 1) is being imaged, typically at the top portion A of detector 836, the intensity is at a minimum. When an intermediate portion (B) of the engagement surface 104 is being imaged, typically at the middle of detector 836, the intensity is at an intermediate level and when a far portion (C) of the engagement surface 104 is being imaged, typically at the bottom portion (C) of the detector 836, the intensity is at a maximum.

Variable intensity drive electronics 840 operates preferably by providing a synchronization output 842 to detector 836 and a corresponding synchronization output 844 to illuminator 830, causing the intensity level to increase in time in synchronization with the location of a scanned image region in detector 836.

Figure 31:
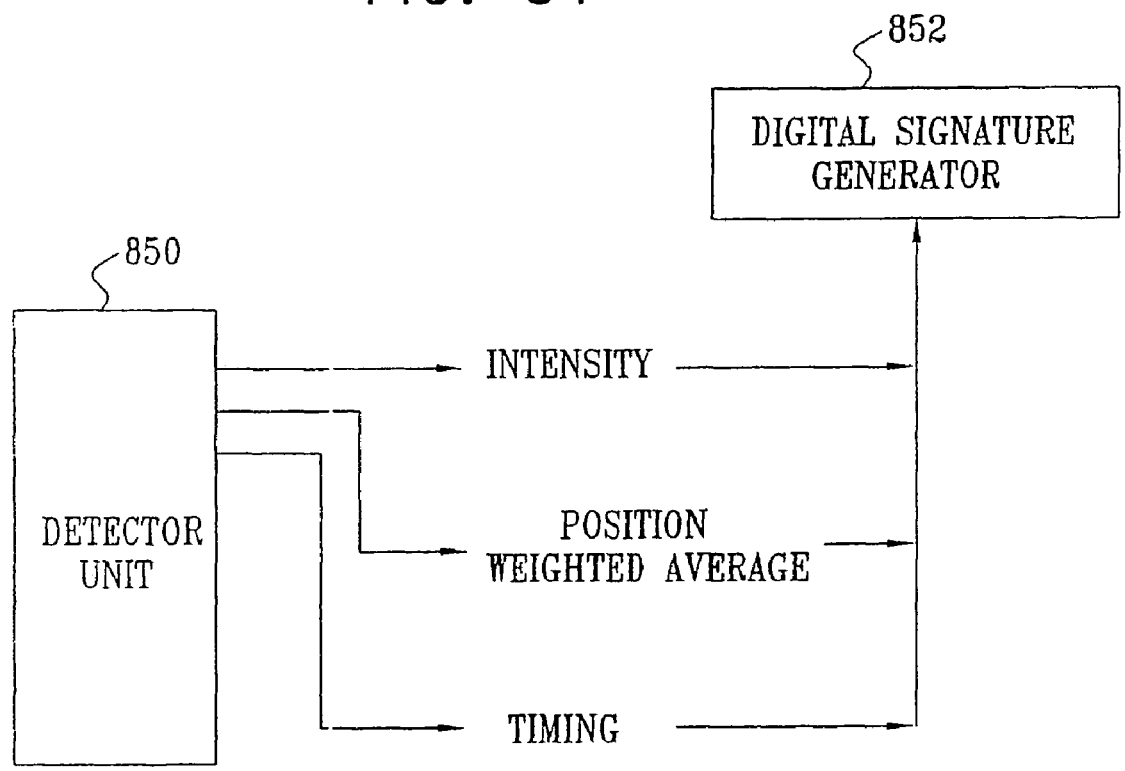
FIG. 31 is a simplified illustration of a system and functionality for providing a digital signature in accordance with a preferred embodiment of the present invention.

Reference is now made to FIG. 31, which is a simplified illustration of a system and functionality for providing a digital signature in accordance with a preferred embodiment of the present invention. As seen in FIG. 29, an output from a data entry object engagement detection subsystem 850, such as detector subsystem 112 (FIG. 1), provides intensity, position and timing outputs which are combined in a digital signature generator 852. Digital signature generator 852 preferable provides a unique digital signature based on these outputs. The intensity and timing outputs may be generated by the functionality described hereinabove with reference to FIGS. 20 and 21. The position output may be generated by the functionality described hereinabove with reference to FIG. 26.

Figure 32:
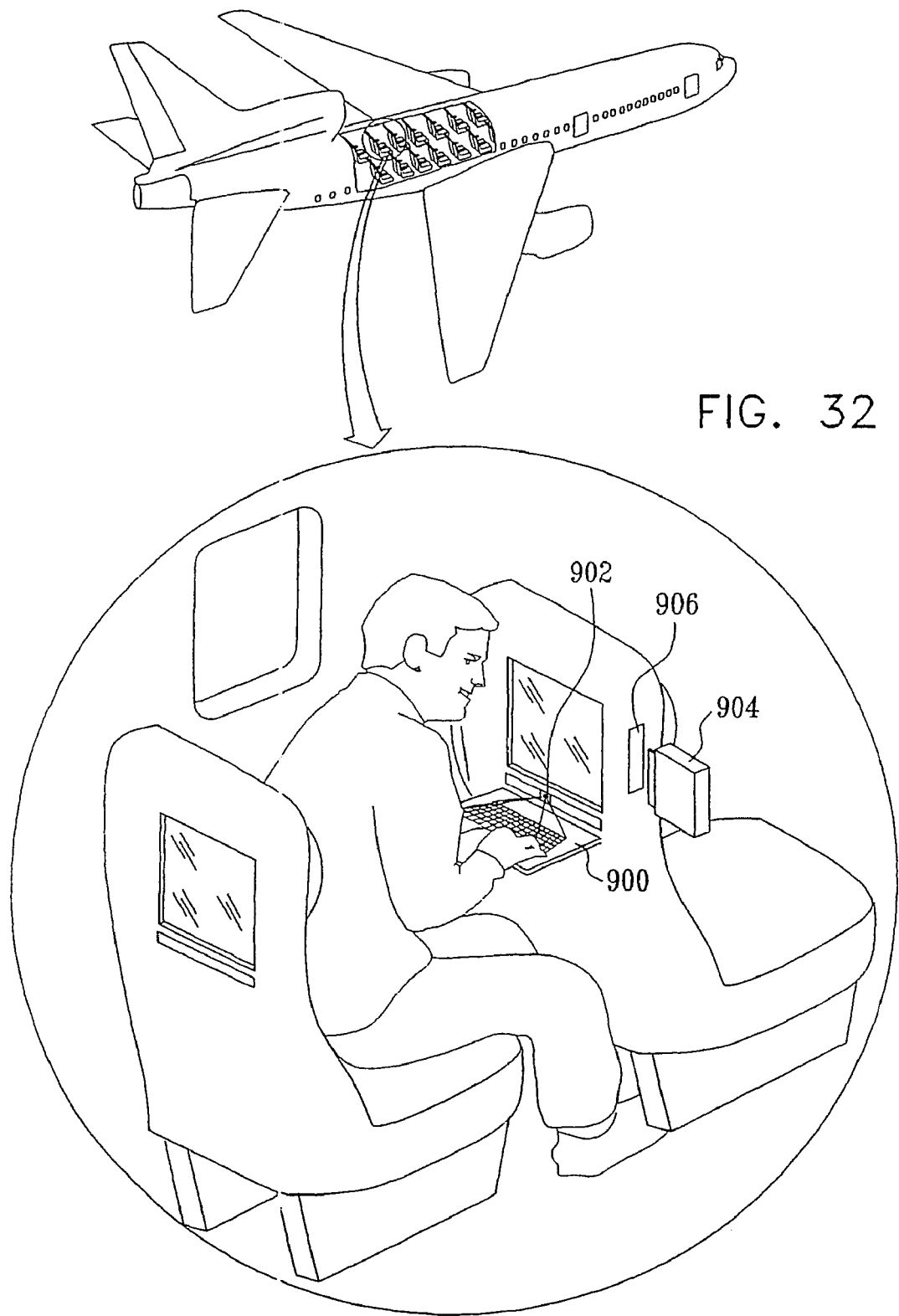
FIG. 32 is a simplified illustration of a keyboard system and methodology, constructed and operative in accordance with a preferred embodiment of the present invention and employing sensing of data entry object interaction with an inert keyboard defined on a pull-down tray.

Reference is now made to FIG. 32, which is a simplified illustration of a keyboard system and methodology, constructed and operative in accordance with a preferred embodiment of the present invention and employing sensing of data entry object interaction with an inert keyboard defined on a surface, such as a pull-down tray 900. Such a pull-down tray may be located in a vehicle, such as an airplane, and may have multiple uses, such as a dining tray. The keyboard may be defined by printing on the tray or on a sheet which can be placed on the tray or alternatively by suitable illumination thereof. Data entry object engagement detection may be provided by apparatus 902 incorporated in the vehicle or alternatively by portable apparatus, such as that carried by a passenger. Computer functionality may be provided by apparatus incorporated in the vehicle or alternatively by portable apparatus carried by a passenger. Computer memory, such as a memory element 904, may be carried by a passenger and may be inserted into a suitable socket 906 in the vehicle.

Figure 33:
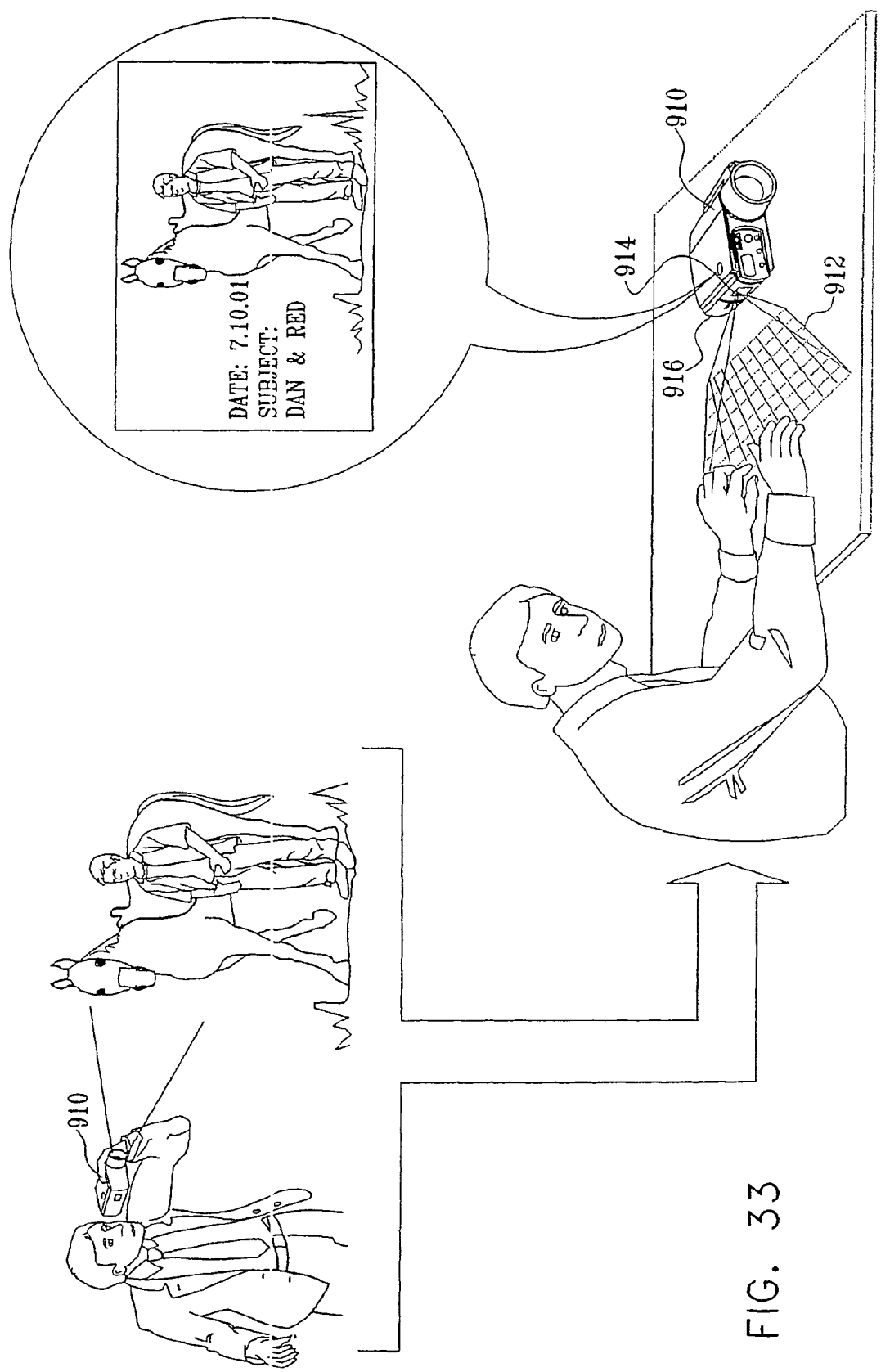
FIG. 33 is a simplified illustration of a keyboard system and methodology, constructed and operative in accordance with a preferred embodiment of the present invention and providing alphanumeric annotation of photographs using a suitably equipped camera.

Reference is now made to FIG. 33, which is a simplified illustration of a keyboard system and methodology, constructed and operative in accordance with a preferred embodiment of the present invention and providing alphanumeric annotation of photographs using a suitably equipped camera, such as a video camera 910. A keyboard 912 may be projected by a projection subsystem 914 integrally formed or otherwise associated With camera 910 and data entry object engagement detection may be provided by detection apparatus 916, also integrally formed or otherwise associated with camera 910. The keyboard may advantageously be employed for annotating pictures taken with the camera.

Figure 34A:
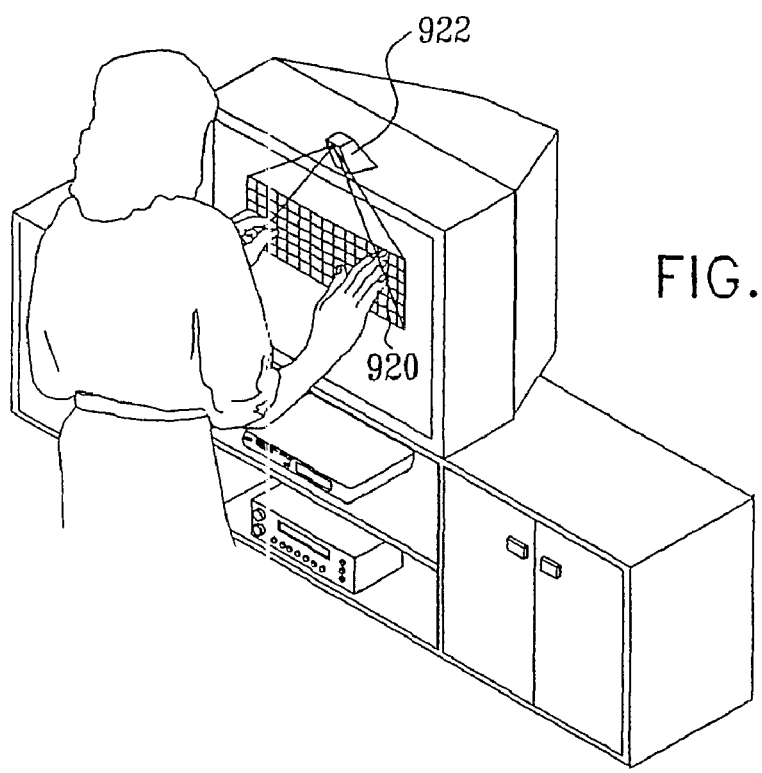
FIGS. 34A, 34B, 34C and 34D are simplified illustrations of four alternative embodiments of a keyboard system and methodology, constructed and operative in accordance with a preferred embodiment of the present invention and providing control, by data entry object interaction, of a home entertainment system.

Reference is now made to FIGS. 34A, 34B, 34C and 34D, which are simplified illustrations of four alternative embodiments of a keyboard system and methodology, constructed and operative in accordance with a preferred embodiment of the present invention and providing control, by data entry object interaction, of a home entertainment system. FIG. 34A shows a keyboard 920 defined on a television screen, typically either by operation of the television or by projection on the screen. Data entry object engagement detection is provided by apparatus 922 which may be portable or fixedly attached to the television.

Figure 34B:
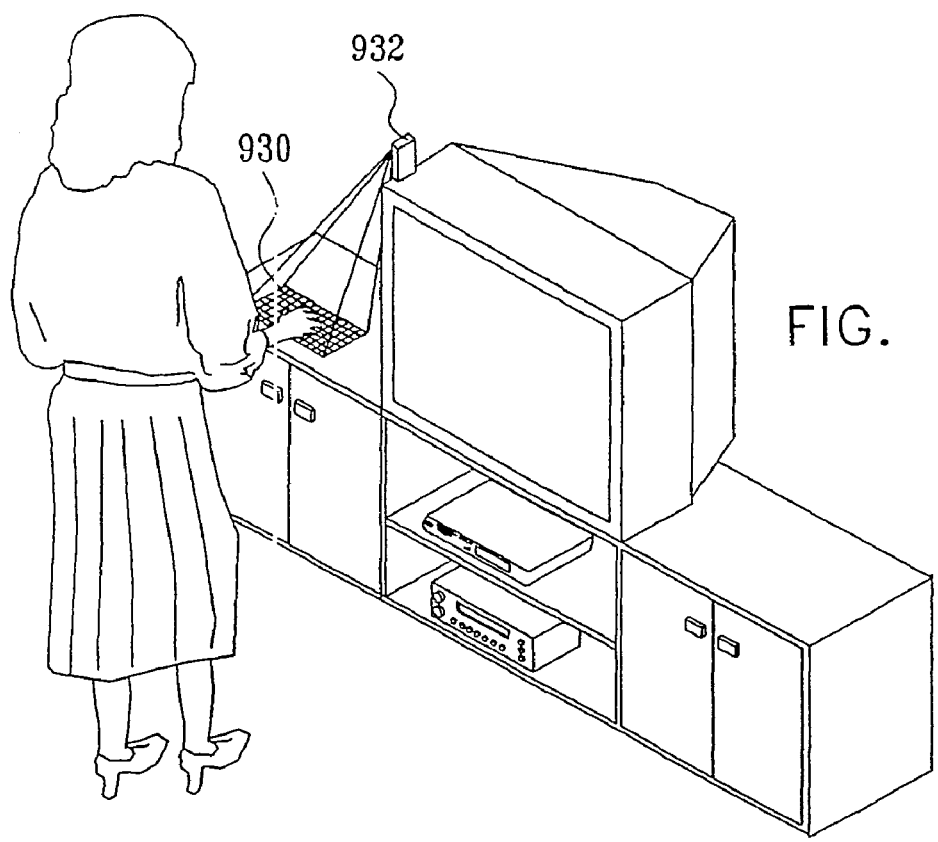

FIG. 34B shows a keyboard 930 defined alongside a home entertainment system. The keyboard 930 may be provided by projection or may be printed onto any suitable surface. Data entry object engagement detection is provided by apparatus 932 which may be portable or fixedly attached to the home entertainment system.

Figure 34C:
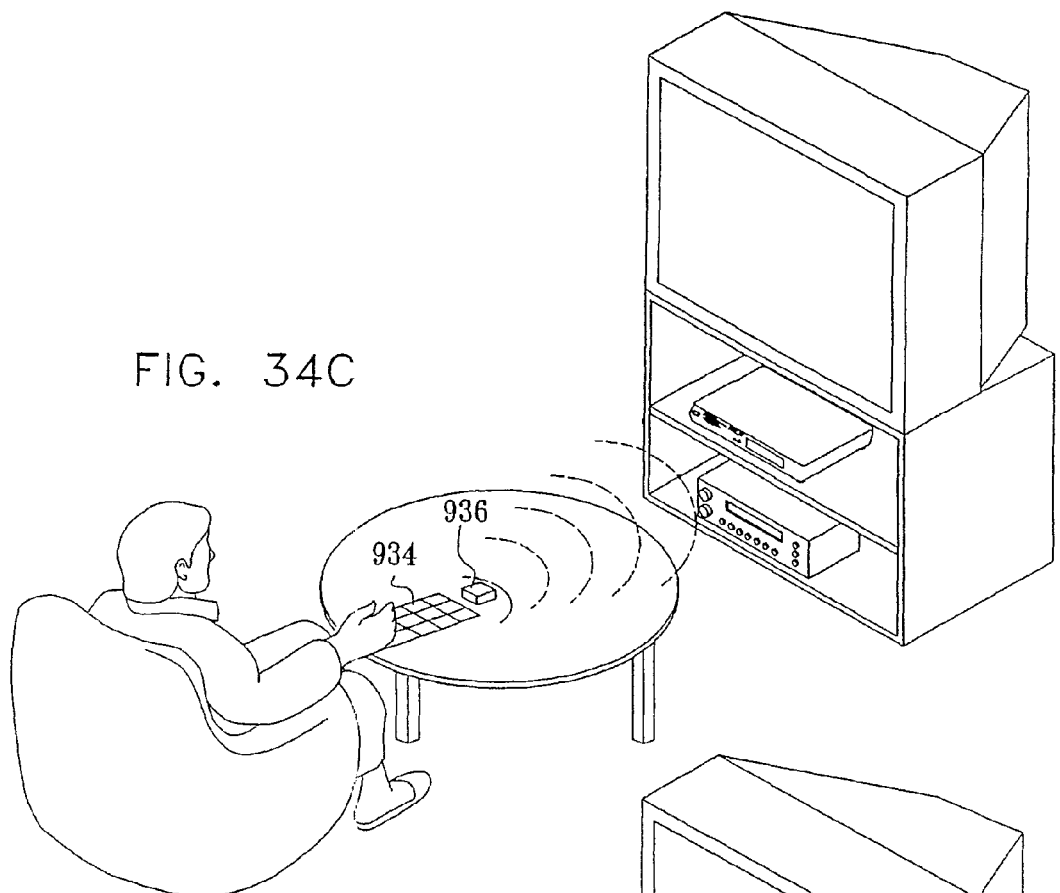

FIG. 34C shows a user interface board 934 defined on a table alongside a home entertainment system. The user interface board 934 may be provided by projection or may be printed into any suitable surface. Data entry object engagement detection is provided by apparatus 936 which may be portable or fixedly attached to the home entertainment system.

Figure 34D:
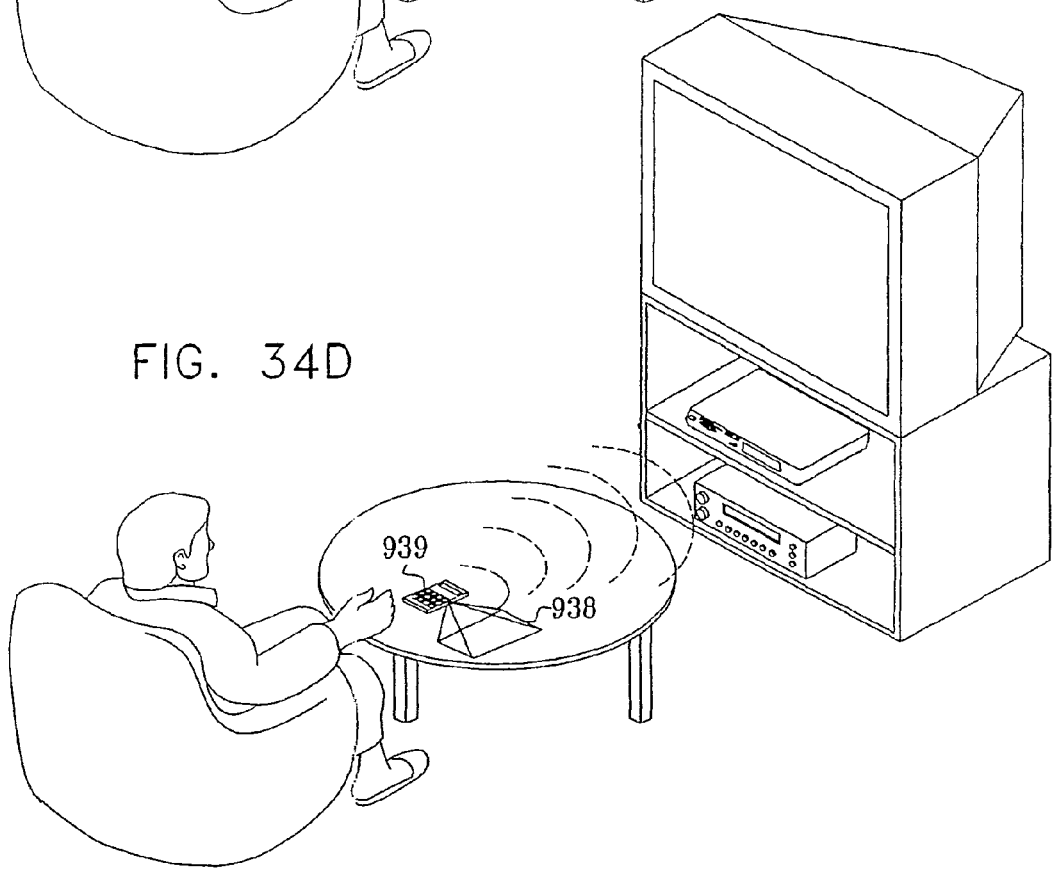

FIG. 34D shows a user interface board 938 defined on a remote control unit alongside a home entertainment system. The user interface board 938 may be provided by projection or man be printed onto any suitable surface. Data entry object engagement detection is provided by apparatus 939 which may be integralled formed of fixedly attached to the remote control unit.

In all of the above embodiments, the keyboard can be used for any suitable function, such as interactive entertainment and infotainment.

Figure 35:
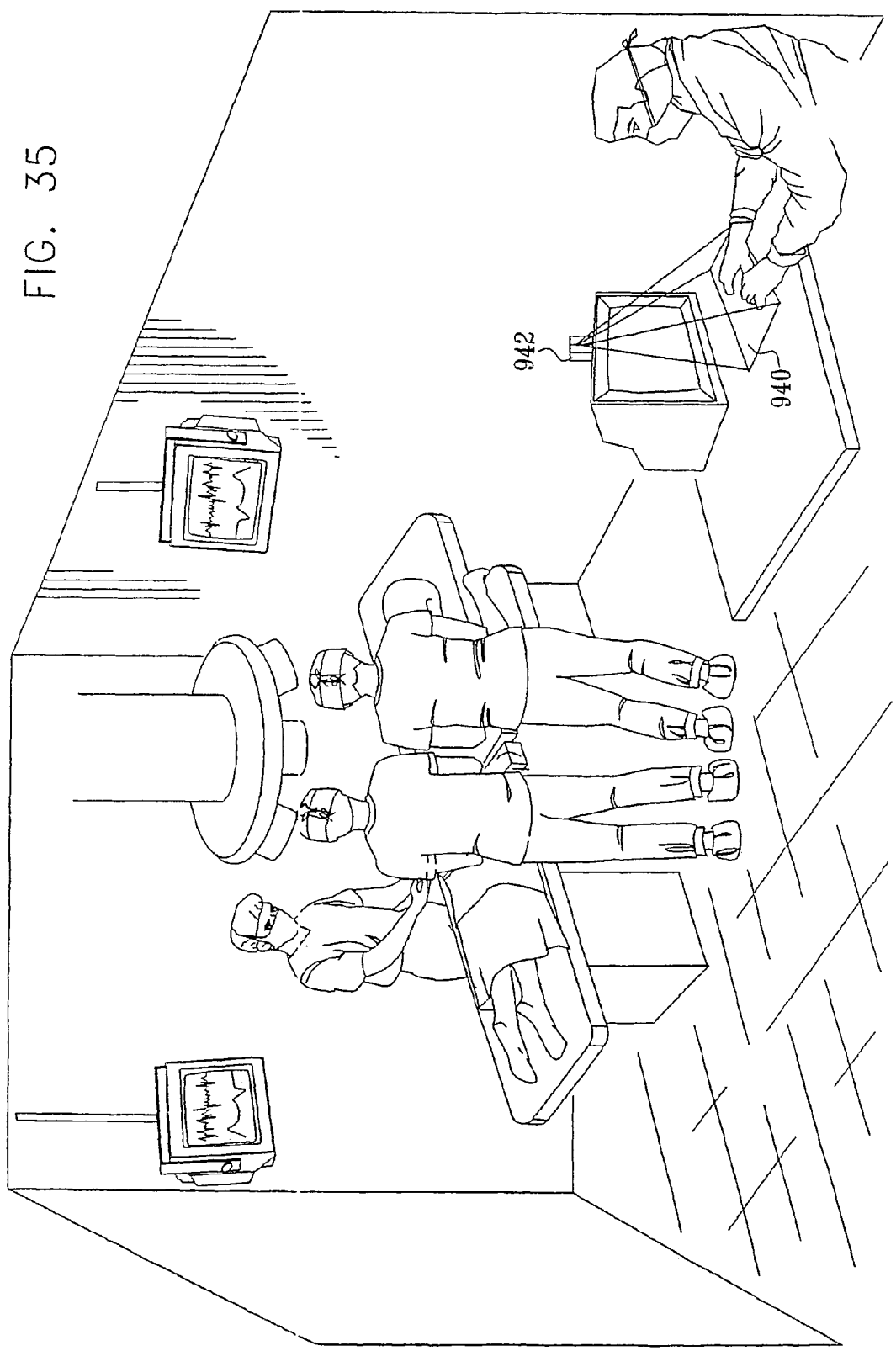
FIG. 35 is a simplified illustration of a restricted particulate matter environment keyboard system and methodology, constructed and operative in accordance with a preferred embodiment of the present invention.

Reference is now made to FIG. 35, which is a simplified illustration of a restricted particulate matter environment keyboard system and methodology, constructed and operative in accordance with a preferred embodiment of the present invention. A keyboard 940 may be provided by projection or may be printed onto any suitable surface. Data entry object engagement detection is provided by apparatus 942 which may be portable or fixedly attached to equipment. The keyboard 940 may be employed for controlling the equipment.

Figure 36:
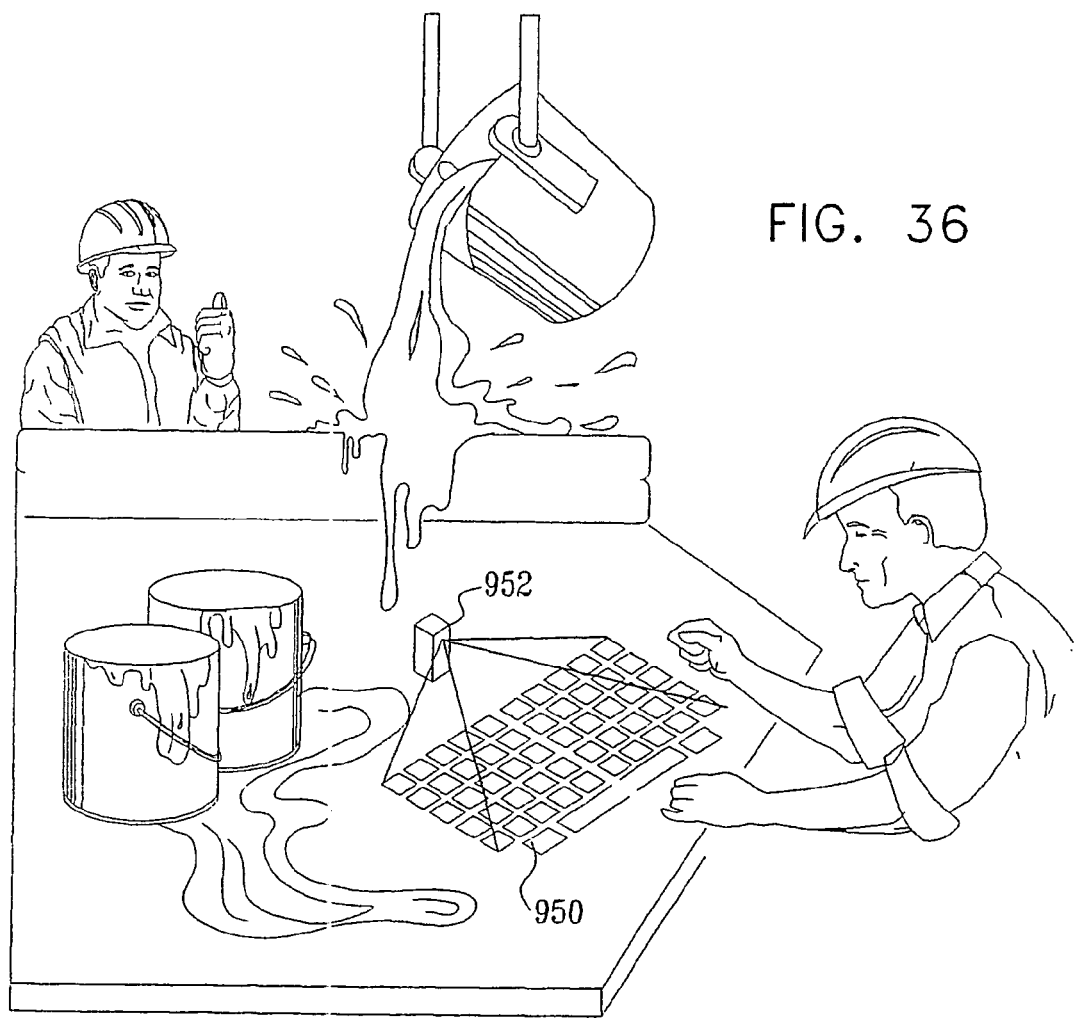
FIG. 36 is a simplified illustration of a industrial environment keyboard system and methodology, constructed and operative in accordance with a preferred embodiment of the present invention.

Reference is now made to FIG. 36, which is a simplified illustration of a industrial environment keyboard system and methodology, constructed and operative in accordance with a preferred embodiment of the present invention. A keyboard 950 may be provided by projection or may be printed onto any suitable surface. Data entry object engagement detection is provided by apparatus 952 which may be portable or fixedly attached to industrial equipment. The keyboard 950 may be employed for controlling the industrial equipment.

Figure 37:
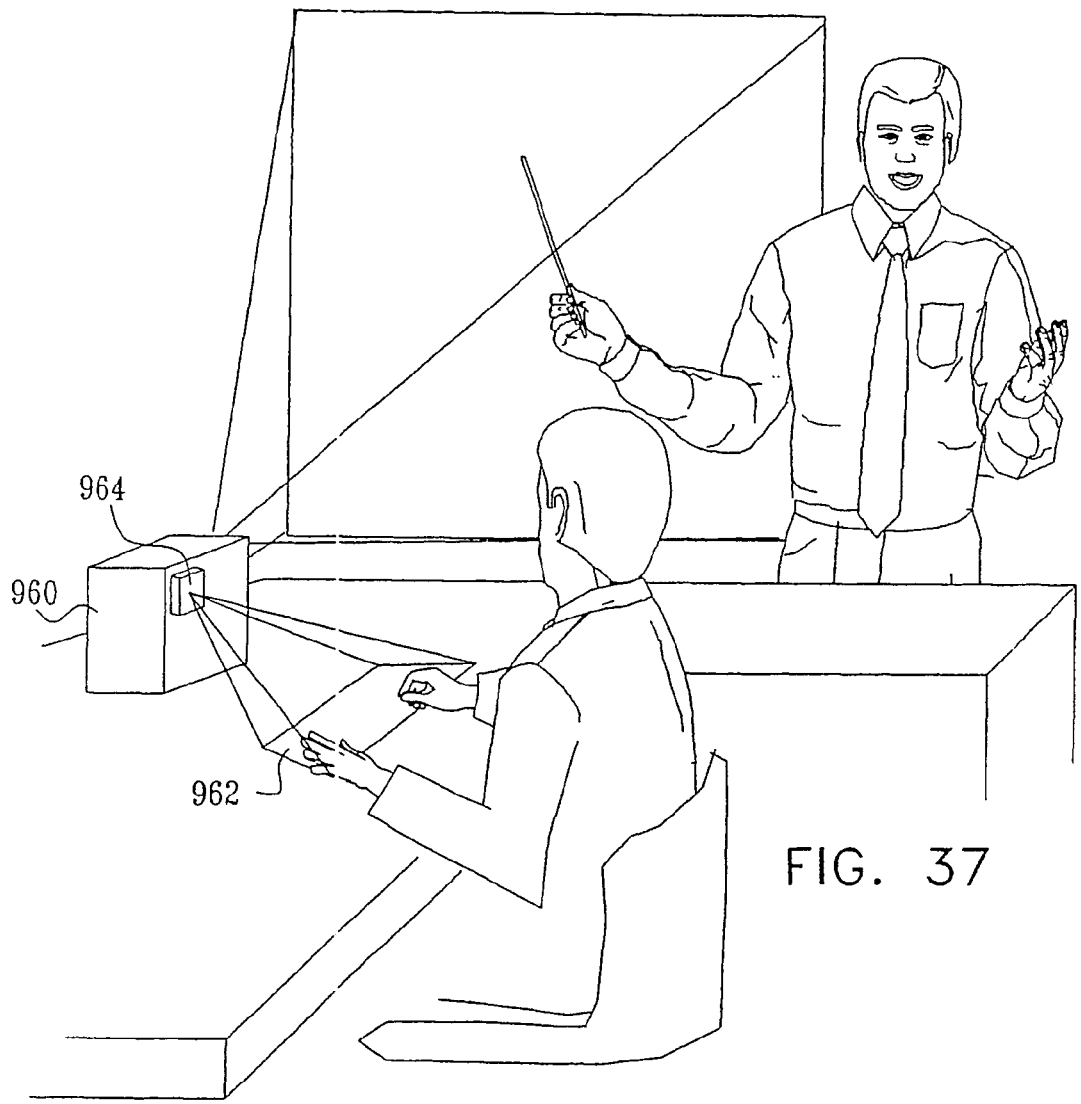
FIG. 37 is a simplified illustration of a video projector having integrally formed or associated therewith a keyboard system and methodology, constructed and operative in accordance with a preferred embodiment of the present invention.

Reference is now made to FIG. 37 which illustrates a video projector 960 having integrally formed or associated therewith a keyboard system and methodology, constructed and operative in accordance with a preferred embodiment of the present invention. A keyboard 962 is preferably provided by projection or may be printed onto any suitable surface. Data entry object engagement detection is provided by apparatus 964 which may be portable or fixedly attached to the projector 960.

Reference is now made to FIG. 38, which is a simplified illustration of a restaurant patron interface system and methodology, constructed and operative in accordance with a preferred embodiment of the present invention. As seen in FIG. 38, a menu selection board 970 may be provided by projection or may be printed onto any suitable surface. Data entry object engagement detection is provided by apparatus 972 which may be portable or fixedly attached to a table. A virtual credit card signature pad 974 may also be provided by projection or otherwise. Detection of a signature may also be provided by engagement detection apparatus 972.

Reference is now made to FIG. 39, which is a simplified illustration of a keyboard system and methodology, constructed and operative in accordance with a preferred embodiment of the present invention and providing alphanumeric annotation of photographs using a suitably equipped audio player 980. A keyboard 982 may be projected by a projection subsystem 984 integrally formed or otherwise associated with player 980 and data entry object engagement detection may be provided by detection apparatus 986, also integrally formed or otherwise associated with player 980. The keyboard 982 may advantageously be employed for annotating or selecting music to be played by the player.

Figure 40A:
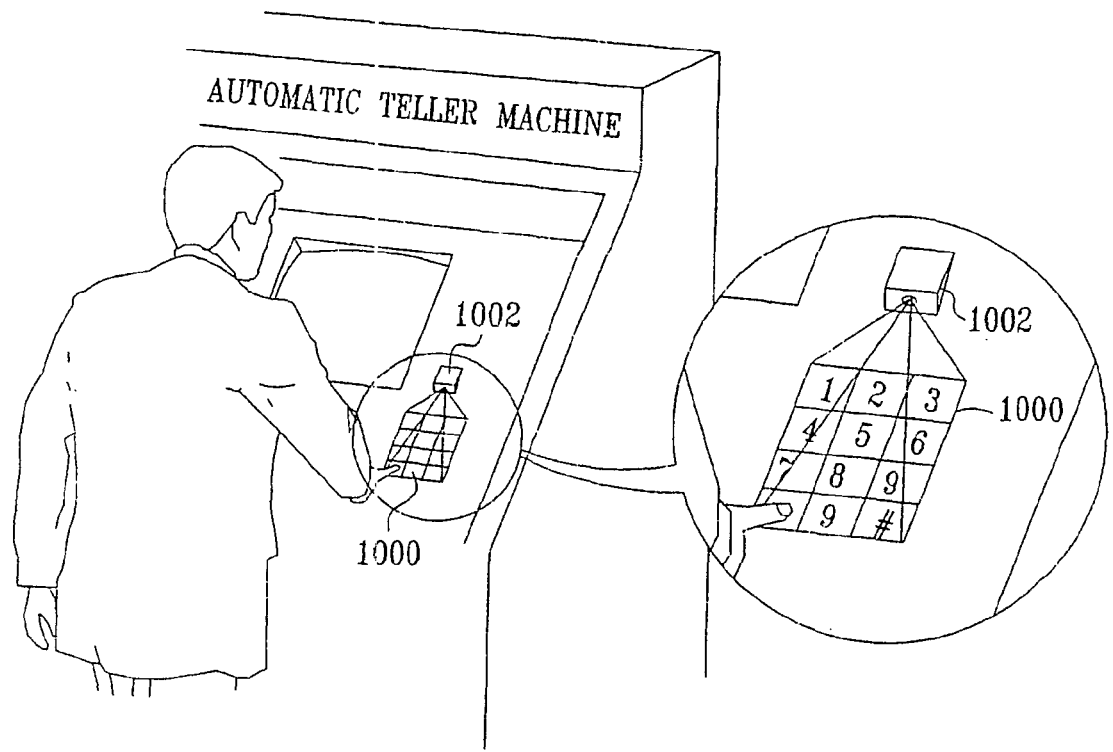
FIGS. 40A and 40B are simplified illustrations of a data entry object engagement sensing screen system and methodology, constructed and operative in accordance with a preferred embodiment of the present invention.
Figure 40B:
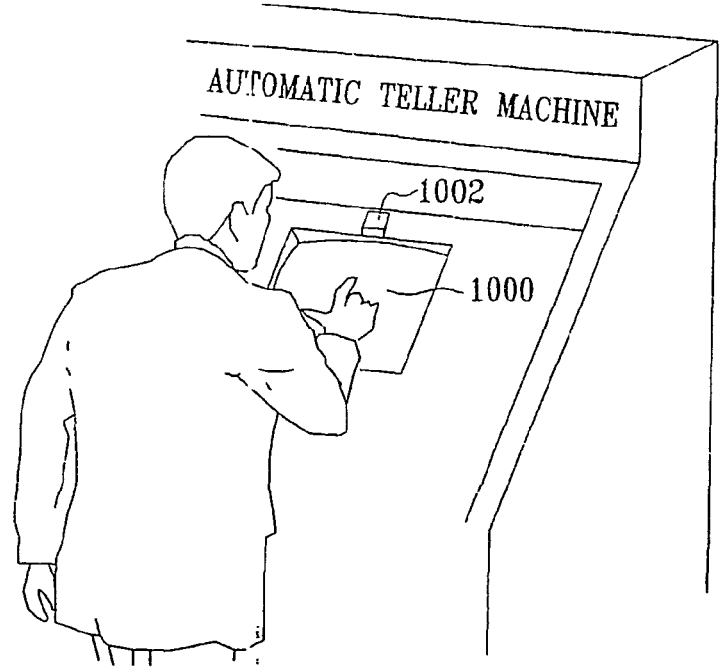

Reference is now made to FIGS. 40A and 40B, which are simplified illustrations of a data entry object engagement sensing screen system and methodology, constructed and operative in accordance with a preferred embodiment of the present invention and which provides "touch screen" functionality using data entry object engagement detection functionality of the type described hereinabove. Data entry object engagement with a screen 1000, a conventional CRT screen, a flat panel screen, or a screen projected, in a manner similar to that of the various keyboards described hereinabove, may be detected by detection apparatus 1002, integrally formed or otherwise associated with screen 1000. The screen 1000 may be employed for any suitable application, such as in an interactive information kiosk, one example of which is an automatic teller machine.

Figure 41:
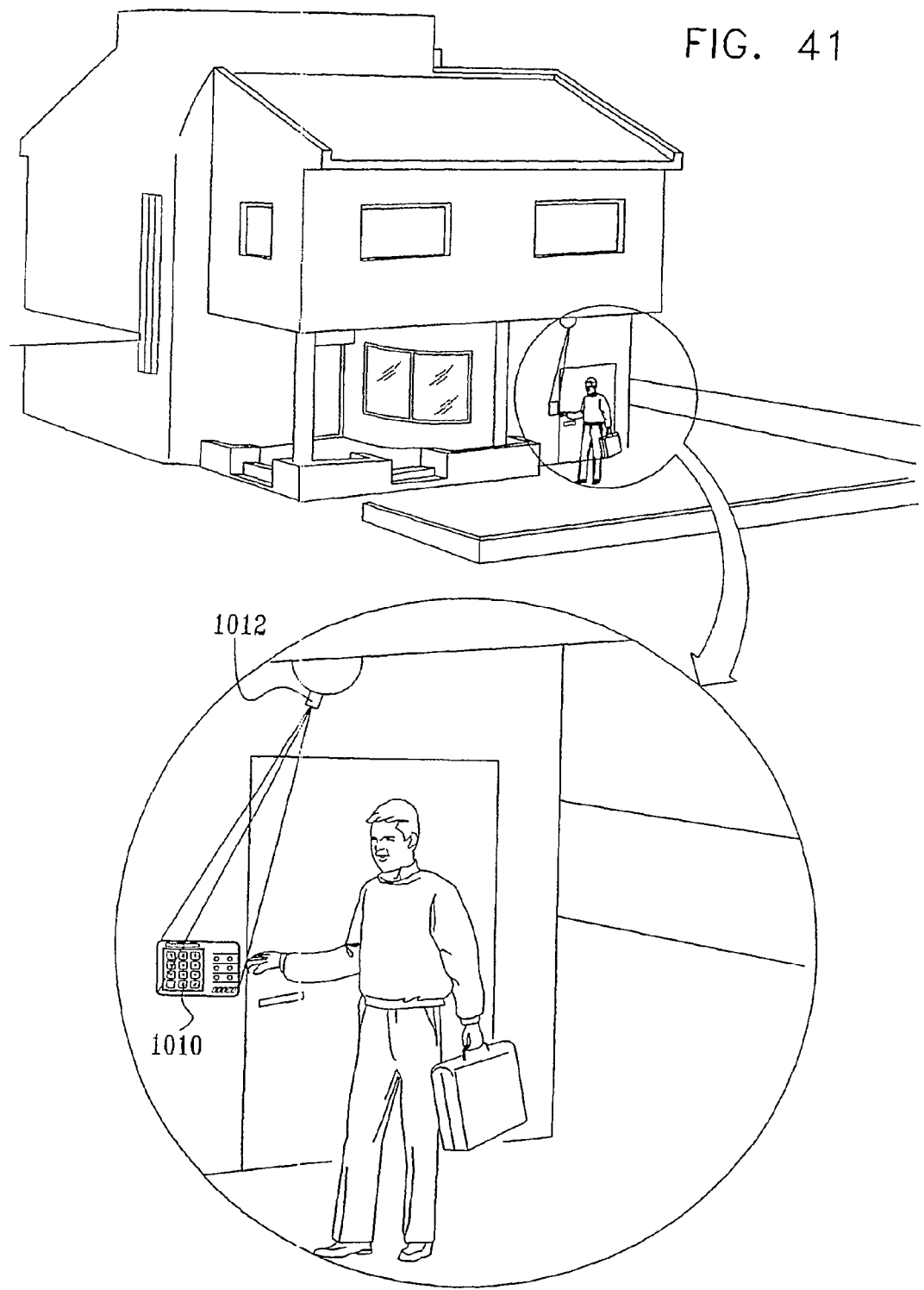
FIG. 41 is a simplified illustration of a security and access control system employing data entry object engagement sensing methodology, constructed and operative in accordance with a preferred embodiment of the present invention.

Reference is now made to FIG. 41, which is a simplified illustration of a security and access control system employing data entry object engagement sensing methodology, constructed and operative in accordance with a preferred embodiment of the present invention. Data entry object engagement with a screen 1010, such as a conventional CRT screen, a flat panel screen, or a screen, projected in a manner similar to that of the various keyboards described hereinabove, may be detected by detection apparatus 1012, integrally formed or otherwise associated with screen 1010. The screen 1010 may be located at any suitable location and employed for entry of access information by a user.

Figure 42:
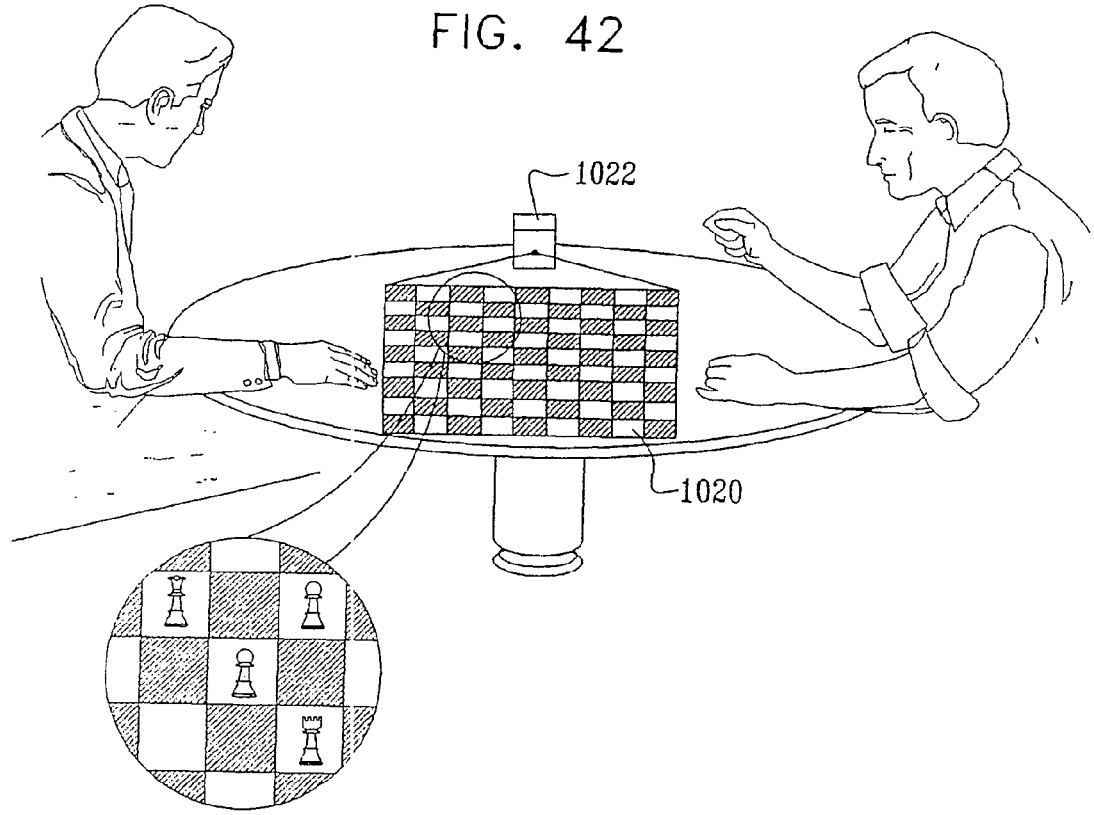
FIG. 42 is a simplified illustration of a object engagement sensing game system and methodology, constructed and operative in accordance with a preferred embodiment of the present invention.

Reference is now made to FIG. 42, which is a simplified illustration of a object engagement sensing game system and methodology, constructed and operative in accordance with a preferred embodiment of the present invention using data entry object engagement detection functionality of the type described hereinabove. Object engagement with a game board 1020, which may be defined, for example by a conventional CRT screen, a flat panel screen, or a screen projected in a manner similar to that of the various keyboards described hereinabove, may be detected by detection apparatus 1022, integrally formed or otherwise associated with game board 1020. The game board 1020 and associated functionality may be employed for any suitable game application, such as chess or checkers.

Figure 43A:
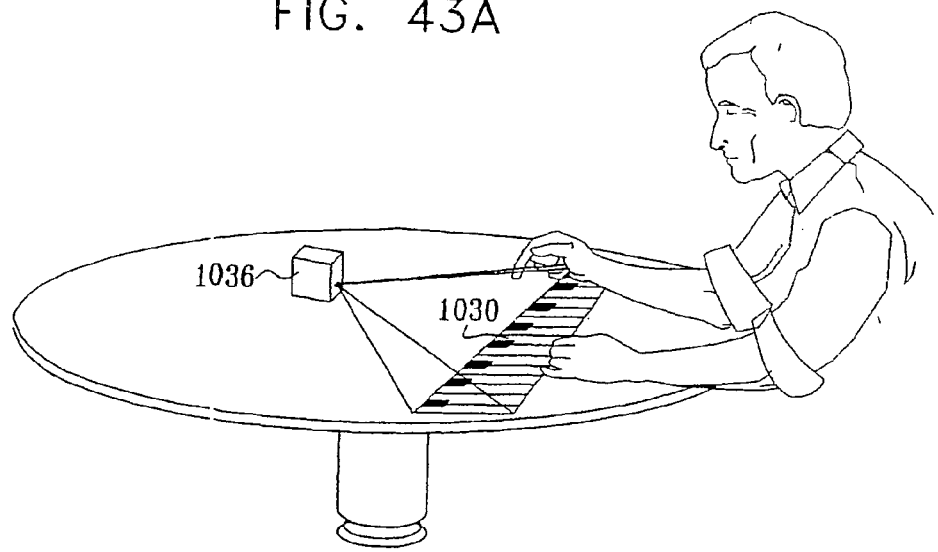
FIGS. 43A, 43B and 43C are simplified illustrations of a data entry object engagement sensing musical instrument and methodology, constructed and operative in accordance with a preferred embodiment of the present invention.
Figure 43B:
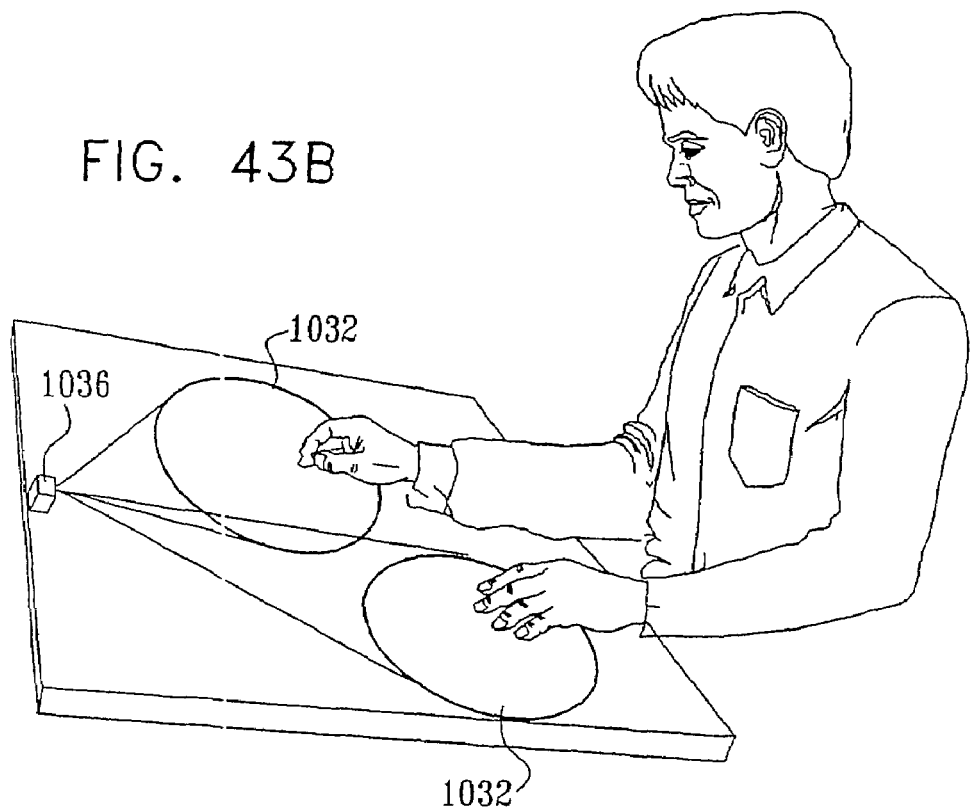
Figure 43C:
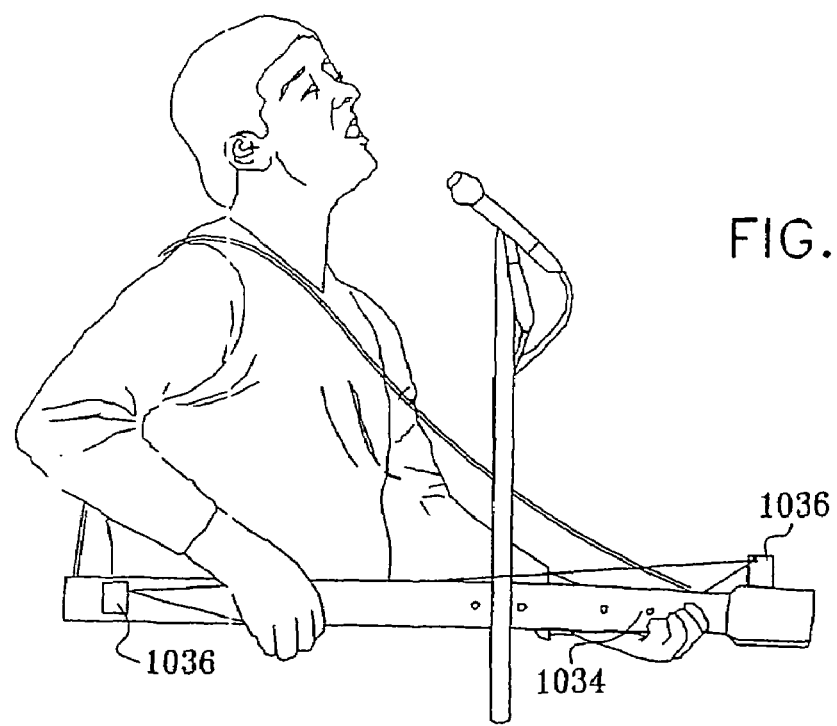

Reference is now made to FIGS. 43A, 43B and 43C, which are simplified illustrations of a data entry object engagement sensing musical instrument and methodology, constructed and operative in accordance with a preferred embodiment of the present invention using data entry object engagement detection functionality of the type described hereinabove. Data entry object engagement with piano keys 1030, drum surfaces 1032 and guitar frettes 1034, which may be projected in a manner similar to that of the various keyboards described hereinabove, or otherwise defined, as by drawing, may be detected by detection apparatus 1036. This embodiment of the present invention may be employed for any suitable hand operated musical instrument.

Figure 44:
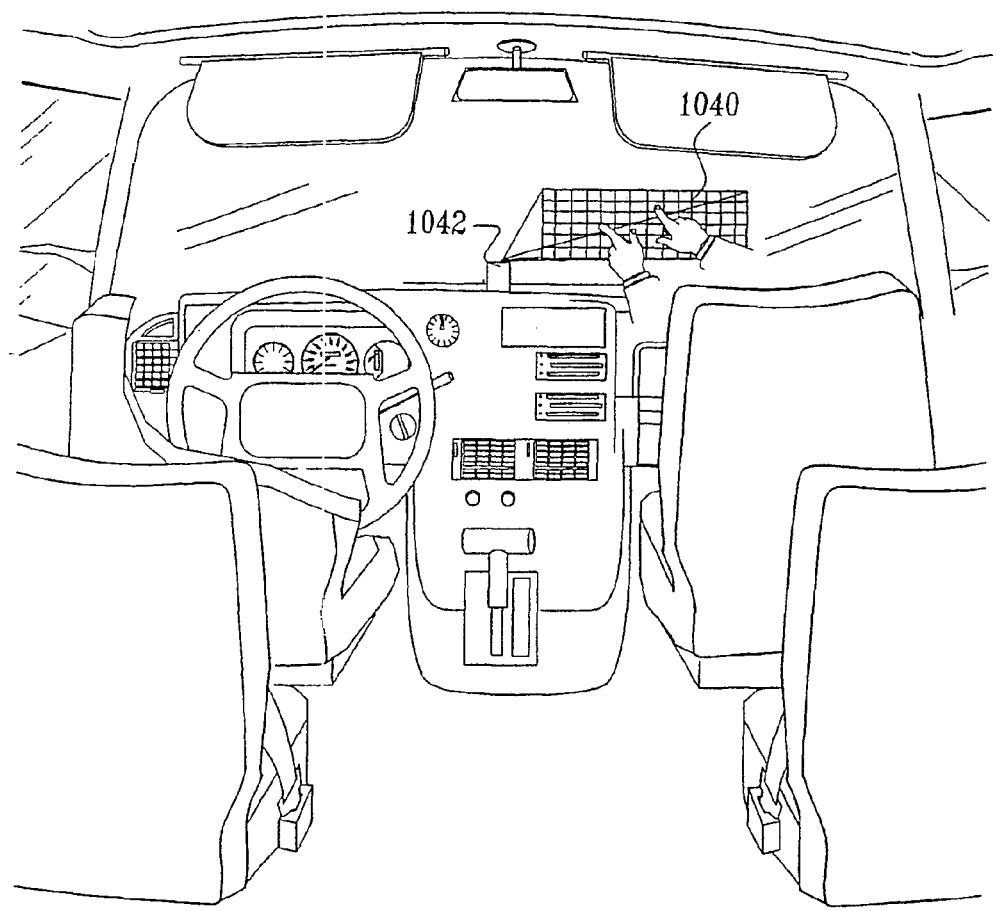
FIG. 44 is a simplified illustration of a vehicle mounted user interface system and methodology, constructed and operative in accordance with a preferred embodiment of the present invention.

Reference is now made to FIG. 44, which is a simplified illustration of a vehicle mounted user interface system and methodology, constructed and operative in accordance with a preferred embodiment of the present invention. The system of FIG. 44 preferably projects a keyboard 1040 onto a vehicle surface, preferably a vehicle windscreen. This keyboard may be used for inputting information for any purpose, preferably for entering a desired destination into a navigation system. Data entry object engagement with keyboard 1040, such as a conventional CRT screen, a flat panel screen, or a screen projected in a manner similar to that of the various keyboards described hereinabove, may be detected by detection apparatus 1042, integrally formed or otherwise associated with the vehicle. The keyboard 1040 may be located at any suitable location.

Figure 45:
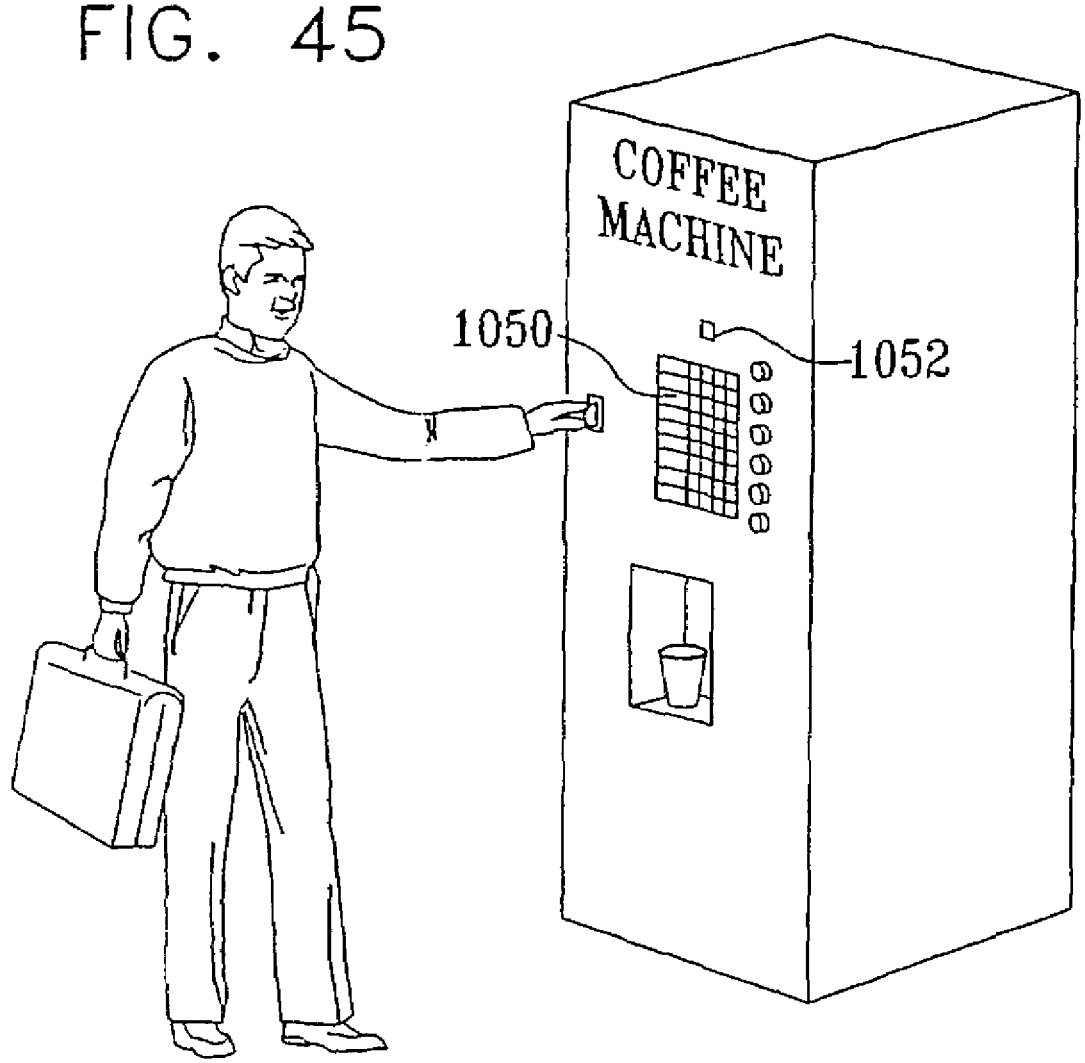
FIG. 45 is a simplified illustration of a vending machine incorporating a data entry object engagement detection system and methodology, constructed and operative in accordance with a preferred embodiment of the present invention.

Reference is now made to FIG. 45 which is a simplified illustration of a vending machine incorporating a data entry object engagement detection system and methodology, constructed and operative in accordance with a preferred embodiment of the present invention. Data entry object engagement with selection board 1050, such as a conventional CRT screen, a flat panel screen, or a screen projected in a manner similar to that of the various keyboards described hereinabove, may be detected by detection apparatus 1052, integrally formed or otherwise associated with the vending machine. The selection board 1050 may be employed for any suitable user interaction with the vending machine, including not only selection of products, but also entry of payment information.

It will be appreciated by persons skilled in the art that the present invention is not limited by what has been particularly shown and described hereinabove. Rather the scope of the present invention includes both combinations and subcombinations of various features described hereinabove as well as variations and modifications thereof which do not form part of the prior art.

The invention claimed is:

1. A data input device comprising:
   an illuminator operative to illuminate at least one engagement plane by directing light along said at least one engagement plane;
   a two-dimensional imaging sensor, including multiple rows of detector arrays, viewing said at least one engagement plane at a non-zero angle from a location outside said at least one engagement plane for sensing light from said illuminator scattered by engagement of a data entry object with said at least one engagement plane; and
   a data entry processor receiving an output from said two-dimensional imaging sensor and providing a data entry input to utilization circuitry.

2. A data input device according to claim 1 and also comprising a data entry matrix projector operative to project at least one visually sensible data entry matrix onto a projection surface underlying said at least one engagement plane.

3. A data input device according to claim 2 and wherein said at least one visually sensible data entry matrix defines a keyboard.

4. A data input device according to claim 2 and wherein said projector comprises:
   a projector light source; and
   a spatial light modulation element operative to receive light from said projector light source and to project at least one visually sensible data entry matrix onto a surface underlying said at least one engagement plane.

5. A data input device according to claim 4 and wherein said spatial light modulation element comprises a diffractive optical element.

6. A data input device according to claim 4 and wherein said spatial light modulation element comprises a transparency.

7. A data input device according to claim 1 and wherein said two-dimensional imaging sensor comprises a solid state imaging sensor.

8. A data input device according to claim 2 and wherein said data entry processor correlates said output from said two-dimensional imaging sensor with said at least one visually sensible data entry matrix.

9. A data input device according to claim 2 and wherein said data entry matrix projector comprises a diffractive optical element which receives light from a diode laser via a collimating lens.

10. A data input device according to claim 9 and wherein light passing through said diffractive optical element is reflected by a curved mirror having optical power via a lens onto said projection surface.

11. A data input device according to claim 10 and wherein said diffractive optical element, said mirror and said lens are all integrally formed in a prism.

12. A data input device according to claim 2 and wherein said data entry matrix projector comprises an integrally formed beam splitter and diffractive optical elements.

13. A data input device according to claim 12 and wherein in said data entry matrix projector, a beam of light from a diode laser passes through a collimating lens and impinges on two mutually angled surfaces of said beam splitter, which breaks the beam of light into two beams, each of which passes through a separate diffractive optical element and impinges on said projection surface.

14. A data input device according to claim 12 and wherein said diffractive optical elements are integrally formed with said beam splitter in a prism.

15. A data input device according to claim 13 and wherein said diffractive optical elements are integrally formed with said beam splitter in a prism.

16. A data input device according to claim 2 and wherein said data entry matrix projector comprises a plurality of different diffractive optical elements, each of which typically corresponds to a different matrix configuration, which are selectably positionable along a projection light path.

17. A data input device according to claim 2 and wherein said data entry matrix projector comprises a diffractive optical element having a multiplicity of diffraction orders selected to provide a matrix configuration which has a relatively low maximum diffraction angle.

18. A data input device according to claim 2 and wherein said data entry matrix projector comprises a diffractive optical element having a multiplicity of diffraction orders selected to provide a keyboard configuration which has a generally trapezoidal configuration.

19. A data input device according to claim 2 and wherein said data entry matrix projector comprises a diffractive optical element having a multiplicity of diffraction orders selected to compensate for geometrical distortions inherent in the operation of said diffractive optical element, particularly at high diffraction angles.

20. A data input device according to claim 2 and wherein said data entry matrix projector comprises a diffractive optical element having a multiplicity of diffraction orders selected to compensate for geometrical distortions occasioned by a highly oblique angle of projection.

21. A data input device according to claim 2 and wherein in said data entry matrix projector light from a pair of point light sources is combined by beam combiner, such that two light beams emerge from said beam combiner and appear to originate in a single virtual light source positioned behind said beam combiner.

22. A data input device according to claim 21 and wherein said light beams pass through a shadow mask onto said projection surface.

23. A data input device according to claim 2 and wherein said data entry matrix projector comprises an array of light emitting elements and microlenses.

24. A data input device according to claim 23 and wherein said light emitting elements are individually controllable.

25. A data input device according to claim 2 and wherein said data entry matrix projector comprises a monolithic pattern of LEDs formed on a unitary substrate.

26. A data input device according to claim 1 and wherein said two-dimensional imaging sensor is located on the opposite side of a transparent engagement surface from said at least one engagement plane, whereby the presence of said data entry object at said at least one engagement plane causes light from said illuminator to be scattered and to pass through said transparent engagement surface so as to be detected by said two-dimensional imaging sensor.

27. A data input device according to claim 1 and wherein a transparent engagement surface is coextensive with said at least one engagement plane, whereby touching engagement of said data entry object with said transparent engagement surface causes light from said illuminator to be scattered and to pass through said transparent engagement surface so as to be detected by said two-dimensional imaging sensor.

28. A data input device according to claim 27 and wherein said transparent engagement surface exhibits total internal reflection of a planar beam of light emitted by an illuminator and coupled to an edge of said transparent engagement surface, whereby touching engagement of said data entry object with said transparent engagement surface causes light from said illuminator to be scattered due to frustrated total internal reflection.

29. A data input device according to claim 1 and wherein said data entry processor is operative to map locations on said two-dimensional image sensor to data entry functions.

30. A data input device according to claim 29 and wherein said data entry processor is operative to map received light intensity at said locations on said two-dimensional image sensor to said data entry functions.

31. A data input device according to claim 1 and wherein said data entry processor comprises the following functionality:
   as each pixel value is acquired, determining, using the pixel coordinates, whether that pixel lies within a predefined keystroke region;
   acquiring pixel values for various pixel coordinates;
   adding or subtracting each pixel value to or from a pixel total maintained for each said keystroke region based on determining a pixel function of each pixel;
   comparing said pixel total for each said keystroke region with a current key actuation threshold;
   if the pixel total exceeds the key actuation threshold for a given keystroke region in a given frame and in the previous frame the pixel total did not exceed the key actuation threshold for that keystroke region, providing a key actuation output; and
   if the pixel total does not exceed the key actuation threshold for a given keystroke region in a given frame and in the previous frame the pixel total did exceed the key actuation threshold for that keystroke region, providing a key deactuation output.

32. A data input device according to claim 31 and wherein said determining whether that pixel lies within a predefined keystroke region is made by employing a pixel index table which indicates for each pixel, whether that pixel lies within a predetermined keystroke region and, if so, within which keystroke region it lies.

33. A data input device according to claim 31 and wherein both of said determining steps employ said pixel index table.

34. A data input device according to claim 31 and wherein said pixel total is maintained for each keystroke region in a keystroke region accumulator table.

35. A data input device according to claim 31 and wherein said comparing employs a keystroke region threshold table.

36. A data input device according to claim 35 and also comprising the following functionality:
   once all of the pixels in a frame have been processed, determining an updated background level for a frame; and
   determining a key actuation threshold for said keystroke region threshold table by subtracting the updated background level from a predetermined threshold level which is established for each keystroke region.

37. A data input device according to claim 31 and wherein said pixel function comprises adding the pixel values of a plurality of pixels in said keystroke region.

38. A data input device according to claim 31 and wherein said pixel function comprises adding the pixel values of said plurality of pixels in said keystroke region and subtracting therefrom pixel values of a plurality of pixels in a keystroke region border outside said keystroke region.

39. A data input device according to claim 31 and wherein said pixel function comprises adding the pixel values of said plurality of pixels in said keystroke region, ignoring the pixel values of a plurality of pixels in a first keystroke region border outside said keystroke region and subtracting pixel values of a plurality of pixels in a second keystroke region border, outside said first keystroke region border.

40. A data input device according to claim 1 and wherein said data entry processor is operative to determine the "center of gravity" of pixel values of pixels in said two-dimensional image sensor.

41. A data input device according to claim 1 and wherein said data entry processor comprises the following functionality:
- as each pixel value is acquired, determining, using the pixel coordinates, whether that pixel lies within a predefined active region;
- acquiring pixel values for various pixel coordinates; determining the "center of gravity" of the pixel values.

42. A data input device according to claim 41 and wherein determining the "center of gravity" is achieved by:
- multiplying said pixel values by X and Y values representing the geographic position of each pixel;
- summing the results along mutually perpendicular axes X and Y;
- summing the total of the pixel values for all relevant pixels for said active region; and
- dividing said summed results by said total of said pixel values to determine the X and Y coordinates of the "center of gravity", which represents a desired engagement location.

43. A data input device according to claim 41 and wherein said pixel values are thresholded prior to summing thereof.

44. A data input device according to claim 42 and wherein said pixel values are thresholded prior to summing thereof.

45. A data input device according to claim 1 and wherein at least said engagement plane is associated with a pull-down tray in a vehicle.

46. A data input device according to claim 45 and wherein said pull-down tray defines an engagement surface which is configured by projection.

47. A data input device according to claim 1 and wherein at least said two-dimensional detector and illuminator are associated with a camera.

48. A data input device according to claim 1 and wherein at least said two-dimensional detector and illuminator are associated with a home entertainment system.

49. A data input device according to claim 48 and wherein said engagement plane overlies a television screen forming part of said home entertainment system.

50. A data input device according to claim 1 and wherein at least said engagement plane is associated with a table.

51. A data input device according to claim 1 and wherein at least said engagement plane is associated with a remote control device.

52. A data input device according to claim 1 and wherein at least said engagement plane is located within a restricted particulate matter environment.

53. A data input device according to claim 1 and wherein at least said engagement plane is located within an industrial environment unsuitable for a conventional keyboard.

54. A data input device according to claim 1 and wherein at least said two-dimensional detector and illuminator are associated with a video projector.

55. A data input device according to claim 1 and wherein at least said two-dimensional detector and illuminator are associated with a restaurant patron interface system.

56. A data input device according to claim 1 and wherein at least said two-dimensional detector and illuminator are associated with a mobile audio player.

57. A data input device according to claim 1 and wherein at least said two-dimensional detector and illuminator provide touch screen functionality.

58. A data input device according to claim 57 and wherein said touch screen functionality employs a video display screen.

59. A data input device according to claim 1 and wherein at least said two-dimensional detector and illuminator provide access control functionality.

60. A data input device according to claim 1 and wherein at least said engagement plane is associated with a game board.

61. A data input device according to claim 60 and wherein said game board defines an engagement surface which is configured by projection.

62. A data input device according to claim 1 and wherein at least said engagement plane is associated with a musical instrument.

63. A data input device according to claim 62 and wherein said musical instrument defines an engagement surface which is configured by projection.

64. A data input device according to claim 1 and wherein at least said two-dimensional detector and illuminator provide vehicle telematics functionality.

65. A data input device according to claim 64 and wherein said vehicle defines an engagement surface which is configured by projection.

66. A data input device according to claim 1 and wherein at least said two-dimensional detector and illuminator provide automatic vending user interface functionality.

67. A data input method comprising:
- illuminating at least one engagement plane by directing light along said at least one engagement plane;
- employing a two-dimensional imaging sensor including multiple rows of detector arrays for viewing said at least one engagement plane at a non-zero angle from a location outside said at least one engagement plane for sensing light from said illumination scattered by engagement of a data entry object with said at least one engagement plane; and
- receiving and processing an output from said two-dimensional imaging sensor and providing a data entry input to utilization circuitry.

68. A data input method according to claim 67 and also comprising projecting at least one visually sensible data entry matrix onto a projection surface underlying said at least one engagement plane.

69. A data input method according to claim 68 and wherein said at least one visually sensible data entry matrix defines a keyboard.

70. A data input method according to claim 68 and wherein said projecting employs a projector light source and a spatial light modulation element operative to receive light from said projector light source and to project at least one visually sensible data entry matrix onto a surface underlying said at least one engagement plane.

71. A data input method according to claim 70 and wherein said spatial light modulation element comprises a diffractive optical element.

72. A data input method according to claim 70 and wherein said spatial light modulation element comprises an aspheric optical element.

73. A data input method according to claim 70 and wherein said spatial light modulation element comprises a transparency.

74. A data input method according to claim 21 and wherein said two-dimensional imaging sensor comprises a solid state imaging sensor.

75. A data input method according to claim 68 and wherein said processing correlates said output from said two-dimensional imaging sensor with said at least one visually sensible data entry matrix.

76. A data input method according to claim 68 and wherein said projecting employs a diffractive optical element which receives light from a diode laser via a collimating lens.

77. A data input method according to claim 76 and wherein light passing through said diffractive optical element is reflected by a curved mirror having optical power via a lens onto said projection surface.

78. A data input method according to claim 77 and wherein said diffractive optical element, said mirror and said lens are all integrally formed in a prism.

79. A data input method according to claim 68 and wherein said projecting employs an integrally formed beam splitter and diffractive optical elements.

80. A data input method according to claim 79 and wherein said projecting a beam of light from a diode laser passes through a collimating lens and impinges on two mutually angled surfaces of said beam splitter, which breaks the beam of light into two beams, each of which passes through a separate diffractive optical element and impinges on said projection surface.

81. A data input method according to claim 79 and wherein said diffractive optical elements are integrally formed with said beam splitter in a prism.

82. A data input method according to claim 80 and wherein said diffractive optical elements are integrally formed with said beam splitter in a prism.

83. A data input method according to claim 68 and wherein said projecting employs a plurality of different diffractive optical elements, each of which typically corresponds to a different matrix configuration, which are selectably positionable along a projection light path.

84. A data input method according to claim 68 and wherein said projecting employs a diffractive optical element having a multiplicity of diffraction orders selected to provide a matrix configuration which has a relatively low maximum diffraction angle.

85. A data input method according to claim 68 and wherein said projecting employs a diffractive optical element having a multiplicity of diffraction orders selected to provide a keyboard configuration which has a generally trapezoidal configuration.

86. A data input method according to claim 68 and wherein said projecting employs a diffractive optical element having a multiplicity of diffraction orders selected to compensate for geometrical distortions inherent in the operation of said diffractive optical element, particularly at high diffraction angles.

87. A data input method according to claim 68 and wherein said projecting employs a diffractive optical element having a multiplicity of diffraction orders selected to compensate for geometrical distortions occasioned by a highly oblique angle of projection.

88. A data input method according to claim 68 and wherein in said projecting light from a pair of point light sources is combined by beam combiner, such that two light beams emerge from said beam combiner and appear to originate in a single virtual light source positioned behind said beam combiner.

89. A data input method according to claim 88 and wherein said light beams pass through a shadow mask onto said projection surface.

90. A data input method according to claim 68 and wherein said projecting employs an array of light emitting elements and microlenses.

91. A data input method according to claim 90 and wherein said light emitting elements are individually controllable.

92. A data input method according to claim 68 and wherein said projecting employs a monolithic pattern of LEDs formed on a unitary substrate.

93. A data input method according to claim 67 and wherein said two-dimensional imaging sensor is located on the opposite side of a transparent engagement surface from said at least one engagement plane, whereby the presence of said data entry object at said at least one engagement plane causes light from said illuminator to be scattered and to pass through said transparent engagement surface so as to be detected by said two-dimensional imaging sensor.

94. A data input method according to claim 67 and wherein a transparent engagement surface is coextensive with said at least one engagement plane, whereby touching engagement of said data entry object with said transparent engagement surface causes light from said illuminator to be scattered and to pass through said transparent engagement surface so as to be detected by said two-dimensional imaging sensor.

95. A data input method according to claim 94 and wherein said transparent engagement surface exhibits total internal reflection of a planar beam of light emitted by an illuminator and coupled to an edge of said transparent engagement surface, whereby touching engagement of said data entry object with said transparent engagement surface causes light from said illuminator to be scattered due to frustrated total internal reflection.

96. A data input method according to claim 67 and wherein said processing is operative to map locations on said two-dimensional image sensor to data entry functions.

97. A data input method according to claim 96 and wherein said processing is operative to map received light intensity at said locations on said two-dimensional image sensor to said data entry functions.

98. A data input method according to claim 67 and wherein said processing comprises the following:
- as each pixel value is acquired, determining, using the pixel coordinates, whether that pixel lies within a predefined keystroke region;
- acquiring pixel values for various pixel coordinates;
- adding or subtracting each pixel value to or from a pixel total maintained for each said keystroke region based on determining a pixel function of each pixel;
- comparing said pixel total for each said keystroke region with a current key actuation threshold;
- if the pixel total exceeds the key actuation threshold for a given keystroke region in a given frame and in the previous frame the pixel total did not exceed the key actuation threshold for that keystroke region, providing a key actuation output; and if the pixel total does not exceed the key actuation threshold for a given keystroke region in a given frame and in the previous frame the pixel total did exceed the key actuation threshold for that keystroke region, providing a key deactuation output.

99. A data input method according to claim 98 and wherein said determining whether that pixel lies within a predefined keystroke region is made by employing a pixel index table which indicates for each pixel, whether that pixel lies within a predetermined keystroke region and, if so, within which keystroke region it lies.

100. A data input method according to claim 98 and wherein both of said determining steps employ said pixel index table.

101. A data input method according to claim 98 and wherein said pixel total is maintained for each keystroke region in a keystroke region accumulator table.

102. A data input method according to claim 98 and wherein said comparing employs a keystroke region threshold table.

103. A data input method according to claim 102 and also comprising the following:

once all of the pixels in a frame have been processed, determining an updated background level for a frame; and determining a key actuation threshold for said keystroke region threshold table by subtracting the updated background level from a predetermined threshold level which is established for each keystroke region.

104. A data input method according to claim 98 and wherein said pixel function comprises adding the pixel values of a plurality of pixels in said keystroke region.

105. A data input method according to claim 98 and wherein said pixel function comprises adding the pixel values of said plurality of pixels in said keystroke region and subtracting therefrom pixel values of a plurality of pixels in a keystroke region border outside said keystroke region.

106. A data input method according to claim 98 and wherein said pixel function comprises adding the pixel values of said plurality of pixels in said keystroke region, ignoring the pixel values of a plurality of pixels in a first keystroke region border outside said keystroke region and subtracting pixel values of a plurality of pixels in a second keystroke region border, outside said first keystroke region border.

107. A data input method according to claim 67 and wherein said processing is operative to determine the "center of gravity" of pixel values of pixels in said two-dimensional image sensor.

108. A data input method according to claim 67 and wherein said processing comprises the following:

as each pixel value is acquired, determining, using the pixel coordinates, whether that pixel lies within a predefined active region;

acquiring pixel values for various pixel coordinates; determining the "center of gravity" of the pixel values.

109. A data input method according to claim 108 and wherein determining the "center of gravity" is achieved by:

multiplying said pixel values by X and Y values representing the geographic position of each pixel;

summing the results along mutually perpendicular axes X and Y;

summing the total of the pixel values for all relevant pixels for said active region; and dividing said summed results by said total of said pixel values to determine the X and Y coordinates of the "center of gravity", which represents a desired engagement location.

110. A data input method according to claim 108 and wherein said pixel values are thresholded prior to summing thereof.

111. A data input method according to claim 109 and wherein said pixel values are thresholded prior to summing thereof.

112. A data input method according to claim 98 and wherein at least said engagement plane is associated with a pull-down tray in a vehicle.

113. A data input method according to claim 112 and wherein said pull-down tray defines an engagement surface which is configured by projection.

114. A data input method according to claim 67 and wherein said receiving and processing are associated with a camera.

115. A data input method according to claim 67 and wherein said receiving and processing are associated with a home entertainment system.

116. A data input method according to claim 115 and wherein said engagement plane overlies a television screen forming part of said home entertainment system.

117. A data input method according to claim 67 and wherein at least said engagement plane is associated with a table.

118. A data input method according to claim 67 and wherein at least said engagement plane is associated with a remote control method.

119. A data input method according to claim 67 and wherein at least said engagement plane is located within a restricted particulate matter environment.

120. A data input method according to claim 67 and wherein at least said engagement plane is located within an industrial environment unsuitable for a conventional keyboard.

121. A data input method according to claim 67 and wherein said receiving and processing are associated with a video projector.

122. A data input method according to claim 67 and wherein said receiving and processing are associated with a restaurant patron interface system.

123. A data input method according to claim 67 and wherein said receiving and processing are associated with a mobile audio player.

124. A data input method according to claim 67 and wherein said receiving and processing provide touch screen functionality.

125. A data input method according to claim 124 and wherein said touch screen functionality employs a video display screen.

126. A data input method according to claim 67 and wherein said receiving and processing provide access control functionality.

127. A data input method according to claim 67 and wherein at least said engagement plane is associated with a game board.

128. A data input method according to claim 127 and wherein said game board defines an engagement surface which is configured by projection.

129. A data input method according to claim 67 and wherein at least said engagement plane is associated with a musical instrument.

130. A data input method according to claim 129 and wherein said musical instrument defines an engagement surface which is configured by projection.

131. A data input method according to claim 67 wherein said receiving and processing provide vehicle telematics functionality.

132. A data input method according to claim 131 and wherein said vehicle defines an engagement surface which is configured by projection.

133. A data input method according to claim 67 and wherein said receiving and processing provide automatic vending user interface functionality.

* * * * *